(12) United States Patent
Sugioka et al.

(10) Patent No.: US 11,962,329 B2
(45) Date of Patent: Apr. 16, 2024

(54) ENCODING DEVICE, ENCODING METHOD, DECODING DEVICE, DECODING METHOD, AND PROGRAM

(71) Applicant: Sony Semiconductor Solutions Corporation, Kanagawa (JP)

(72) Inventors: Tatsuya Sugioka, Tokyo (JP); Toshihisa Hyakudai, San Diego, CA (US); Masayuki Unuma, Kanagawa (JP); Daisuke Okazawa, Kanagawa (JP); Aritoshi Kimura, Kanagawa (JP); Hiroshi Shiroshita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/636,985

(22) PCT Filed: Jun. 30, 2020

(86) PCT No.: PCT/JP2020/025631
§ 371 (c)(1),
(2) Date: Feb. 21, 2022

(87) PCT Pub. No.: WO2021/039099
PCT Pub. Date: Mar. 4, 2021

(65) Prior Publication Data
US 2022/0368353 A1    Nov. 17, 2022

(30) Foreign Application Priority Data
Aug. 30, 2019  (JP) ................................. 2019-157637

(51) Int. Cl.
*H03M 13/00*     (2006.01)
*H03M 13/15*     (2006.01)

(52) U.S. Cl.
CPC ..... *H03M 13/1575* (2013.01); *H03M 13/611* (2013.01)

(58) Field of Classification Search
CPC ............. H03M 13/05; H03M 13/1575; H03M 13/611; H03M 13/2906; G06F 11/00
See application file for complete search history.

(56) References Cited

U.S. PATENT DOCUMENTS 6,198,413 B1 * 3/2001 Widmer ................ H03M 13/31
341/59
6,333,704 B1 * 12/2001 Jung ....................... H03M 5/00
341/56

(Continued)

FOREIGN PATENT DOCUMENTS

EP    1351462 A1    10/2003
EP    0725486 A    7/2004

(Continued)

OTHER PUBLICATIONS

International Search Report (PCT/ISA/210), International Application No. PCT/JP2020/025631, dated Sep. 25, 2020.

*Primary Examiner* — Esaw T Abraham
(74) *Attorney, Agent, or Firm* — Michael Best & Friedrich LLP

(57) ABSTRACT

The technology relates to an encoding device, an encoding method, a decoding device, a decoding method, and a program enabling encoding with favorable transmission efficiency with a controlled running disparity.
A calculation section divides inputted data into N or M bits to calculate a first running disparity of an N or M bit data string. A determination section determines whether the data string is inverted based on the first running disparity calculated by the calculation section and a second running disparity calculated therebefore. An addition section inverts or non-inverts the data string based on a determination result (Continued)

by the determination section to add a flag indicating the determination result for outputting. The determination section determines not to perform inversion when the data string is a control code. The addition section adds the flag assigned to the control code. The technology is applicable to a device communicating in an SLVS-EC specification.

20 Claims, 62 Drawing Sheets

(56) References Cited

U.S. PATENT DOCUMENTS

| | | | | |
|---|---|---|---|---|
| 6,892,336 | B1* | 5/2005 | Giorgetta | H04L 1/24 |
| | | | | 714/704 |
| 6,977,599 | B2* | 12/2005 | Widmer | H03M 5/14 |
| | | | | 341/59 |
| 7,782,805 | B1 | 8/2010 | Belhadj | |
| 8,281,207 | B2* | 10/2012 | Toyoda | H03M 13/19 |
| | | | | 714/752 |
| 8,385,365 | B2* | 2/2013 | Ide | H04L 1/205 |
| | | | | 370/252 |
| 8,494,081 | B2* | 7/2013 | Takahashi | H04L 25/4917 |
| | | | | 375/301 |
| 9,369,728 | B2* | 6/2016 | Ikai | H04N 19/597 |
| 9,571,850 | B2* | 2/2017 | Ikai | H04N 19/597 |
| 2011/0304936 | A1* | 12/2011 | Nakagawa | G11B 20/1426 |

FOREIGN PATENT DOCUMENTS

| | | |
|---|---|---|
| EP | 0977411 A | 4/2005 |
| JP | H03-245629 A | 11/1991 |
| JP | H11-500887 A | 1/1999 |
| JP | H11-177430 A | 7/1999 |
| JP | 2011-244212 A | 1/2011 |
| JP | 2012-120159 A | 6/2012 |

* cited by examiner

FIG. 6

| CURRENT ACCUMULATED VALUE RDc | PAST ACCUMULATED VALUE RDp | FLAG |
|---|---|---|
| RDc>0 | RDp>0 | 1 |
| RDc>0 | RDp=0 | 1 |
| RDc>0 | RDp<0 | 0 |
| RDc=0 | RDp>0 | 0 |
| RDc=0 | RDp=0 | 0 |
| RDc=0 | RDp<0 | 1 |
| RDc<0 | RDp>0 | 0 |
| RDc<0 | RDp=0 | 0 |
| RDc<0 | RDp<0 | 1 |

FIG. 19

| MAJOR ITEM | MINOR ITEM | INFOR-MATION AMOUNT | CONTENT |
|---|---|---|---|
| FRAME INFORMATION | Frame Start | 1bit | INDICATING FRAME HEAD (e.g. AT FIRST LINE) |
| | Frame End | 1bit | INDICATING FRAME END (e.g., LINE BEFORE REAR DUMMY) |
| LINE INFORMATION | Line Valid | 1bit | INDICATING VALIDITY/INVALIDITY OF LINE |
| | Line Number | 13bit | INDICATING LINE NUMBER |
| OTHERS | Reserved | 32bit | RESERVED FOR FUTURE EXPANDABILITY |
| | Header ECC | 18byte | ECC OF HEADER INFORMATION |

FIG. 20

| Byte | Bit | Contents |
|------|-----|----------|
| H1 | 15 | CRC[15] X^15 |
|  | 14 | CRC[14] X^14 |
|  | 13 | CRC[13] X^13 |
|  | 12 | CRC[12] X^12 |
|  | 11 | CRC[11] X^11 |
|  | 10 | CRC[10] X^10 |
|  | 9 | CRC[9] X^9 |
| H0 | 8 | CRC[8] X^8 |
|  | 7 | CRC[7] X^7 |
|  | 6 | CRC[6] X^6 |
|  | 5 | CRC[5] X^5 |
|  | 4 | CRC[4] X^4 |
|  | 3 | CRC[3] X^3 |
|  | 2 | CRC[2] X^2 |
|  | 1 | CRC[1] X^1 |
|  | 0 | CRC[0] X^0 |

| Byte | Bit | Contents |
|------|-----|----------|
| H3 | 31 | Reserved[15] |
|  | 30 | Reserved[14] |
|  | 29 | Reserved[13] |
|  | 28 | Reserved[12] |
|  | 27 | Reserved[11] |
|  | 26 | Reserved[10] |
|  | 25 | Reserved[9] |
|  | 24 | Reserved[8] |
| H2 | 23 | Reserved[7] |
|  | 22 | Reserved[6] |
|  | 21 | Reserved[5] |
|  | 20 | Reserved[4] |
|  | 19 | Reserved[3] |
|  | 18 | Reserved[2] |
|  | 17 | Reserved[1] |
|  | 16 | Reserved[0] |

| Byte | Bit | Contents |
|------|-----|----------|
| H5 | 47 | Reserved[31] |
|  | 46 | Reserved[30] |
|  | 45 | Reserved[29] |
|  | 44 | Reserved[28] |
|  | 43 | Reserved[27] |
|  | 42 | Reserved[26] |
|  | 41 | Reserved[25] |
|  | 40 | Reserved[24] |
| H4 | 39 | Reserved[23] |
|  | 38 | Reserved[22] |
|  | 37 | Reserved[21] |
|  | 36 | Reserved[20] |
|  | 35 | Reserved[19] |
|  | 34 | Reserved[18] |
|  | 33 | Reserved[17] |
|  | 32 | Reserved[16] |

| Byte | Bit | Contents |
|------|-----|----------|
| H7 | 63 | Frame Start |
|  | 62 | Frame End |
|  | 61 | Line Valid |
|  | 60 | Line Number[12] |
|  | 59 | Line Number[11] |
|  | 58 | Line Number[10] |
|  | 57 | Line Number[9] |
|  | 56 | Line Number[8] |
| H6 | 55 | Line Number[7] |
|  | 54 | Line Number[6] |
|  | 53 | Line Number[5] |
|  | 52 | Line Number[4] |
|  | 51 | Line Number[3] |
|  | 50 | Line Number[2] |
|  | 49 | Line Number[1] |
|  | 48 | Line Number[0] |

FIG. 33

| PHY CONTROL CODE | USE APPLICATION | 8B10B SYMBOL CONFIGURATION | | | |
|---|---|---|---|---|---|
| Idle Code | SYMBOL GROUP TO CONTINUE TO TOGGLE OUTPUT SIGNAL DURING TIME OTHER THAN PACKET TRANSMISSION (MARGIN PERIOD, etc.) | D00.0 | | | |
| Start Code | INDICATING START OF PACKET (LINE/H) | K28.5 | K27.7 | K28.2 | K27.7 |
| End Code | INDICATING END OF PACKET (LINE/H) | K28.5 | K29.7 | K00.7 | K29.7 |
| Pad Code | Padding SYMBOL GROUP TO BE INSERTED TO MAKE UP FOR DIFFERENCE BETWEEN PIXEL DATA (PAYLOAD DATA) BAND AND PHY TRANSMISSION BAND | K23.7 | K28.4 | K28.6 | K28.3 |
| Sync Code | SYMBOL GROUP TO PERFORM I/F BIT SYNCHRONIZATION AND 8B10B SYMBOL SYNCHRONIZATION | K28.5 | Any** | ↓ | ↓ |
| Deskew Code | SYMBOL GROUP USED AS MARKING TO MATCH DATA SKEWS BETWEEN LANES | K28.5 | Any** | ↓ | ↓ |
| Standby Code | SYMBOL GROUP TO INFORM RX SIDE THAT TX OUTPUT IS IN High-Z | K28.5 | Any** | ↓ | ↓ |

FIG. 34

Control Symbol

| Code | 8B HGF_EDCBA | 10B abcdei_fghj | | memo |
|---|---|---|---|---|
| | | RD- | RD+ | |
| K23.7 | 11110111 | 1110101000 | 0001010111 | Used in Pad Code |
| K27.7 | 11111011 | 1101101000 | 0010010111 | Used in Start Code |
| K28.0 | 00011100 | 0011110100 | 1100001011 | Reserved |
| K28.1 | 00111100 | 0011111001 | 1100000110 | Reserved |
| K28.2 | 01011100 | 0011110101 | 1100001010 | Used in Start Code |
| K28.3 | 01111100 | 0011110011 | 1100001100 | Used in Pad Code |
| K28.4 | 10011100 | 0011110010 | 1100001101 | Used in Pad Code |
| K28.5 | 10111100 | 0011111010 | 1100000101 | Comma Character |
| K28.6 | 11011100 | 0011110110 | 1100001001 | Used in Pad Code |
| K28.7 | 11111100 | 0011111000 | 1100000111 | Reserved |
| K29.7 | 11111101 | 1011101000 | 0100010111 | Used in End Code |
| K30.7 | 11111110 | 0111101000 | 1000010111 | Used in End Code |

FIG. 46

| CONTROL CODE | | | 1st symbol | 2nd symbol | 3rd symbol | 4th symbol | RD |
|---|---|---|---|---|---|---|---|
| Idle | 8b Code | | D00.0 | D00.0 | D00.0 | D00.0 | RD |
| | Ctrl code | flg | | | | | |
| | inv | INVERSION INHIBITION | | | | | |
| Idle | 8b Code | | D00.0 | D00.0 | D00.0 | D00.0 | RD -32 |
| | Ctrl code | 1 | | | | | 0 |
| | inv | 0 | | | | | 0 |
| Start | 8b Code | | K28.5 | K27.7 | K28.2 | K27.7 | RD 14 |
| | Ctrl code | 1 | | | | | 0 |
| | inv | 0 | | | | | 0 |
| End | 8b Code | | K28.5 | K29.7 | K30.7 | K29.7 | RD 20 |
| | Ctrl code | 1 | | | | | 0 |
| | inv | 0 | | | | | 0 |
| Pad | 8b Code | | K23.7 | K28.4 | K28.6 | K28.3 | RD 10 |
| | Ctrl code | 1 | | | | | 0 |
| | inv | 0 | | | | | 0 |
| Sync | 8b Code | | K28.5 | D10.5 | D10.5 | D10.5 | RD 2 |
| | Ctrl code | 1 | | | | | 0 |
| | inv | 0 | | | | | 0 |
| Deskew | 8b Code | | K28.5 | D00.3 | D00.3 | D00.3 | RD -10 |
| | Ctrl code | 1 | | | | | 0 |
| | inv | 0 | | | | | 0 |
| Standby | 8b Code | | K28.5 | D03.0 | D03.0 | D03.0 | RD -10 |
| | Ctrl code | 1 | | | | | 0 |
| | inv | 0 | | | | | 0 |

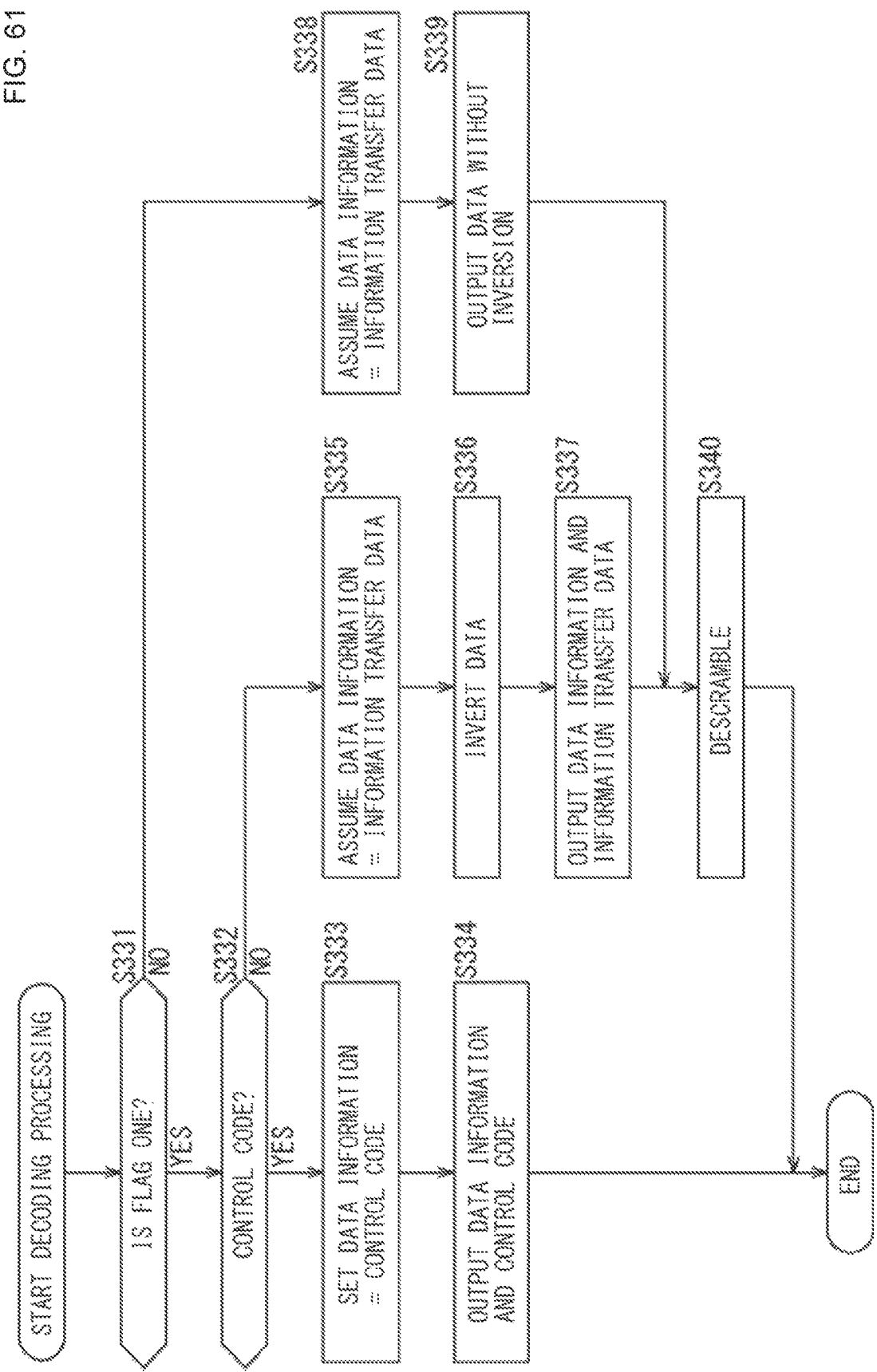

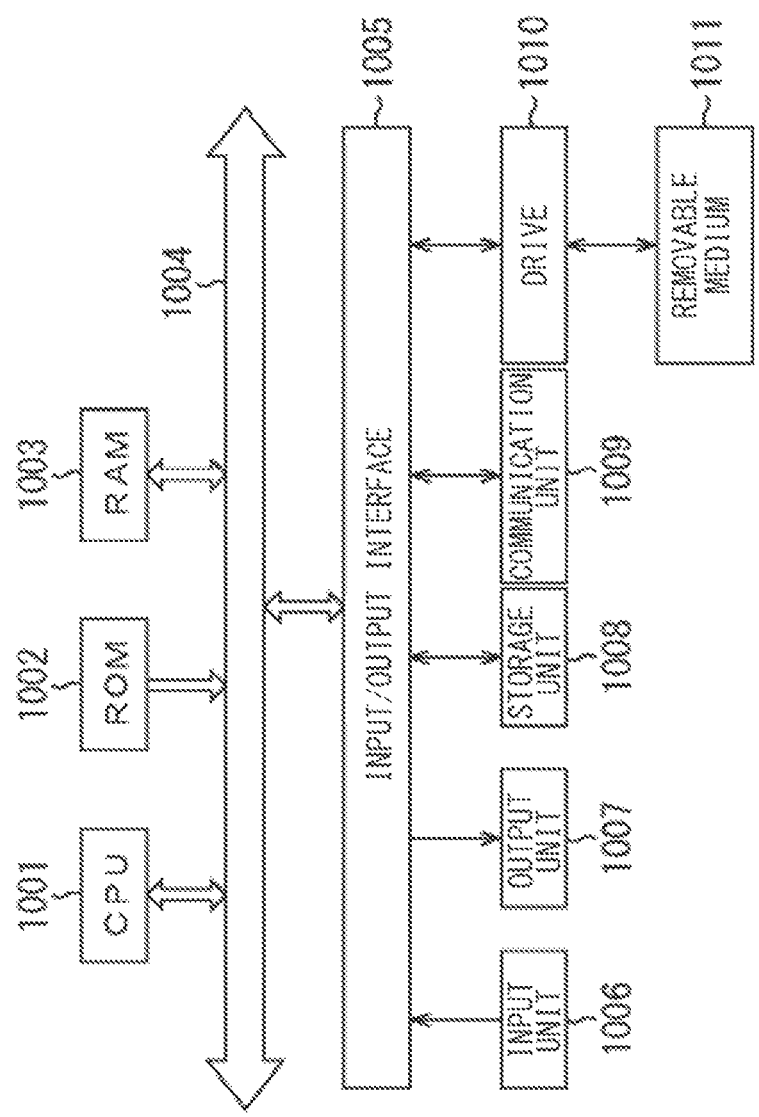

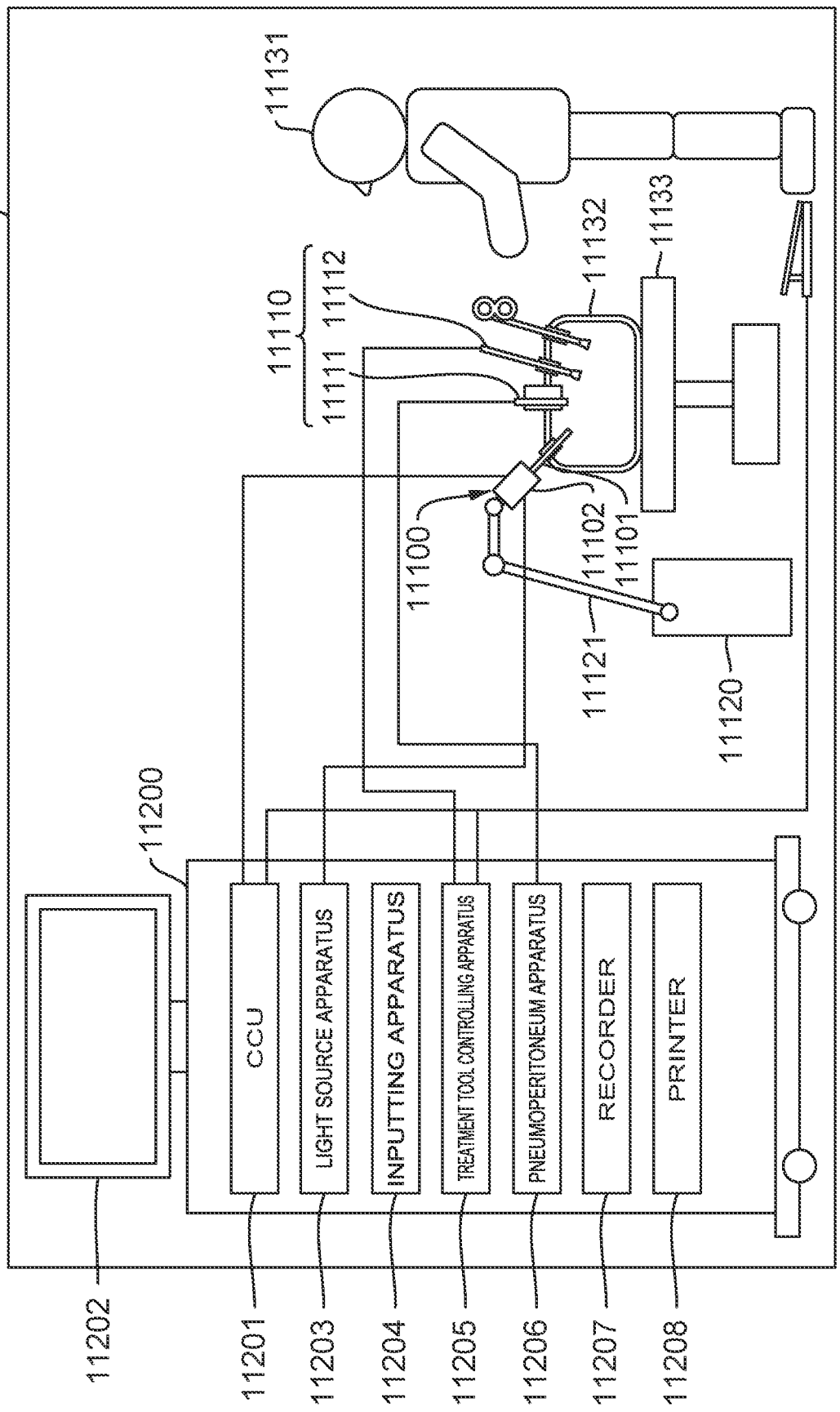

ENCODING DEVICE, ENCODING METHOD, DECODING DEVICE, DECODING METHOD, AND PROGRAM

TECHNICAL FIELD

The present technology relates to an encoding device, an encoding method, a decoding device, a decoding method, and a program, and relates to, for example, an encoding device, an encoding method, a decoding device, a decoding method, and a program that make it possible to perform DC-free encoding and decoding.

BACKGROUND ART

There has been an increasing transmission capacity of data required for an interface between an image sensor and a DSP (Digital Signal Processor) that processes an image captured by the image sensor, in association with higher image quality and higher frame rate of the image sensor.

Examples of the specification of an interface for data transmission between chips, such as between the image sensor and the DSP include MIPI (Mobile Industry Processor Interface) specification and SLVS-EC (Scalable Low Voltage Signaling-Embedded Clock) specification.

PTL 1 describes a transmission system in which packets storing image data are distributed to a plurality of lanes, and data is transmitted from an image sensor to a DSP via the plurality of lanes. In this transmission scheme, pieces of image data constituting each line of one frame are stored in the respective packets in the image sensor, and are transmitted to the DSP.

CITATION LIST

Patent Literature

PTL 1: Japanese Unexamined Patent Application Publication No. 2012-120159 1

SUMMARY OF THE INVENTION

Problem to be Solved by the Invention

In data transmission between chips, an encoding scheme such as 8 b/10 b encoding scheme, 64 b/66 b encoding scheme, and 64 b/67 b encoding scheme is used, and decoding is performed by a decoding scheme corresponding to the encoding scheme. According to the 8 b/10 b encoding scheme, there is a possibility that transmission efficiency may be lowered. In addition, there is a possibility that the 64 b/66 b encoding scheme may not achieve DC-free. According to the 64 b/67 b encoding scheme, there is a possibility that a run length may be deteriorated to make it difficult for receiving side to perform accurate decoding.

The present technology has been made in view of such circumstances, and is directed to performing encoding and decoding in which a running disparity and a run length are controlled, without deteriorating transmission efficiency.

Means for Solving the Problem

An encoding device according to an aspect of the present technology includes: a calculation section that divides inputted data into N bits or M bits to calculate a first running disparity of a data string of the N bits or the M bits; a determination section that determines whether or not the data string is inverted on a basis of the first running disparity calculated by the calculation section and a second running disparity calculated at a time point prior to the first running disparity; and an addition section that inverts or non-inverts the data string on a basis of a result of the determination by the determination section to add a flag indicating the result of the determination by the determination section for outputting, in which the determination section determines not to perform inversion in a case where the data string is a control code, and the addition section adds the flag assigned to the control code.

An encoding method according to an aspect of the present technology includes causing an encoding device to: divide inputted data into N bits or M bits to calculate a first running disparity of a data string of the N bits or the M bits; determine whether or not the data string is inverted on a basis of the calculated first running disparity and a second running disparity calculated at a time point prior to the first running disparity; invert or non-invert the data string on a basis of a result of the determination to add a flag indicating the result of the determination for outputting; determine not to perform inversion in the determination in a case where the data string is a control code; and add a flag assigned to the control code.

A first program according to an aspect of the present technology causes a computer, which controls an encoding device, to execute processing, the processing including: dividing inputted data into N bits or M bits to calculate a first running disparity of a data string of the N bits or the M bits; determining whether or not the data string is inverted on a basis of the calculated first running disparity and a second running disparity calculated at a time point prior to the first running disparity; inverting or non-inverting the data string on a basis of a result of the determination to add a flag indicating the result of the determination for outputting; determining not to perform inversion in the determination in a case where the data string is a control code; and adding a flag assigned to the control code.

1 A decoding device according to an aspect of the present technology includes: a first determination section that refers to a flag added to a data string of N bits or M bits to be inputted to determine whether or not the data string is a control code; a second determination section that determines whether or not the data string is inverted in a case where the first determination section determines that the data string is not the control code; and an output section that outputs the inputted data string of the N bits or the M bits without inversion in a case where the first determination section determines that the data string is the control code, outputs the inputted data string of the N bits or the M bits without inversion in a case where the second determination section determines that the data string is not inverted, and outputs the inputted data string of the N bits or the M bits after inversion in a case where the second determination section determines that the data string is inverted.

A decoding method according to an aspect of the present technology includes causing a decoding device to: refer to a flag added to a data string of N bits or M bits to be inputted to determine whether or not the data string is a control code; determine whether or not the data string is inverted in a case where determination is made that the data string is not the control code; output the inputted data string of the N bits or the M bits without inversion in a case where determination is made that the data string is the control code; output the inputted data string of the N bits or the M bits without inversion in a case where determination is made that the data string is not the control code and is not inverted; and output the inputted data string of the N bits or the M bits after inversion in a case where determination is made that the data string is not the control code and is inverted.

A second program according to an aspect of the present technology causes a computer, which controls a decoding device, to execute processing, the processing including: referring to a flag added to a data string of N bits or M bits to be inputted to determine whether or not the data string is a control code; determining whether or not the data string is inverted in a case where determination is made that the data string is not the control code; outputting the inputted data string of the N bits or the M bits without inversion in a case where determination is made that the data string is the control code; outputting the inputted data string of the N bits or the M bits without inversion in a case where determination is made that the data string is not the control code and is not inverted; and outputting the inputted data string of the N bits or the M bits after inversion in a case where determination is made that the data string is not the control code and is inverted.

In the encoding device, the encoding method, and the first program according to the respective aspects of the present technology, inputted data is divided into N bits or M bits to calculate a first running disparity of a data string of the N bits or the M bits; determination is made as to whether or not the data string is inverted on a basis of the calculated first running disparity and a second running disparity calculated at a time point prior to the first running disparity; the data string is inverted or non-inverted on a basis of a result of the determination to add a flag indicating the result of the determination for outputting. As for the determination, the determination is made not to perform inversion in a case where the data string is a control code, and a flag assigned to the control code is added.

In the decoding device, the decoding method, and the second program according to the respective aspects of the present technology, a flag added to a data string of N bits or M bits to be inputted is referred to determine whether or not the data string is a control code; determination is made as to whether or not the data string is inverted in a case where determination is made that the data string is not the control code; the inputted data string of the N bits or the M bits is outputted without inversion in a case where determination is made that the data string is the control code; the inputted data string of the N bits or the M bits is outputted without inversion in a case where determination is made that the data string is not the control code and is not inverted; and the inputted data string of the N bits or the M bits is outputted after inversion in a case where determination is made that the data string is not the control code and is inverted.

It is to be noted that the encoding device or the decoding device may be an independent device or may be an internal block included in a single device.

In addition, the program may be provided by transmission via a transmission medium or by recording in a recording medium.

BRIEF DESCRIPTION OF THE DRAWINGS

FIG. 6 is an explanatory diagram of a flag.
FIG. 19 illustrates contents and information amount of header information.
FIG. 20 illustrates an example of a bit array.
FIG. 33 illustrates an example of a control code.
FIG. 34 illustrates a value of K Character.

FIG. 46 illustrates an example of a conversion table.

FIG. 61 is a flowchart that describes another processing of the decoder.

FIG. 62 is a block diagram illustrating a configuration example of a computer.

FIG. 63 is a view depicting an example of a schematic configuration of an endoscopic surgery system.

FIG. 64 is a block diagram depicting an example of a functional configuration of a camera head and a camera control unit (CCU).

MODES FOR CARRYING OUT THE INVENTION

Hereinafter, description is given of modes for carrying out the present technology (hereinafter, referred to as an embodiment).

<System Configuration Example>

Figure 1:
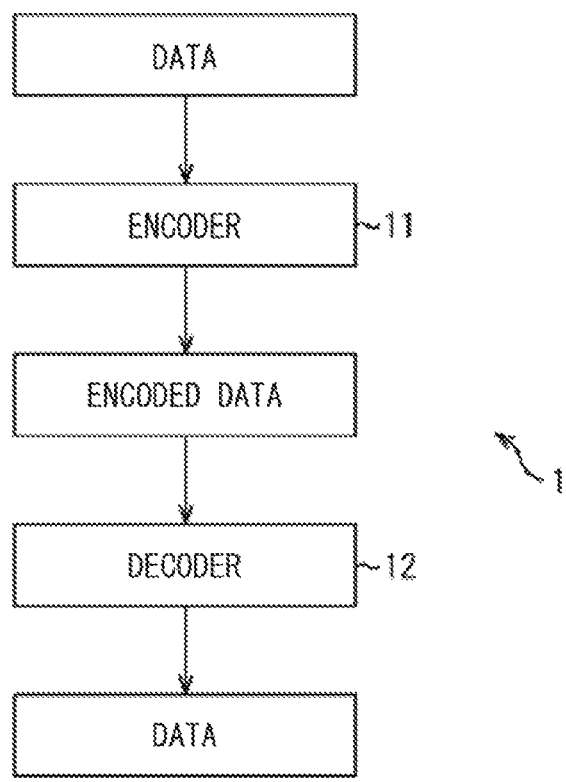
FIG. 1 illustrates a configuration of an embodiment of a data processing system to which the present technology is applied.

FIG. 1 illustrates a configuration example of a data processing system to which the present technology is applied. A data processing system 1 includes an encoder (encoding device) 11 that encodes (performs encoding of) data, and a decoder (decoding device) 12 that decodes encoded data.

Prior to describing an encoding scheme and a decoding scheme to which the present technology is applied, description is given of an example of an existing encoding scheme. Examples of the existing encoding scheme include an 8 b/10 b encoding scheme. The 8 b/10 b encoding scheme is a scheme of encoding 8-bit data into 10-bit data, and a clock is embedded in serial data to thereby transfer the data and the clock using the same wiring line.

However, the conversion from 8 bits to 10 bits results in 20% loss of a band. Therefore, a 64 b/66 b encoding scheme, in which the 64 b/66 b encoding scheme is also proposed, executes a similar matter by an approach different from the 8 b/10 b encoding scheme. The 64 b/66 b encoding scheme uses a technique called scrambling instead of a code table used in the 8 b/10 b encoding scheme.

The scrambling allows a pattern of zero and one of encoded data to be randomized by frequent shift and to be controlled such that zero and one are not successive with high probability. Even the encoded data randomized in this manner is configured to be restorable to the original one on receiving side. Such scrambling allows output data to be randomized and DC balance to be equilibrated.

The 64 b/66 b is not guaranteed to be completely DC-free because a running disparity, which is an accumulated value of zero or one, is not controlled. A 64 b/67 b encoding scheme has also been proposed as an encoding scheme in which the running disparity is controlled. According to the 64 b/67 b encoding scheme, the running disparity is controlled, but a run length generated by the succession of zero or one may not be controlled in some cases.

From those described above, the running disparity and the run length may be deteriorated in some cases depending on data series to be transmitted in both of the 64 b/66 b encoding scheme and the 64 b/67 b encoding scheme, which may possibly adversely affect a clock reproduction performance on the receiving side (decoding side). In addition, according to the 64 b/67 b encoding scheme, three-bit data is required as control data for 64 bits of data to be transmitted, thus deteriorating transmission efficiency.

Therefore, description is given of a DC-free encoding scheme, to which the present technology described below is applied, that controls the running disparity as well as the run length and that suppresses degradation in the transmission efficiency. In addition, description is also given appropriately of a decoding scheme that decodes data encoded by such an encoding scheme.

Figure 2:
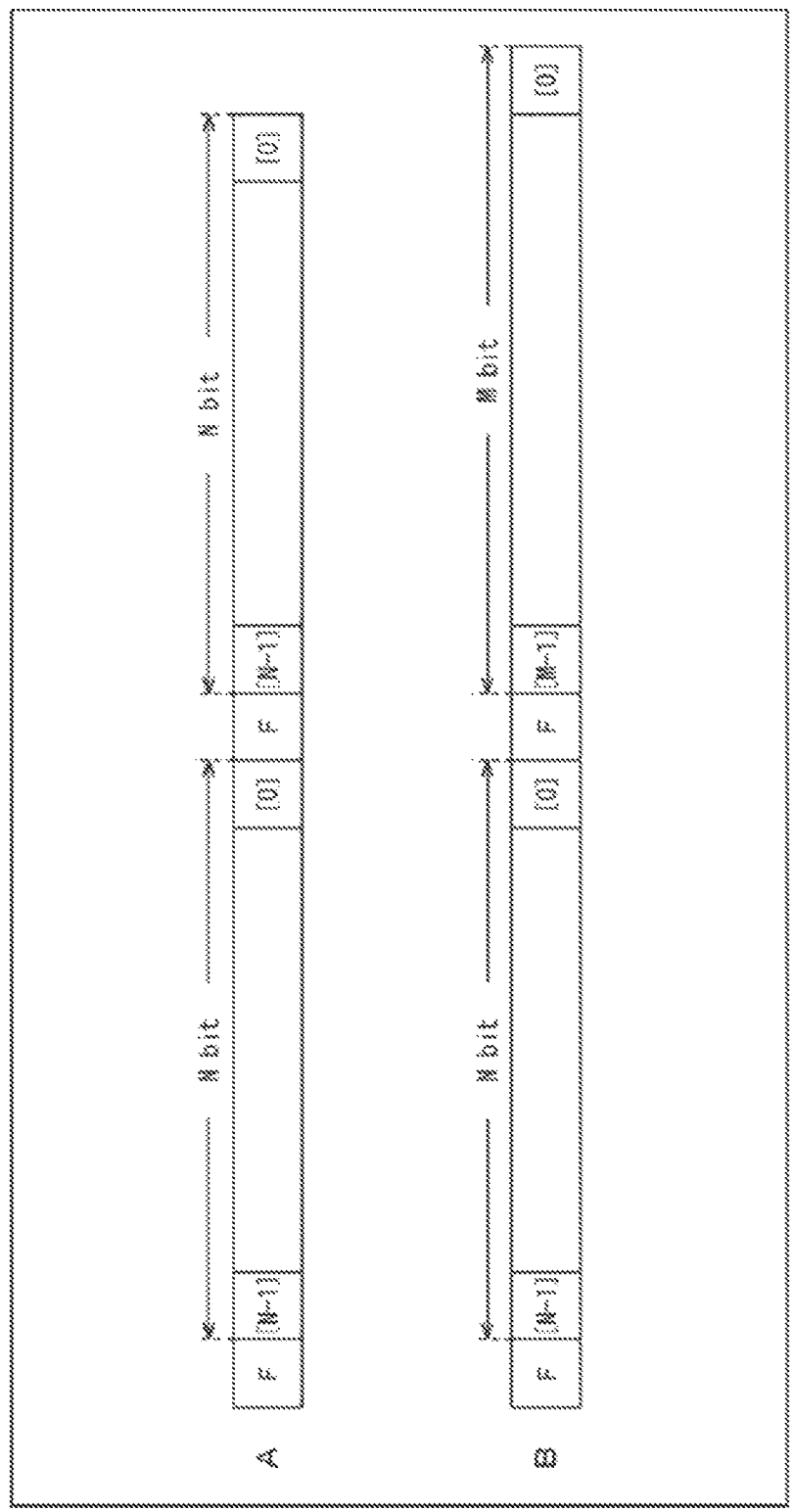
FIG. 2 is an explanatory diagram of the number of bits to be divided.

An encoder 11 to which the present technology is applied converts an inputted data string into a data string as illustrated in FIG. 2. As illustrated in A of FIG. 2, the encoder 11 divides the inputted data string into an N-bit data string, and adds a one-bit flag to the head thereof for each N-bit.

As illustrated in B of FIG. 2, the encoder 11 divides inputted data into an N-bit data string and an M-bit data string, and adds a one-bit flag to the head of the N-bit data string, and adds a one-bit flag to the head of the M-bit data string.

In the following description, the N-bit or M-bit data string is described as one block. In addition, an (N+1)-bit data string in which a one-bit flag is added to the N-bit data string is also described appropriately as one block. Likewise, an (M+1)-bit data string in which a one-bit flag is added to the M-bit data string is also described appropriately as one block.

The encoder 11 may perform encoding to divide inputted data into the same bits as illustrated in A of FIG. 2, or may perform encoding to divide inputted data into different bits as illustrated in B of FIG. 2.

N and M are odd numbers. The one-bit flag is added to the N bit, and thus the (N+1) bits is an even number. In addition, the (M+1) bits is also an even number. In this manner, N or M is set to allow one block including a flag to be an even-number bit.

In the following description, description is given referring mainly to an example in which an inputted data string is divided into N bits and M bits as illustrated in B of FIG. 2, but the present embodiment described below is also applicable to a case where an inputted data string is divided into N bits as illustrated in A of FIG. 2. In other words, even in a case where N=M holds true, the present embodiment is applicable.

<Configuration of Encoder>

Figure 3:
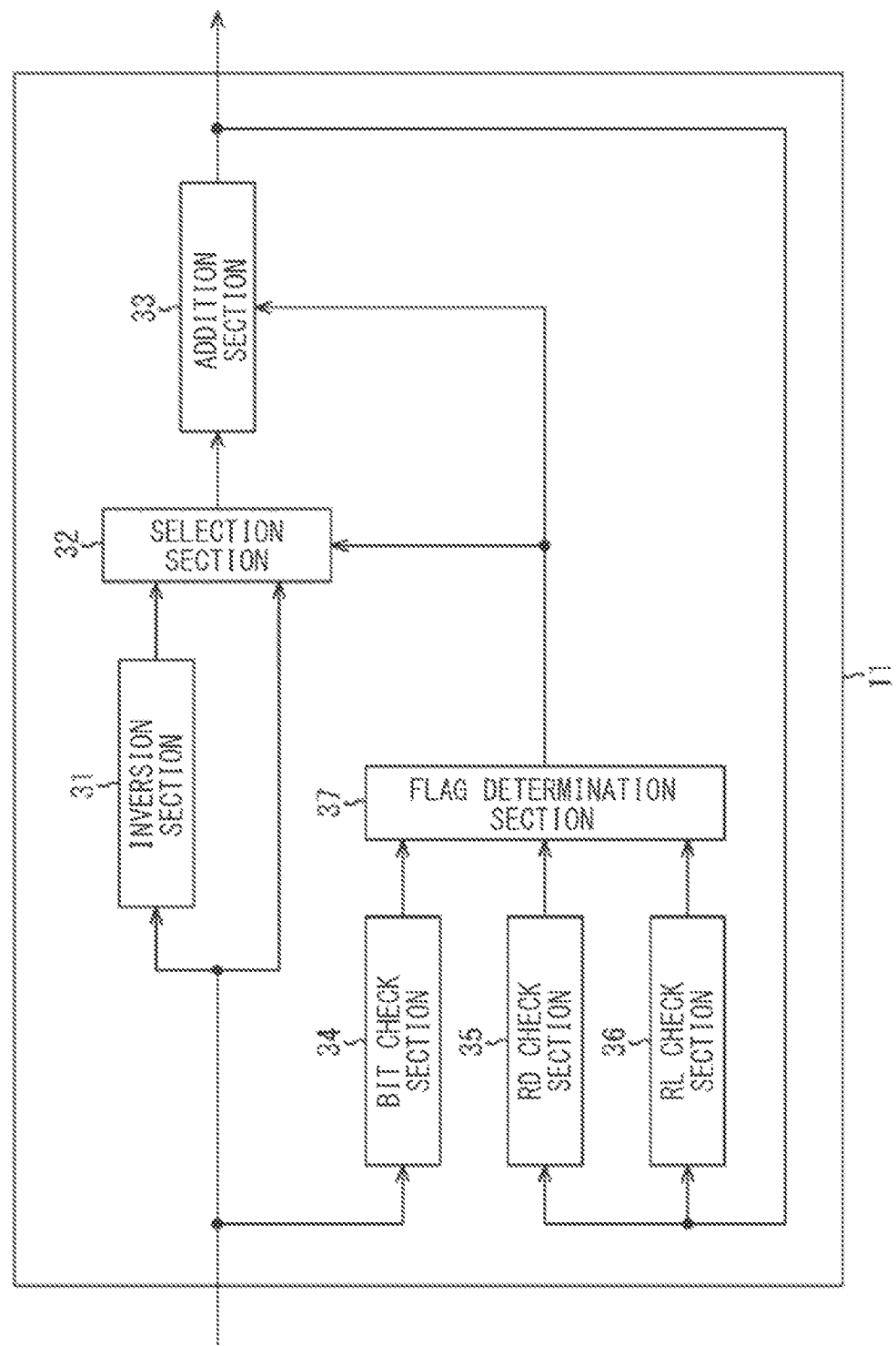
FIG. 3 illustrates a configuration example of an encoder.

FIG. 3 illustrates a configuration of the encoder 11. The encoder 11 includes an inversion section 31, a selection section 32, an addition section 33, a bit check section 34, an RD check section 35, an RL check section 36, and a flag determination section 37.

Data inputted to the encoder 11 is supplied to each of the inversion section 31, the selection section 32, and the bit check section 34. The inversion section 31 inverts the supplied data. In a case where the inputted data is "1", the inversion section 31 converts it to "0"; in a case where the inputted data is "0", the inversion section 31 converts it to "1". The data (n-bit data string) inverted by the inversion section 31 is supplied to the selection section 32.

A data string itself inputted to the encoder 11 is also inputted to the selection section 32. That is, an inverted data string and a non-inverted data string are also inputted to the selection section 32. In response to a determination result from the flag determination section 37, the selection section 32 supplies either the inverted data string or the non-inverted data string to the addition section 33.

The addition section 33 adds a flag supplied from the flag determination section 37 to the data string outputted from the selection section 32. For example, in a case where an N-bit data string is outputted from the selection section 32, the addition section 33 adds a one-bit flag to output an (N+1)-bit data string. The flag is a flag indicating whether or not the data is inverted. In the following description, description is given on the assumption that a flag in a case where the data is inverted is set as "1", and a flag in a case where the data is not inverted is set as "0"; however, setting of any other flag is also within the scope of the present technology.

The bit check section 34 checks an inputted data string. The bit check section 34 monitors a running disparity (hereinafter, referred to as "RD") and a run length (hereinafter, referred to as "RL") of the inputted data string.

In a case where the inputted data is "1", the bit check section 34 assigns "1, and in a case where the inputted data is "0", the bit check section 34 assigns "−1", to define a cumulative sum of the assigned numerical value as an accumulated value RD. In addition, the bit check section 34 manages the number of times RL of succession of "1" in the inputted data and the number of times RL of succession of "0".

The bit check section 34 functions as a calculation section that calculates the running disparity and the run length of inputted data.

The RD check section 35 checks a past accumulated value RD. The RL check section 36 checks the past number of times RL. The RD check section 35 and the RL check section 36 check, respectively, the accumulated value RD and the number of times RL in a data string at a time point prior to a data string checked by the bit check section 34.

The flag determination section 37 uses check results from the bit check section 34, the RD check section 35, and the RL check section 36 to determine whether or not to invert the data string and to generate a corresponding flag. The flag determination section 37 uses the accumulated value RD of a data string being currently processed, the number of times RL, the accumulated value RD of past data strings, and the number of times RL to determine whether or not to invert the data string, although detailed description is given later.

In a case where determination is made that the data is to be inverted, the flag determination section 37 generates data of "1" as a flag, and, in a case where determination is made that the data is not to be inverted, the flag determination section 37 generates data of "0" as a flag to supply the generated data to the selection section 32 and the addition section 33.

In a case of being supplied with the flag of "1", the selection section 32 outputs, to the addition section 33, a data string supplied from the inversion section 31, and the addition section 33 adds the flag of "1" to the data string. In addition, in a case of receiving the supply of the flag of "0", the selection section 32 outputs, to the addition section 33, a non-inverted data string inputted to the encoder 11, and the addition section 33 adds the flag of "0" to the data string.

<Configuration of Decoder>

Figure 4:
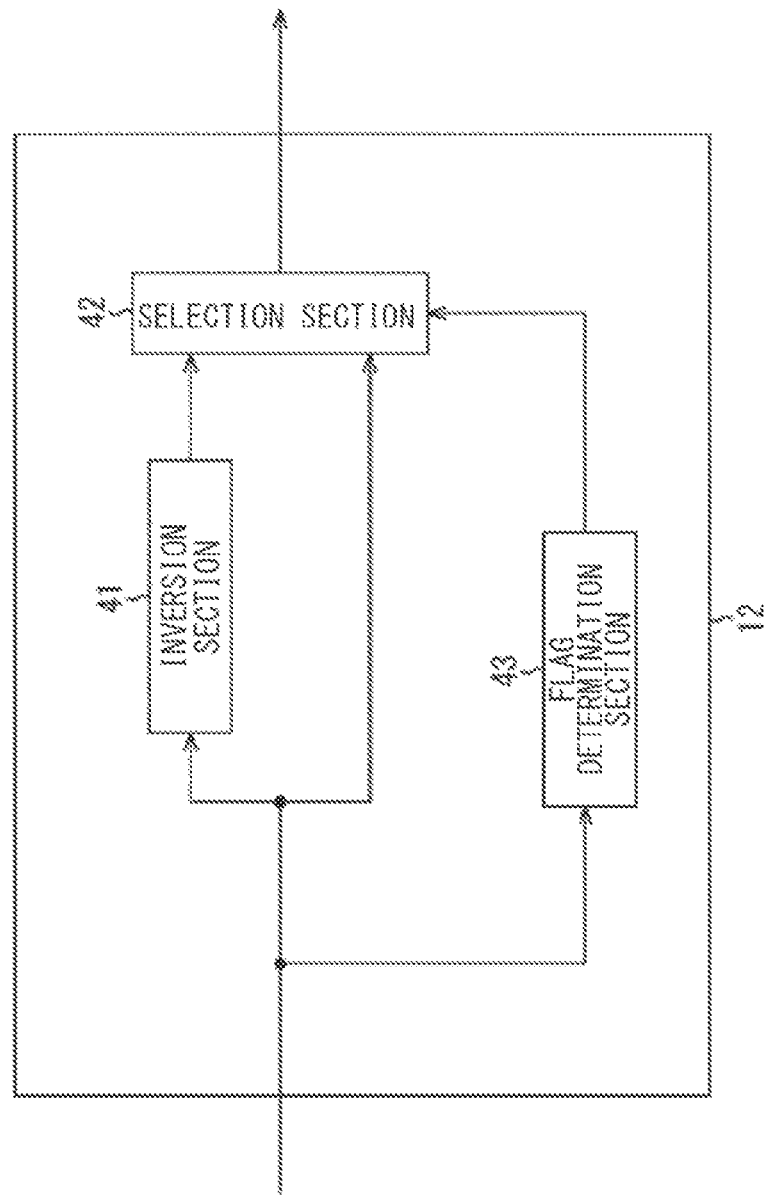
FIG. 4 illustrates a configuration example of a decoder.

FIG. 4 illustrates a configuration of a decoder 12. The decoder 12 includes an inversion section 41, a selection section 42, and a flag determination section 43.

Data inputted to the decoder 12 is supplied to each of the inversion section 41, the selection section 42, and the flag determination section 43. The inversion section 41 inverts the supplied data, and supplies the inverted data to the selection section 42. A non-inverted data string inputted to the decoder 12 is also inputted to the selection section 42.

The flag determination section 43 refers to a one-bit flag included in the data string inputted to the decoder 12; in a case where the flag indicates inversion and where "1" is indicated in this occasion, the flag determination section 43 instructs the selection section 42 to select a data string from the inversion section 41 and to output the selected data string. In addition, the flag determination section 43 refers to the one-bit flag included in the data string inputted to the decoder 12; in a case where the flag indicates non-inversion and where "0" is indicated in this occasion, the flag determination section 43 instructs the selection section 42 to select a data string inputted without being passed through the inversion section 41 and to output the selected data string.

In this manner, in the encoder 11, processing is performed to add a one-bit flag to a data string, and in the decoder 12, processing is performed to determine whether or not the data string is inverted by referring to the flag. In a case where data to be encoded has N bits on side of the encoder 11, a one-bit flag is added and conversion is made into a data string of (N+1) bits, but only one bit is added, thus making it possible to perform encoding in which degradation in transmission efficiency is suppressed.

In addition, on the side of the encoder 11, the running disparity (RD) and the run length (RL) are monitored to perform encoding on the basis of the monitored running disparity and run length, thus making it possible to perform encoding in which the running disparity and the run length are controlled.

In addition, it is possible to perform decoding in response to the encoding performed on the side of the encoder 11. Also on side of the decoder 12, it is possible to decode data encoded on the basis of the running disparity and the run length and to perform decoding in which degradation in the transmission efficiency is suppressed.

<Concerning Control of Running Disparity>

The encoder 11 is configured to allow the bit check section 34 and the RD check section 35 to monitor the running disparity (RD) and to allow a flag corresponding to the running disparity to be set. Here, description is given of control of the running disparity.

Figure 5:
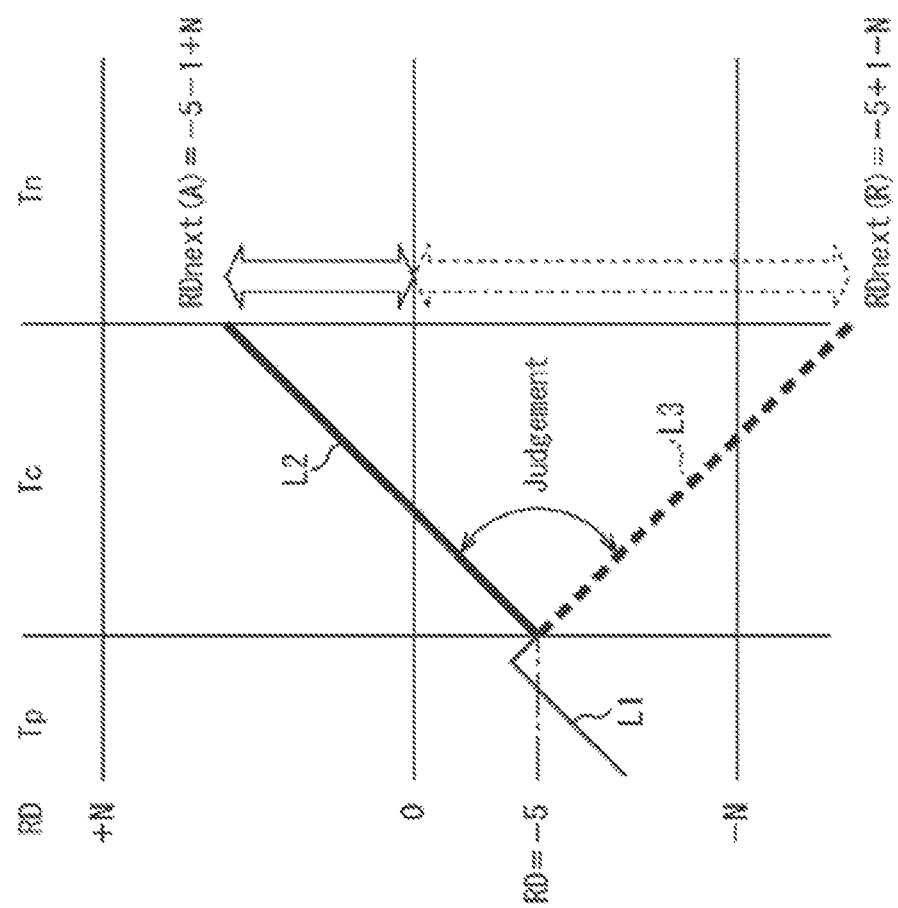
FIG. 5 is an explanatory diagram of control of a running disparity.

Graphs illustrated in FIG. 5 are each an explanatory diagram that describes the control of the running disparity. Time Tc denotes current time (in processing), time Tp denotes time before the time Tc, and time Tn denotes time after the time Tc.

The bit check section 34 (FIG. 3) calculates the accumulated value RD of data strings during processing at the clock time Tc. The RD check section 35 (FIG. 3) refers to the accumulated value RD of data strings processed at the clock time Tp in this case until time before the time Tc. The accumulated value RD is a value having been calculated as "1" in a case where the data is "1", and is a value having been calculated as "−1" in a case where the data is "0", after the start of processing in the encoder 11.

Description is given by exemplifying a case where an N-bit data string is processed at the time Tc. In other words, description is given by exemplifying a case, in the encoder 11, as illustrated in A of FIG. 2, where inputted data is divided for each N bit, a one-bit flag is added to the inputted data, and one block generates a data string of (N+1) bits.

In the graphs illustrated in FIG. 5, a graph L1 indicated by a thin line represents a change in the accumulated value RD at the clock time Tp. Assume that the accumulated value RD is RD=(−5) at a time point when the time Tp ends (at a time point when the time Tc starts).

Assume that all of N-bit data strings to be processed at the time Tc are "1". In a case where all of the N-bit data strings to be processed at the time Tc are "1", the accumulated value RD is a graph rising linearly starting from (−5) as in a graph L2 indicated by a bold line in FIG. 5. In this case, the data is not inverted, and thus the flag is "0". Therefore, the accumulated value RDnext (A) at a time point when the time Tc ends (at a time point when the time Tn starts) is a value obtained by adding the accumulated value RD at the time point when the clock time Tp ends and the accumulated value RD calculated at the time Tc.

The value obtained by adding the accumulated value RD calculated at the time Tc is N because all of the N bits are "1". The flag "0" is included as "−1" in the accumulated value RDnext (A), and thus the accumulated value RDnext (A) is the following value.

Accumulated value $RDnext\ (A)=(-5)+(-1)+N$

The running disparity of the N-bit data string to be processed is N. The above-described accumulated value RDnext (A) is a value obtained by adding a running disparity calculated at the current time point to a running disparity calculated until the previous time point.

In a case where all of the N-bit data strings to be processed at the time Tc are "1" and all of the data strings are inverted, all of the data strings are "0", and the accumulated value RD is a graph declining linearly starting from (−5), as illustrated in a graph L3 indicated by a dotted line in FIG. 5. In this case, the data is inverted, and thus the flag is "1". The flag "1" is set to "1" when calculating the accumulated value RD, and this value is also included in an accumulated value RDnext (R).

The accumulated value RDnext (R) has the following value.

Accumulated value $RDnext=(-5)+1+(-N)$

The running disparity of the N-bit data string is −N when the N-bit data string to be processed is inverted. The above-described accumulated value RDnext (R) is a value obtained by subtracting the running disparity calculated at the current time point from the running disparity calculated until the previous time point.

Ideally, the running disparity is zero (RD=0). The running disparity being zero means a state in which the DC balance is kept, with the numbers of appearances of "0" and "1" as pieces of data being the same.

In order to control the running disparity to be a value close to zero, the encoder 11 is configured to compare the accumulated value RD in a case where the data is inverted and the accumulated value RD in a case where the data is not inverted with each other and to employ the accumulated value RD closer to RD=0.

That is, in this case, an absolute value of the accumulated value RDnext (A) and an absolute value of the accumulated value RDnext (R) are compared with each other, and a value closer to zero is employed. In the example illustrated in FIG. 5, the accumulated value RDnext (A) is employed because the accumulated value RDnext (A) is closer to RD=0 than the accumulated value RDnext (R). The accumulated value RDnext (A) is a value in the case where the data is not inverted, and thus "0" is set as a flag in this case.

The bit check section 34 (FIG. 3) of the encoder 11 executes processing at the clock time Tc. That is, the bit check section 34 calculates the accumulated value RD of the N-bit data string to be inputted. For example, the bit check section 34 executes processing of creating the graph L2 of FIG. 5.

The RD check section 35 (FIG. 3) of the encoder 11 executes processing at the clock time Tp. As illustrated in FIG. 3, a data string including a flag outputted from the addition section 33 is inputted to the RD check section 35. The data string outputted from the addition section 33 is an inverted data string or a non-inverted data string. That is, a data string to be transmitted to the side of the decoder 12 is inputted to the RD check section 35.

The RD check section 35 calculates the accumulated value RD of the data string to be inputted in the same manner as the bit check section 34. For example, the RD check section 35 executes processing of creating the graph L1 of FIG. 5.

As described with reference to FIG. 5, the flag determination section 37 (FIG. 3) compares the accumulated value RDnext (A) and the accumulated value RDnext (R) with each other to determine an accumulated value closer to zero, and generates a flag corresponding to the accumulated value. For example, the flag determination section 37 makes a determination on the basis of a decision table illustrated in FIG. 6, and generates a flag.

Referring to the decision table of FIG. 6, the decision table is a table in which the accumulated value RD at the time Tc (at the current time point) (hereinafter, referred to as an accumulated value RDc), an accumulated value at the time Tp (past) (hereinafter, referred to as an accumulated value RDp), and the flag are associated with one another.

The decision table of FIG. 6 is a table to determine whether or not the data (at the current time point) is to be inverted at the time Tc. Therefore, the accumulated value RDp is an accumulated value including a flag at a time point of the time Tp (past), i.e., at a time point when the time Tp is switched to the time Tc. The accumulated value RDc is an accumulated value at the end of the time Tc, and is a value not including the flag.

Categorization is made into: a case where the accumulated value RDc is positive (accumulated value RDc>0); a case where the accumulated value RDc is zero (accumulated value RDc=0); and a case where the accumulated value RDc is negative (accumulated value RDc<0). That is, whether the accumulated value RDc supplied from the bit check section 34 is positive, zero, or negative is set as one factor of flag setting.

In addition, referring to the decision table of FIG. 6, categorization is made, also for the accumulated value RDp, into: a case where the accumulated value RDp is positive (accumulated value RDp>0); a case where the accumulated value RDp is zero (accumulated value RDp=0); and a case where the accumulated value RDp is negative (accumulated value RDp<0). That is, whether the accumulated value RDp supplied from the RD check section 35 is positive, zero, or negative is set as one factor of the flag setting.

In a case where the accumulated value RDc>0 and the accumulated value RDp>0 hold true, the flag is set to "1". That is, in this case, the data is to be inverted. In a case where the accumulated value RDc>0 and the accumulated value RDp=0 hold true, the flag is set to "1". That is, in this case, the data is inverted. In a case where the accumulated value RDc>0 and the accumulated value RDp<0 hold true, the flag is set to "0". That is, in this case, the data is non-inverted.

It is to be noted that, in the case where the accumulated value RDc>0 and the accumulated value RDp=0 hold true, the flag may be set to "0", and the data may be set to be non-inverted.

Figure 7:
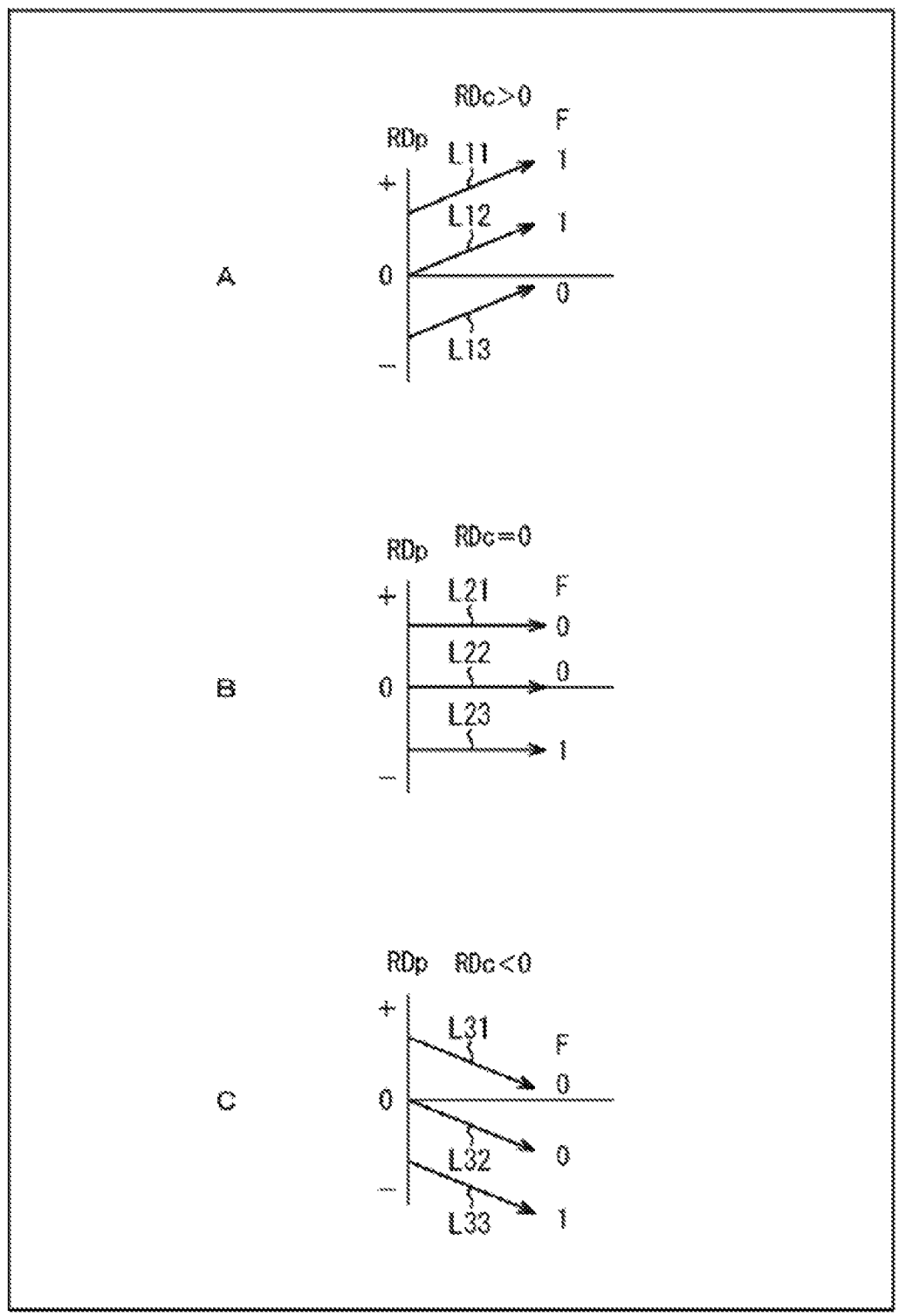
FIG. 7 is an explanatory diagram of a relationship between the running disparity and the flag.

Description is given, with reference to A of FIG. 7, of the case where the accumulated value RDc>0 holds true. Also in FIG. 7, description is given, similarly to FIG. 6, on the assumption that the accumulated value RDp is an accumulated value including a flag of the time Tp, and that the accumulated value RDc is a value not including a flag of the time Tc.

In A of FIG. 7, a graph L11 represents a graph in the case where the accumulated value RDc>0 and the accumulated value RDp>0 hold true; a graph L12 represents a graph in the case where the accumulated value RDc>0 and the accumulated value RDp=0 hold true; and a graph L13 represents a graph in the case where the accumulated value RDc>0 and the accumulated value RDp<0 hold true. It is to be noted that a straight line passing through two points (coupling the two points) of the accumulated value RDp and the accumulated value RDc is described as a graph.

In the case of the accumulated value RDc>0, the graphs L11 to L13 each having the accumulated value RDp as a starting point are increasing graphs (positive graphs). That is, referring to the graph L11, in a case where the accumulated value RDp>0 is a starting point, a value becomes larger than the accumulated value RDp because the accumulated value RDc>0 holds true, and thus the graph proceeds in a direction away from zero. Therefore, in such a case, in order to bring the accumulated value RD closer to zero, the flag determination section 37 determines that the data is to be inverted to set "1" as the flag. It is appreciated that, when the data is inverted, the graph of L11 becomes a negative graph, and comes closer to zero.

Referring to the graph L12, in a case where the accumulated value RDp=0 is a starting point, a value becomes larger than the accumulated value RDp (=0) because the accumulated value RDc>0 holds true, and thus the graph proceeds in a direction away from zero. Therefore, in such a case, in order to bring the accumulated value RD closer to zero, the flag determination section 37 determines that the data is to be inverted to set "1" as the flag. Alternatively, in order to bring the accumulated value RD closer to zero, the flag determination section 37 may determine that the data is non-inverted to set "0" as the flag. In the case of the accumulated value RDp=0, the distances from zero are the same regardless of whether inverted or not inverted, and thus setting may be made to determine that inversion is performed, or setting may be made to determine that non-inversion is performed.

In a case where the accumulated value RDc>0 holds true, i.e., in a case where a data string being processed has a positive accumulated value RD, the data string being processed is a data string including a number of "1". The flag value is also included in the accumulated value RD, and thus setting "0" as the flag makes it possible to bring the accumulated value RD closer to zero in a case where the data string being processed is the data string including a number of "1". Taking these into consideration, in a case where the accumulated value RDp=0 and the accumulated value RDc>0 hold true, "0" may be set as the flag.

Referring to the graph L13, in a case where the accumulated value RDp<0 is a starting point, a value becomes larger than the accumulated value RDp because the accumulated value RDc>0 holds true, and thus the graph proceeds in a direction closer to zero (a direction from a negative region to a positive region). Therefore, in such a case, in order to bring the accumulated value RD closer to zero, the flag determination section 37 determines that the data is non-inverted to set "0" as the flag.

Returning to the description with reference to FIG. 6, in a case where the accumulated value RDc=0 and the accumulated value RDp>0 hold true, the flag is set to "0". That is, in this case, the data is not inverted. In a case where the accumulated value RDc=0 and the accumulated value RDp=0 hold true, the flag is set to "0". That is, in this case, the data is not inverted. In a case where the accumulated value RDc=0 and the accumulated value RDp<0 hold true, the flag is set to "1". That is, in this case, the data is non-inverted.

It is to be noted that, in the case where the accumulated value RDc=0 and the accumulated value RDp=0 hold true, the flag may be set to "1", and the data may be set to be inverted.

Description is given, with reference to B of FIG. 7, of the case where the accumulated value RDc=0 holds true. In B of FIG. 7, a graph L21 represents a graph in the case where accumulated value RDc=0 and the accumulated value RDp>0 hold true; a graph L22 represents a graph in the case where the accumulated value RDc=0 and the accumulated value RDp=0 hold true; and a graph L23 represents a graph in the case where the accumulated value RDc=0 and the accumulated value RDp<0 hold true.

In the case of the accumulated value RDc=0, the graphs L21 to L23 each having the accumulated value RDp as a starting point are graphs in which values do not change. That is, referring to the graph L21, in a case where the accumulated value RDp>0 is a starting point, a value remains unchanged as the accumulated value RDp because the accumulated value RDc=0 holds true, and thus there is a constant distance from zero in the graph. Therefore, in such a case, the distance from zero remains unchanged regardless of whether the data is inverted or not inverted, and thus the flag determination section 37 may determine that the data is not to be inverted to set "0" as the flag, or may determine that the data is to be inverted to set "1" as the flag.

Setting "0" as the flag allows "−1" to be used as a value at the time when calculating the accumulated value RD, thus bringing a value closer to zero by minus one in the case of the accumulated value RDp>0. Here, the description is continued on the assumption that "0" is set as the flag.

Referring to the graph L22, in a case where the accumulated value RDp=0 is a starting point, the accumulated value RDp (=0) is maintained in the graph because the accumulated value RDc=0 holds true. Therefore, in such a case, the data may be inverted or may not be inverted because of being in a favorable state, and thus the flag determination section 37 may determine that the data is to be inverted to set "1" as the flag, or may determine that the data is non-inverted to set "0" as the flag.

Referring to the graph L23, in a case where the accumulated value RDp<0 is a starting point, a value remains unchanged as the accumulated value RDp because the accumulated value RDc=0 holds true, and thus there is a constant distance from zero in the graph. Therefore, in such a case, the distance from zero remains unchanged regardless of whether the data is inverted or not inverted, and thus the flag determination section 37 may determine that the data is not to be inverted to set "0" as the flag, or may determine that the data is to be inverted to set "1" as the flag.

Setting "1" as the flag allows "1" to be used as a value at the time when calculating the accumulated value RD, thus bringing a value closer to zero by one in the case of the accumulated value RDp<0. Here, the description is continued assuming that "1" is set as the flag.

Returning to the description with reference to FIG. 6, in a case where the accumulated value RDc<0 and the accumulated value RDp>0 hold true, the flag is set to "0". That is, in this case, the data is not inverted. In a case where the accumulated value RDc<0 and the accumulated value RDp=0 hold true, the flag is set to "0". That is, in this case, the data is not inverted. In a case where the accumulated value RDc<0 and the accumulated value RDp<0 hold true, the flag is set to "1". That is, in this case, the data is inverted.

It is to be noted that, in the case where the accumulated value RDc<0 and the accumulated value RDp=0 hold true, the flag may be set to "1", and the data may be set to be inverted.

Description is given of the case of the accumulated value RDc<0 with reference to C of FIG. 7. In C of FIG. 7, a graph L31 represents a graph in the case where the accumulated value RDc<0 and the accumulated value RDp>0 hold true; a graph L32 represents a graph in the case where the accumulated value RDc<0 and the accumulated value RDp=0 hold true; and a graph L33 represents a graph in the case where the accumulated value RDc<0 and the accumulated value RDp<0 hold true.

In the case of the accumulated value RDc<0, the graphs L31 to L33 each having the accumulated value RDp as a starting point are decreasing graphs (negative graphs). That is, referring to the graph L31, in a case where the accumulated value RDp>0 is a starting point, a value becomes smaller than the accumulated value RDp because the accumulated value RDc<0 holds true, and thus the graph proceeds in a direction closer to zero. Therefore, in such a case, in order to bring the accumulated value RD closer to zero, the flag determination section 37 determines that the data is not inverted to set "0" as the flag.

Referring to the graph L32, in a case where the accumulated value RDp=0 is a starting point, a value becomes smaller than the accumulated value RDp (=0) because the accumulated value RDc<0 holds true, and thus the graph proceeds in a direction away from zero. Therefore, in such a case, in order to bring the accumulated value RD closer to zero, the flag determination section 37 may determine that the data is not inverted to set "0" as the flag, or may determine that the data is to be inverted to set "1" as the flag. In the case of the accumulated value RDp=0, the distances from zero are the same regardless of whether inverted or not inverted, and thus setting may be made to determine that inversion is to be performed, or setting may be made to determine that non-inversion is to be performed.

In a case where the accumulated value RDc<0 holds true, i.e., in a case where a data string being processed has a negative accumulated value RD, the data string being processed is a data string including a number of "0". The flag value is also included in the accumulated value RD, and thus setting "1" as the flag makes it possible to bring the accumulated value RD closer to zero in a case where the data string being processed is the data string including a number of "0". Taking these into consideration, in a case where the accumulated value RDp=0 and the accumulated value RDc<0 hold true, "1" may be set as the flag.

Referring to the graph L33, in a case where the accumulated value RDp<0 is a starting point, a value becomes smaller than the accumulated value RDp because the accumulated value RDc<0 holds true, and thus the graph proceeds in a direction away from zero. Therefore, in such a case, in order to bring the accumulated value RD closer to zero, the flag determination section 37 determines that the data is to be inverted to set "1" as the flag. It is appreciated that, when the data is inverted, the graph of L33 becomes a positive graph, and comes closer to zero.

In this manner, the flag determination section 37 sets a flag from the past accumulated value RD and the accumulated value RD being currently processed.

In this manner, the running disparity (RD) is monitored, and the data is inverted as necessary to allow the accumulated value RD to be closer to zero, thereby enabling control to achieve DC-free. Further, controlling the so-called run length in which zero is successive or one is successive as a data string makes it possible to perform more preferable encoding or decoding.

<Control of Run Length>

The encoder 11 is configured to allow the bit check section 34 and the RL check section 36 to monitor the run length (RL) and to allow a flag corresponding to the run length to be set (changed). Here, description is given of control of the run length.

Figure 8:
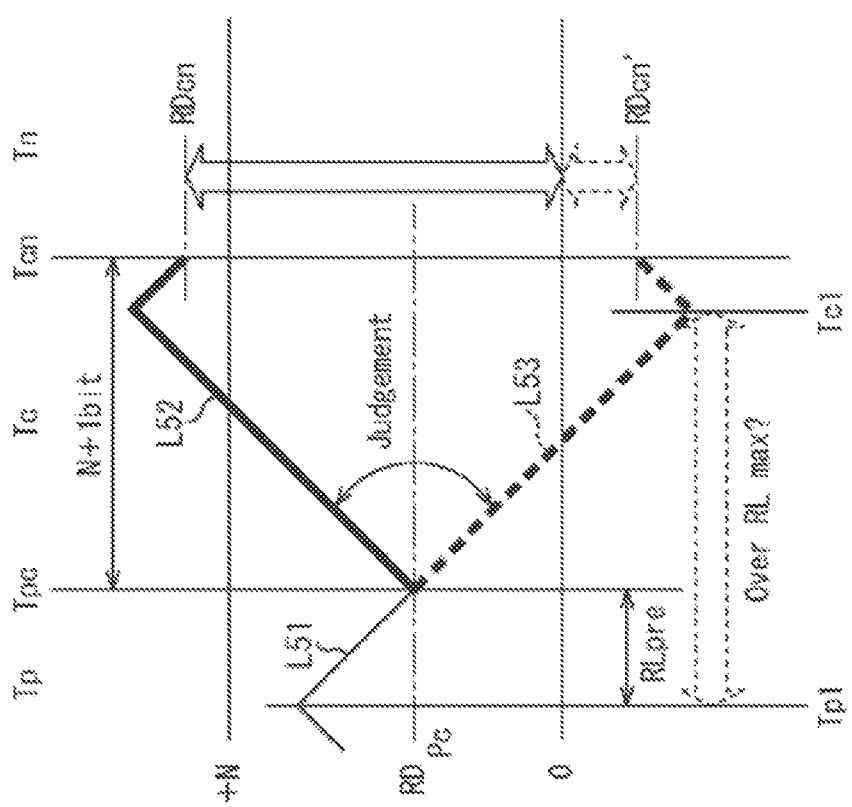
FIG. 8 is an explanatory diagram of control of a run length.

Graphs illustrated in FIG. 8 are each an explanatory diagram that describes the control of the run length. Also in the graphs illustrated in FIG. 8, similarly to the graphs illustrated in FIG. 5, the time Tc denotes current time (in processing), the time Tp denotes time before the time Tc, and the time Tn denotes time after the time Tc.

Assume the case where the accumulated value RD at the time when clock time Tpc at which the time Tp is switched to the time Tc is an accumulated value RDpc and is a value of the accumulated value RDpc>0 in the example illustrated in FIG. 8. In addition, assume the case where the accumulated value RD at the time Tp is changed as indicated by a graph L51 illustrated in FIG. 8.

As illustrated in a graph L52 of FIG. 8, the accumulated value RD of a data string being processed at the time Tc rises from the accumulated value RDpc because of successive one as the data, temporarily declines near the end of the time Tc, and finally reaches an accumulated value RDcn at clock time Tcn at which the time Tc is switched to the time Tn.

A graph L53 represents a graph in a case where a data string to be processed at the time Tc is inverted. The graph L53 is a graph in which the graph L52 is inverted, and thus declines from the accumulated value RDpc, with zero being successive as the data, temporarily rises near the end of the time Tc, and finally reaches an accumulated value RDcn' at the clock time Tcn at which the time Tc is switched to the time Tn.

As illustrated in FIG. 8, in a case where the accumulated value RD is changed, the accumulated value RDcn' at the time when the data is inverted is a value closer to the accumulated value RD=0 than the accumulated value RDcn at the time when the data is not inverted. Therefore, in a case where a running disparity RD is taken into consideration, determination is made that the data at the time Tc is to be inverted to set "1" as the flag. In other words, referring again to FIG. 6, in the case of the data string from the graph L51 to the graph L52 illustrated in FIG. 8, RDc>0 and RDp>0 hold true, and thus the flag is set to "1", which is also read from the table illustrated in FIG. 6.

Here, consideration is given to the run length. As described above, as a result of the consideration of the running disparity RD, in a case where the data is inverted, the accumulated value RD is obtained which runs from the graph L51 to the graph L53 as illustrated in FIG. 8. The inversion of the data string allows for a zone that descends in a straight line from the graph L51 to the graph L53. That is, there is a zone in which zero is successive.

Referring to FIG. 8, zero is successive from predetermined clock time (set as clock time Tp1) at the time Tp to the clock time Tpc. In addition, the inversion of the data string at the time Tc allows zero to be successive from the clock time Tpc to predetermined clock time (set as clock time Tc1) at the time Tc. That is, in this case, the data from the clock time Tp1 to the clock time Tc1 is zero. In other words, further, in data of a few bits from the clock time Tp1 to the clock time Tc1, zero is successive.

The inversion of the data in this manner may possibly deteriorate the run length. For example, a maximum value (a maximum value RLmax) of the run length is set; in a case where the run length becomes larger than or equal to (greater than) the maximum value RLmax, the determination is overridden that the data is to be inverted in order to control the running disparity RD, and is changed to a determination that the data is not to be inverted.

In the example illustrated in FIG. 8, in a case where the number of bits (run length RL) in which zero is successive from the clock time Tp1 to the clock time Tc1 is equal to or larger than the maximum value RLmax, the determination is changed to the effect that non-inversion is performed; thus, as a result, the accumulated value RD (data string) is obtained which changes from the graph L51 to the graph L52.

Therefore, because of the change from the graph L51 to the graph L52, the succession of zero is interrupted at the clock time Tpc, thus preventing the deterioration in the run length. In this manner, in a case where the running disparity RD is used to temporarily determine whether or not the data is to be inverted to process the data on the basis of results of the determination, determination is made as to whether or not the run length RL is deteriorated; in a case where the run length RL is deteriorated, the determination by the running disparity RD is changed.

Referring again to FIG. 8, in the above description, the graph L52 has been described as a graph of the accumulated value RD of a data string being currently processed. Next, description is given of a case where the graph L53 is a graph of the accumulated value RD of a data string being currently processed.

In a case where the graph L53 is a graph of the accumulated value RD at the time when the data is not inverted, the accumulated value RD at the clock time Tcn when the data is not inverted is the accumulated value RDcn'. In addition, the graph of the accumulated value RD at the time when the data is inverted is the graph L52, and thus the accumulated value RD at the clock time Tcn when the data is inverted is the accumulated value RDcn.

When the accumulated value RDcn' and the accumulated value RDcn are compared with each other, the value closer to the accumulated value RD=0 is the accumulated value RDcn'. Therefore, in a case where the running disparity RD is taken into consideration, determination is made that the data at the time Tc is not inverted to set "0" as the flag. In other words, referring again to FIG. 6, in the case of the data string from the graph L51 to the graph L53 illustrated in FIG. 8, RDc<0 and RDp>0 hold true, and thus the flag is set to "0", which is also read from the table illustrated in FIG. 6.

In a case where the data string is non-inverted, there is a zone that descends in a straight line from the graph L51 to the graph L53. That is, there is a zone in which zero is successive. Similarly to the case as described above, zero is successive from the clock time Tp1 to the clock time Tpc. In addition, the non-conversion of the data string at the time Tc allows zero to be successive from the clock time Tpc to the clock time Tc1. That is, in this case, the data from the clock time Tp1 to the clock time Tc1 is zero. In other words, further, in data of a few bits from the clock time Tp1 to the clock time Tc1, zero is successive.

The non-inversion of the data in this manner may also possibly deteriorate the run length. Even in such a case, the maximum value RLmax of the run length is set; in a case where the run length becomes larger than or equal to (greater than) the maximum value RLmax, the determination is overridden that the data is non-inverted in order to control the running disparity RD, and is changed to a determination that the data is to be inverted.

In the example illustrated in FIG. 8, in a case where the number of bits (run length RL) in which zero is successive from the clock time Tp1 to the clock time Tc1 is equal to or larger than the maximum value RLmax, the determination is changed to the effect that inversion is to be performed; thus, as a result, the accumulated value RD (data string) is obtained which changes from the graph L51 to the graph L52.

Therefore, because of the change from the graph L51 to the graph L52, the succession of zero is interrupted at the clock time Tpc, thus preventing the deterioration in the run length. In this manner, in a case where the running disparity RD is used to temporarily determine whether or not the data is to be inverted to process the data on the basis of results of the determination, determination is made as to whether or not the run length RL is deteriorated; in a case where the run length RL is deteriorated, the determination by the running disparity RD is changed.

Because such control prioritizes the run length RL, the running disparity RD may possibly be deteriorated. A degree to which the run length RL is prioritized, i.e., a value of the maximum value RLmax is able to be set in a system-dependent manner. For example, in a case where the decoder 12 has a high decoding capability, e.g., in a case where decoding is possible even when the run length RL is large, the value of the maximum value RLmax is able to be increased, and the priority of the run length RL is able to be decreased.

The description has been given here by exemplifying the case where zero is successive; however, similar processing is performed also in a case where one is successive.

<Concerning Processing of Encoder>

Figure 9:
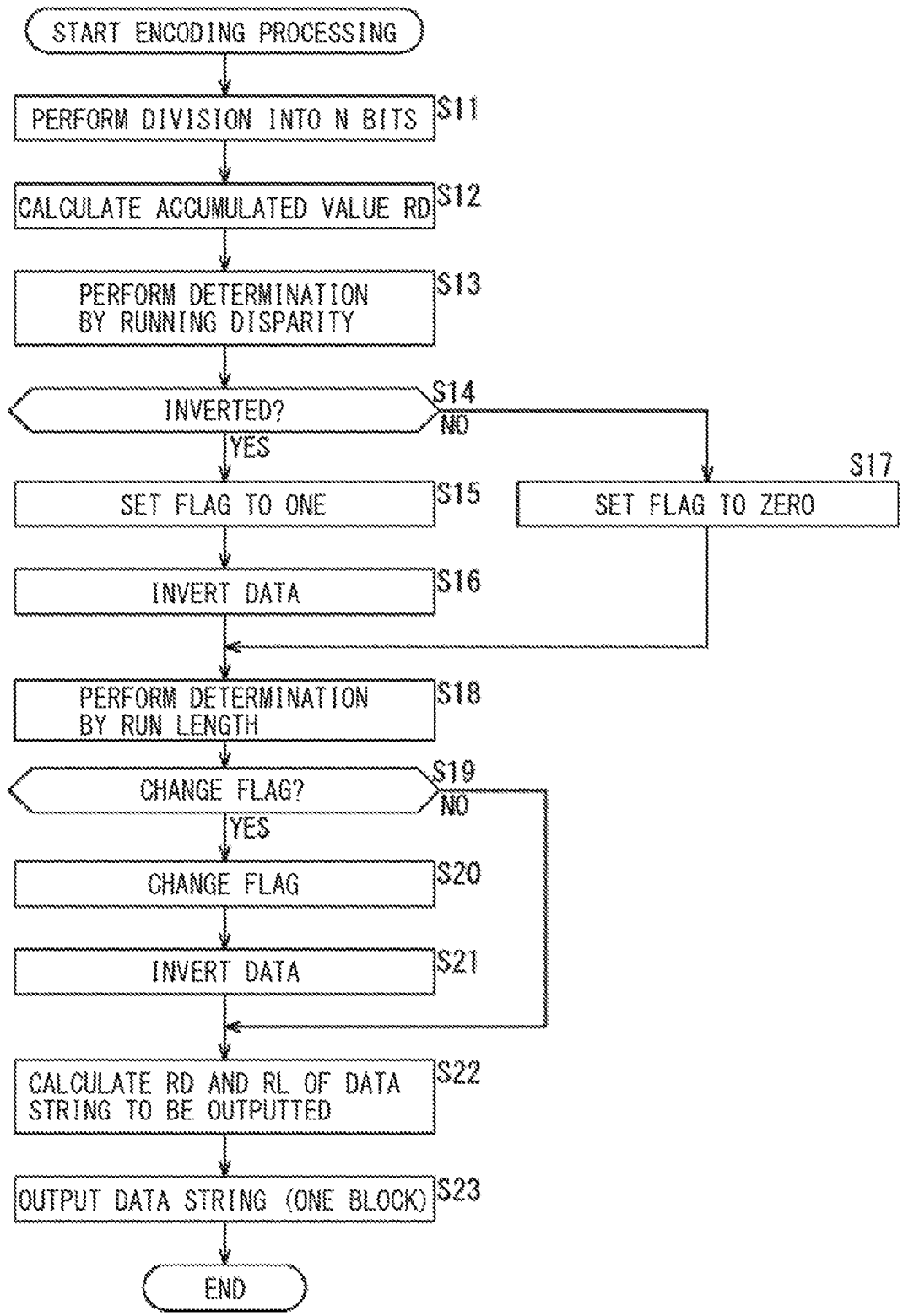
FIG. 9 is a flowchart that describes encoding processing.

Description is given of processing of the encoder 11 with reference to a flowchart of FIG. 9.

In step S11, the encoder 11 divides inputted data into N bits, and executes processing of step S12 and subsequent steps for each N bit. Here, description is given by exemplifying the case of N bits; however, processing is performed similarly also in a case where division into M bits is made.

In step S12, the bit check section 34 calculates the accumulated value RD of the N-bit data string being processed.

In step S13, the flag determination section 37 makes determination by the running disparity RD. This determination is made as described with reference to FIGS. 5 to 7, and therefore detailed description thereof is omitted.

In step S14, determination is made as to whether or not a result of the determination in step S13 is a determination to invert the data string. In a case where determination is made in step S14 that the result of the determination is that the data string is to be inverted, the processing proceeds to step S15.

In step S15, the flag is set to one. In step S16, the data string is inverted because of the flag being set to one, and the processing proceeds to step S18.

Meanwhile, in a case where determination is made in step S14 that the result of the determination is that the data string is not to be inverted, the processing proceeds to step S17. In step S17, the flag is set to one, and the processing proceeds to step S18.

In step S18, determination is made by the run length RL. This determination is made as described with reference to FIG. 8, and therefore detailed description thereof is omitted.

In step S19, determination is made as to whether or not a result of the determination in step S18 is a determination to change the flag (to override the determination by the running disparity RD). That is, after the determination by the running disparity is made, the determination by the run length is made again, and the determination by the running disparity is maintained, or a different result of the determination is produced.

In a case where determination is made in step S18 that the result of the determination is that the flag is to be changed, the processing proceeds to step S20. In step S20, the flag is changed. For example, in a case where the flag is set to one, the flag is changed to zero; in a case where the flag is set to zero, the flag is changed to one. In step S21, the data string is inverted by the change of the flag, and the processing proceeds to step S22.

Meanwhile, in a case where determination is made in step S18 that the result of the determination is that the flag is not to be changed, the processing proceeds to step S22.

In step S22, the running disparity RD and the run length RL in a data string of one block including the set flag are calculated. The running disparity RD and the run length RL calculated in step S22 are used as the running disparity RD and the run length RL at the time Tp described above.

In step S23, a data string (one block) including the flag is outputted as output data (encoded data) from the encoder 11.

In this manner, encoding processing is executed in the encoder 11. It is to be noted that the flowchart illustrated in FIG. 9 gives the example in which the inputted data is processed for each N-bit data. However, as illustrated in B of FIG. 2, in a case where encoding is performed with a different number of bits of N bits and M bits, processing performed with N bits in FIG. 9 is able to be performed appropriately with M bits.

<Concerning Processing of Decoder>

Figure 10:
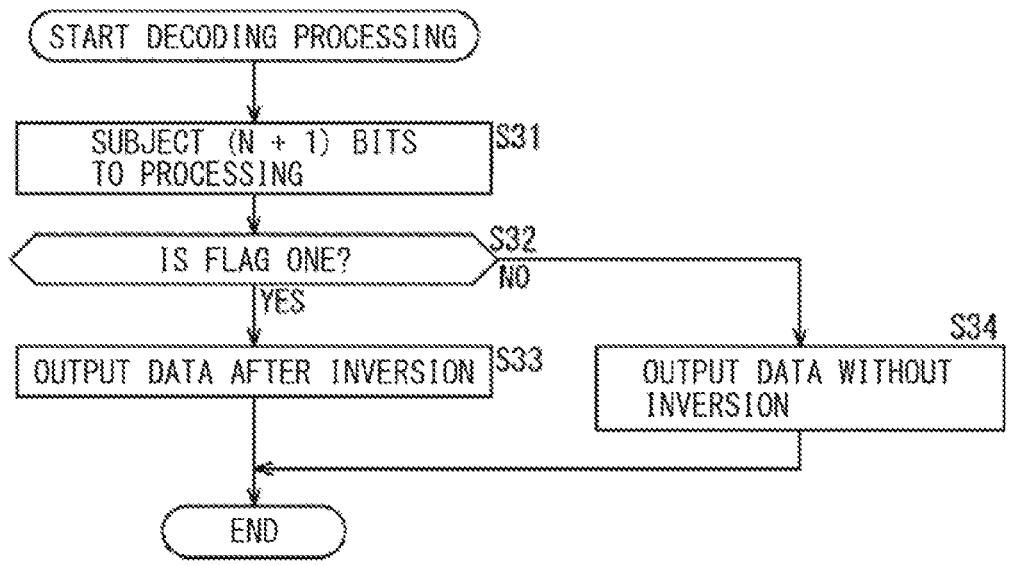
FIG. 10 is a flowchart that describes decoding processing.

Description is given of processing of the decoder 12 with reference to a flowchart of FIG. 10.

In step S31, the decoder 12 is to process (N+1) bits of inputted encoded data. It is to be noted that, as illustrated in B of FIG. 2, when there are both of cases where the number of pieces of data in one block is (N+1) bits and where the number of pieces of data in one block is (M+1) bits, it is sufficient that the processing is performed by the (N+1) bits or the (M+1) bits.

In step S32, the flag determination section 43 refers to a one-bit flag included in the one (N+1)-bit block to determine whether or not the flag is one, i.e., whether or not the data is inverted.

In step S32, in a case where the flag is determined to be one, the processing proceeds to step S33. In step S33, the selection section 42 selects the inverted data inputted via the inversion section 41 to output the selected data as a decoded result.

Meanwhile, in step S32, in a case where determination is made that the flag is not one, i.e., in a case where determination is made that the flag is zero and the data is non-inverted, the processing proceeds to step S34. In step S34, the selection section 42 selects data inputted without being passed through the inversion section 41 to output the selected data as a decoded result.

In this manner, the decoder 12 executes the decoding processing corresponding to the encoding processing performed in the encoder 11.

<Concerning Error Detection in Decoder>

As described above, the encoder 11 performs control to allow the running disparity RD to be closer to zero. This can be utilized to detect an error on the side of the decoder 12.

Even when the running disparity RD is controlled to be small on the side of the encoder 11, for example, occurrence of an error on a transmission path between the encoder 11 and the decoder 12 may possibly cause the running disparity RD of data received on the side of the decoder 12 to be large. In a case where the data received on the side of the decoder 12 is decoded, the running disparity RD of the decoded data is calculated, and the calculated value becomes larger (tends to be increased), it is possible to determine that the received data includes an error.

Figure 11:
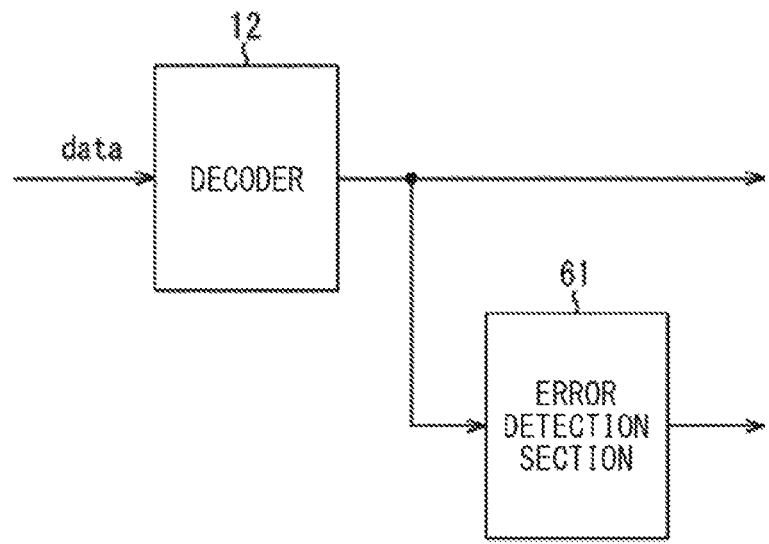
FIG. 11 is an explanatory diagram of a configuration of the decoder that performs error detection.

As illustrated in FIG. 11, it is possible to have a configuration in which the side of the decoder 12 is provided with an error detection section 61 to which an output from the decoder 12 is inputted, which calculates the running disparity RD, and which detects an error. The decoder 12 illustrated in FIG. 11 has an internal configuration that is similar to the configuration of the decoder 12 illustrated in FIG. 4. Decoded data is outputted from the decoder 12.

The error detection section 61 calculates the running disparity RD of decoded data supplied from the decoder 12. In a case where the calculated running disparity RD is large, the error detection section 61 determines that an error has occurred, and supplies an upper layer with information indicative of a possible error.

The upper layer is a layer that receives the data supplied from the decoder 12 and performs predetermined processing. In a case of acquiring the information indicative of possible error from the error detection section 61, such an upper layer processes the supplied data, assuming that there is a possible error. For example, processing with enhanced error correction processing or processing of discarding data with a possible error is performed.

The error detection section 61 determines that an error has occurred when the running disparity RD becomes larger. However, for example, it may be possible to set a predetermined threshold value to determine that an error has occurred in a case where the running disparity RD becomes larger than or equal to the threshold value. In addition, it is possible to compare the running disparity RD of data being processed and the running disparity RD of data having been processed prior to the data with each other to determine that an error has occurred in a case where a difference therebetween is larger than or equal to the predetermined threshold value.

In this manner, it is also possible for the decoding side to monitor the running disparity RD to thereby determine whether or not the received data possibly includes an error. In addition, the configuration to enable error detection on the decoding side and to respond to occurrence of an error makes it possible to improve reliability of received data decoded by the decoder 12.

<Concerning Improvement in Flag Reliability>

As described above, configuration is made to enable the side of the encoder 11 to invert or non-invert data and to enable the side of the decoder 12 to determine whether or not the data has been inverted by adding a flag. Suppose that an error occurs to cause the flag to be changed when data is supplied from the encoder 11 to the decoder 12, the side of the decoder 12 results in being unable to correctly perform decoding.

Therefore, description is given of a mechanism that enables the side of the decoder 12 to determine whether or not an error has occurred in the flag.

Figure 12:
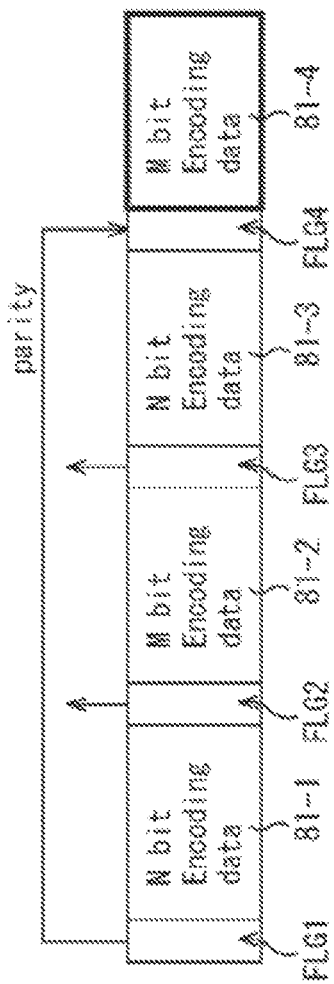
FIG. 12 is an explanatory diagram of a setting of the flag when performing error detection.
Figure 13:
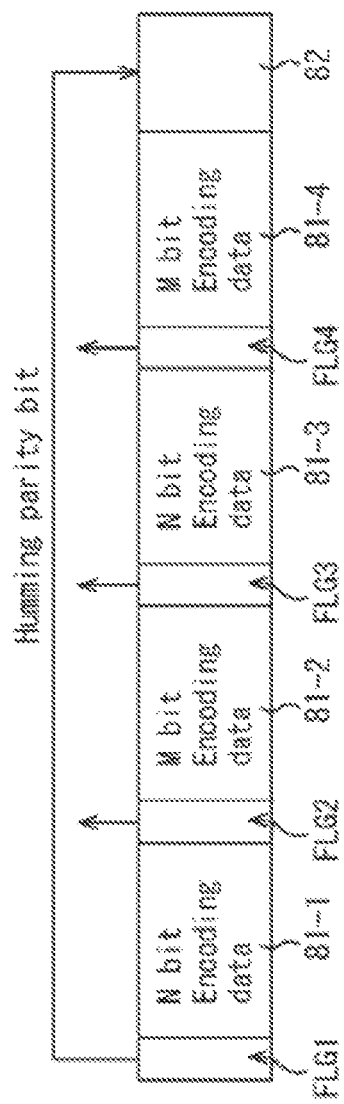
FIG. 13 is an explanatory diagram of a setting of the flag when performing error detection.

Description is given, with reference to FIGS. 12 and 13, by exemplifying a case where data to be encoded is divided into N-bit blocks and M-bit blocks for processing as illustrated in B of FIG. 2. Referring to FIG. 12, a flag of an N-bit block 81-1 is FLG1, a flag of an M-bit block 81-2 is FLG2, and a flag of an N-bit block 81-3 is FLG3.

A flag of an M-bit block 81-4 is FLG4, but the FLG4 is not used as a flag indicating whether or not data of the block 81-4 is inverted. In addition, data of the block 81-4 is a block in which no inversion processing is performed. In other words, the data of the block 81-4 is non-inversion data which is not subjected to the control of the running disparity RD or the run length RL.

The FLG4 is set as a result (parity) of calculation of exclusive OR (EXOR) of the FLG1, the FLG2 and the FLG3. Unlike the FLG1, the FLG2, and the FLG3, the FLG4 is added as a parity for these flags to the block 81-4.

FLG4=FLG1 xor FLG2 xor FLG3

The receiving side performs an operation of exclusive OR of the FLG1 to the FLG4 to determine that there is no error in a case where the value is zero and to determine that there is an error in a case where the value is one.

FLG1 xor FLG2 xor FLG3 xor FLG4=0 Determination that there is no error

FLG1 xor FLG2 xor FLG3 xor FLG4=1 Determination that there is an error

In this manner, the decoder 12 (receiving side) is able to determine whether all of the FLG1, the FLG2, the FLG3, and the FLG4 are correct, or whether any of them is incorrect. In a case where the flag is determined to include an error, an upper layer than the decoder 12 is supplied with information indicative of a possible error. In a case of receiving information as to whether or not there is an error outputted from the decoder 12, the upper layer processes supplied data, assuming that there is a possible error. For example, processing with enhanced error correction processing or processing of discarding data with a possible error is performed.

The example illustrated in FIG. 12 is an example in which a flag (FLG4) as one parity is included in each of the four blocks 81. The number of blocks to include the parity may be set in a system-dependent manner, or may be changed appropriately depending on a state of a transmission path by monitoring the state of the transmission path.

In a case where more parities are inserted, there is a possibility that a block in which the running disparity RD is not controlled (a block corresponding to the block 81-4 in the example illustrated in FIG. 12), i.e., a block in which data is determined to be inverted in order to prevent deterioration in the running disparity RD may also be increased as a block to be processed as non-inversion.

In a case where less parities are inserted, occurrence of an error causes more undefined flags. In a case where the flag is undefined, there is a possibility that data inside the block to which such a flag is added may also be undefined, resulting in an increase in the amount of data to be handled as an error.

The number of blocks into which the parity is to be inserted may also be set in consideration of the above.

In a case where encoding is performed by dividing the data into the N-bit block and the M-bit block, the total of two blocks of one block of the N bit and one block of the M bit is used as one processing unit to set, for each numerical processing unit, a flag of the last block of the numerical processing unit as a parity. FIG. 12 exemplifies a case of a two-processing unit. In addition, as illustrated in A of FIG. 2, in a case where the encoding is performed with only an N-bit block, at least two or more blocks are used as one processing unit to set a flag of the last block of the processing unit as a parity.

When setting the number of blocks into which the parity is inserted, the number of the blocks are set in consideration of the processing unit as well.

It is to be noted that, as for the example illustrated in FIG. 12, description has been given by exemplifying the case where the data to be encoded is divided into the N-bit block and the M-bit block for processing as illustrated in B of FIG. 2; however, it is also possible to apply to the case where the data to be encoded is divided into N-bit blocks for processing as illustrated in A of FIG. 2.

FIG. 13 illustrates another configuration of data to determine whether or not there is an error in a flag. Similarly to the case illustrated in FIG. 12, FIG. 13 also illustrates an example in which data for error detection is inserted into each of the four blocks 81-1 to 81-4.

In the example illustrated in FIG. 13, a flag of the N-bit block 81-1 is the FLG1, a flag of the M-bit block 81-2 is the FLG2, a flag of the N-bit block 81-3 is the FLG3, and a flag of the M-bit block 81-4 is the FLG4.

After the blocks 81-1 to 81-4 are sequentially encoded and the FLG4 is added, the FLG1 to the FLG4 are subjected to hamming (humming) coding processing to calculate a parity bit (hamming result). This calculated parity bit 82 is added to the rear of the block 81-4 for transmission.

As illustrated in FIG. 13, in a case where the parity bit 82 is added to every four blocks 81-1 to 81-4, the parity bit 82 of three bits is generated and added to four bits of the FLG1, the FLG2, the FLG3, and the FLG4. In this occasion, it may be possible to use a (7, 4, 3) Hamming code as a Hamming code.

The Hamming code given here is one example, and another Hamming code may also be applied. For example, it may also be possible to apply a (8, 4, 4) Hamming code in which the parity bit 82 of four bits is generated for the four bits of the FLG1, the FLG2, the FLG3, and the FLG4.

The receiving side (decoder 12) receives the blocks 81-1 to 81-4 and the parity bit 82, and then performs Hamming decoding to thereby detect whether or not there is an error in the FLG1, the FLG2, the FLG3, and the FLG4. In this case, performing the Hamming decoding makes it possible to detect and correct an error in one bit (one flag) of any one of the FLG1, the FLG2, the FLG3, and the FLG4.

Although the description has been given here by exemplifying the case of using the Hamming coding or decoding, it may also be possible to apply error correction coding or decoding other than the Hamming coding or decoding. In addition, the description has been given here by exemplifying the case where the encoding is performed by dividing the data into the N-bit block and the M-bit block; however, it is also possible to apply to a case where encoding is performed by dividing the data into only the N-bit blocks.

In the case where the encoding is performed by dividing the data into the N-bit block and the M-bit block, the total of two blocks of one block of the N bit and one block of the M bit is used as one processing unit to add, for every two or more processing units (four or more blocks), the parity bit 82 to a rear of the last block of the processing unit. FIG. 12 exemplifies a case of the two-processing unit. In addition, as illustrated in A of FIG. 2, in a case where the encoding is performed with only an N-bit block, at least two or more blocks are used as one processing unit to add the parity bit 82 to the rear of the last block of the processing unit.

In a case where a number of parity bits 82 are inserted by means of the Hamming coding, it is possible to enhance tolerance to errors. However, the parity bit 82 requires three bits in the above-described example, thus leading to a possibility that the transmission efficiency may be deteriorated. In consideration of the above, it may also be possible to set the number of blocks (the number of processing units) into which the parity bit 82 is inserted in a system-dependent manner.

It is to be noted that, as for the example illustrated in FIG. 13, description has been given by exemplifying the case where the data to be encoded is divided into the N-bit block and the M-bit block for processing as illustrated in B of FIG. 2; however, it is also possible to apply to the case where the data to be encoded is divided into N-bit blocks for processing as illustrated in A of FIG. 2.

In addition, for example, N bits may be set to 32 bits. In a case where N=32 bits holds true and processing is performed for every four blocks as illustrated in FIG. 13, a 128-bit data string is to be processed. In a case where a one-bit flag is added to each of the four blocks for the 128-bit data string and further the parity bit 82 is set to four bits, a 136-bit data string is obtained. That is, in this case, it follows that the 128-bit data string is converted into the 136-bit data.

In this manner, a 128 b/136 b encoding scheme is also applicable to the present technology.

In this manner, enabling the receiving side to determine whether or not there is an error in the flag makes it possible to enhance reliability for encoding or decoding.

<Example of Another System Configuration>

Figure 14:
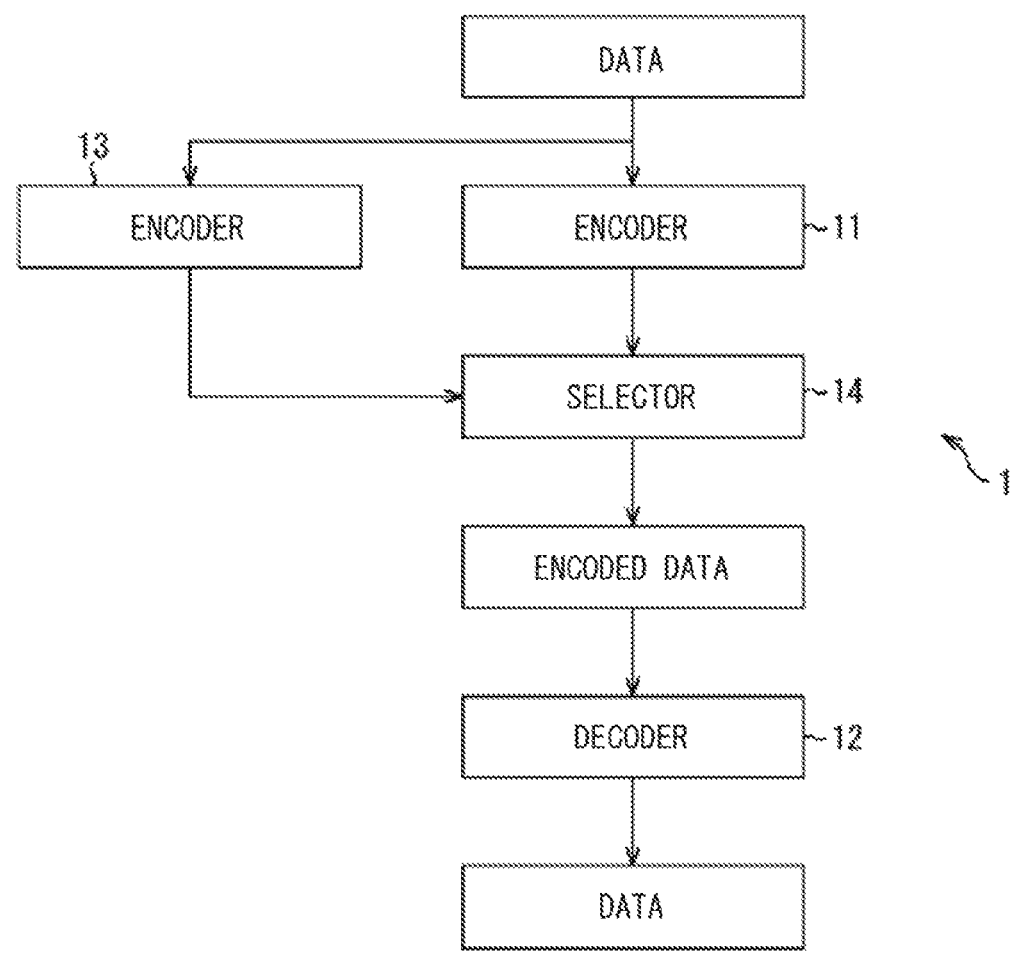
FIG. 14 illustrates a configuration of another embodiment of the data processing system to which the present technology is applied.

FIG. 14 illustrates another configuration example of the data processing system. The data processing system 1 illustrated in FIG. 14 and the data processing system 1 illustrated in FIG. 1 differ from each other in that an encoder 13 and a selector 14 are configured to be added, but are similar to each other in other respects.

The data processing system 1 illustrated in FIG. 14 includes the encoder 11 that performs encoding to invert the above-described data (hereinafter, appropriately referred to as inversion encoding), and the encoder 13 that performs encoding other than the inversion encoding. In addition, the selector 14 is provided that selects whether to transmit a data string encoded by the encoder 11 or to transmit a data string encoded by the encoder 13.

The encoder 13 performs encoding by applying, for example, the encoding scheme such as the 8 b/10 b encoding scheme, the 64 b/66 b encoding scheme, and the 64 b/67 b encoding scheme. It is to be noted that, although only one encoder 13 is illustrated in FIG. 14, a plurality of the encoders 13 may be provided in a manner corresponding to these encoding schemes.

The selector 14 switches between an output from the encoder 11 and an output from the encoder 13 for outputting. The selector 14 switches the output by a control signal supplied from an external circuit. In addition, the control signal may be a signal representing an encoding scheme selected (set) by a user.

It is to be noted that, as the data processing system 1 illustrated in FIG. 14, an example is given in which the selector 14 is provided at a position to select encoded data from the encoder 11 or the encoder 13, i.e., an example is given in which the selector 14 is provided in a subsequent stage of the encoder 11 and the encoder 13; however, it may also be possible to provide the selector 14 in a preceding stage of the encoder 11 and the encoder 13. That is, the selector 14 may be provided as a selection section that selects the encoder 11 or the encoder 13 as a supply destination of inputted data.

In addition, the selector 14 may be provided in each of the preceding stage and the subsequent stage of the encoder 11 and the encoder 13. The selector 14 provided in the preceding stage of the encoder 11 and the encoder 13 supplies the inputted data to the encoder 11 or the encoder 13 on the basis of the control signal from the outside.

The selector 14 provided in the subsequent stage of the encoder 11 and the encoder 13 functions as the selector 14 that selects an output from the encoder 11 or the encoder 13 set as the supply destination of the inputted data.

In addition, the encoder 11 or the encoder 13 which performs no encoding is also configured not to be supplied with power to suppress power consumption.

In addition, the encoder 11 and the decoder 12 may be provided with an adjustment section that adds or deletes data in accordance with a valid data amount of data to be inputted. The data to be added may be, for example, Pad Code. It is to be noted that the Pad Code is, for example, a symbol group to be inserted into payload data to make up for a difference between a pixel data band and a PHY transmission band in a case where the system illustrated in FIG. 14 is applied to an SLVS-EC specification described later, and is able to be used as data to add such data.

Such a configuration makes it possible to perform encoding using an encoding scheme corresponding to a decoding scheme supported by the receiving side of encoded data to generate and supply the encoded data.

In the data processing system 1 illustrated in FIG. 14, only one decoder is illustrated on the side of the decoder 12; however, a plurality of the decoders 12 may be provided, such as the decoder 12 corresponding to an encoding scheme of the encoder 11 and the decoder 12 corresponding to an encoding scheme of the encoder 13, similarly to the encoder side. In addition, a selector may be provided that supplies encoded data to one decoder 12 of the plurality of the decoders 12, or a selector may be provided that selects decoded data from one decoder 12 of the plurality of the decoders 12.

In this manner, also on the decoding side, a control signal for the selector may be inputted from an external circuit or may be inputted in accordance with a setting by the user in a case where the plurality of the decoders 12 and the selector are provided. In addition, when encoding is performed on the encoding side, an identifier indicating an encoding scheme may be added to the encoded data, and the identifier may be supplied to the selector.

<Concerning SLVS-EC Specification>

The above-described encoding and decoding, i.e., the system illustrated in FIG. 1 is applicable to a portion that performs encoding or decoding in the SLVS-EC (Scalable Low Voltage Signaling-Embedded Clock) specification described below. Therefore, description is given below of the SLVS-EC specification.

There is the SLVS-EC specification as a specification of an image sensor interface. A transmission system in the SLVS-EC specification is a system in which data is transmitted in a form of a clock being superimposed on transmitting side and in which the clock is reproduced to demodulate and decode the data on the receiving side.

<Configuration Example of Transmission System>

Figure 15:
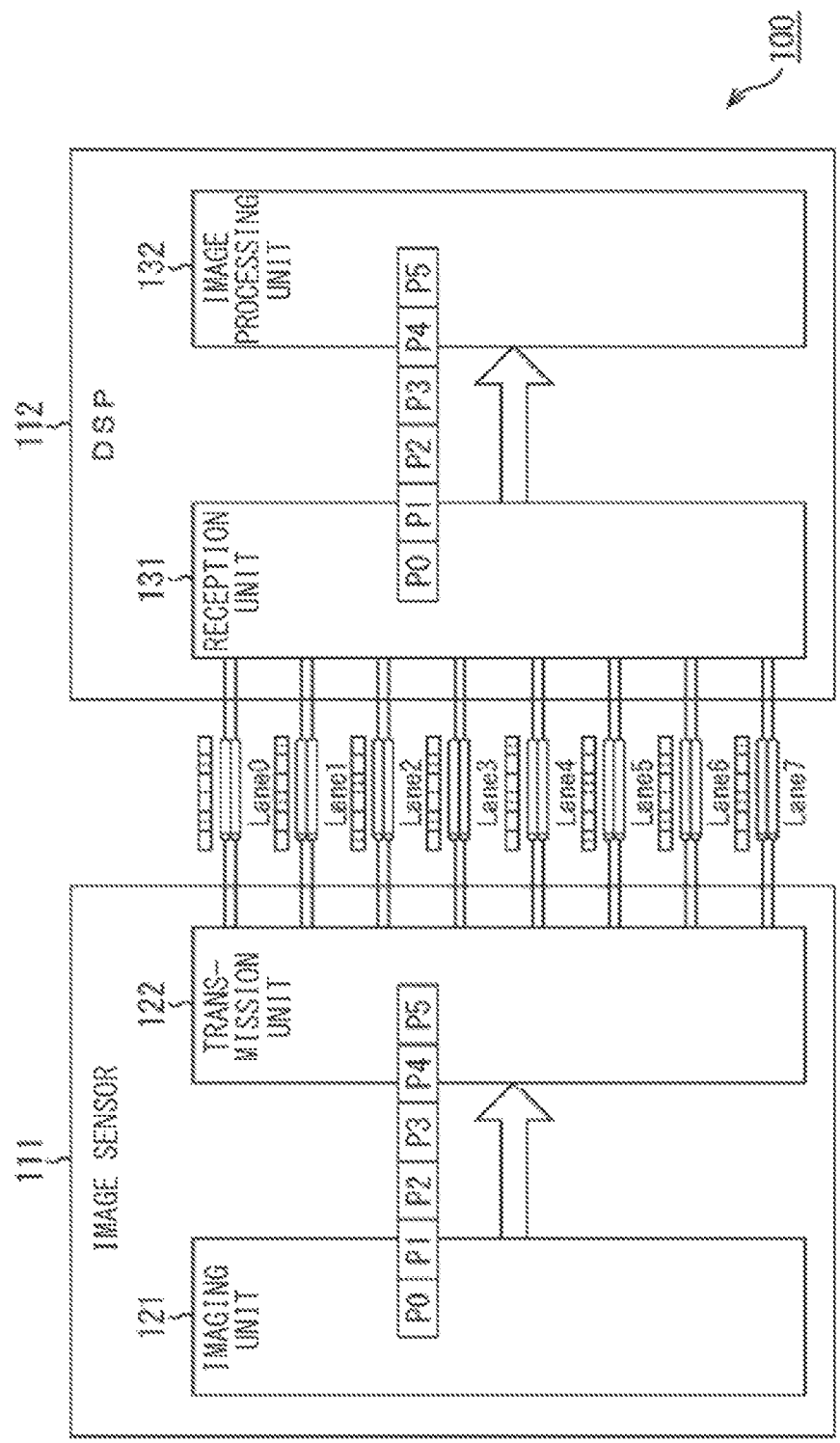
FIG. 15 illustrates a configuration example of a transmission system.

FIG. 15 illustrates a configuration example of the transmission system. A transmission system 100 of FIG. 15 includes an image sensor 111 and a DSP 112. The image sensor 111 and the DSP 112 include different LSIs (Large Scale Integrated Circuit), and are provided inside the same imaging apparatus having an imaging function, such as a digital camera or a mobile phone. The image sensor 111 includes an imaging unit 121 and one transmission unit 122, and the DSP 112 includes one reception unit 131 and an image processing unit 132.

The imaging unit 121 of the image sensor 111 includes an imaging element such as a CMOS (Complementary Metal Oxide Semiconductor), and performs photoelectric conversion of light received through a lens. In addition, the imaging unit 121 performs A/D conversion or the like of a signal obtained by the photoelectric conversion, and outputs, in order, pixel data included in a one-frame image to the transmission unit 122 by one-pixel data.

The transmission unit 122 assigns pieces of data of respective pixels supplied from the imaging unit 121 to a plurality of transmission paths in the order of being supplied from the imaging unit 121, for example, and transmits the data to the DSP 112 in parallel via the plurality of transmission paths. In the example of FIG. 15, eight transmission paths are used to transmit the pixel data. The transmission path between the image sensor 111 and the DSP 112 may be a wired transmission path or may be a wireless transmission path. Hereinafter, the transmission path between the image sensor 111 and the DSP 112 is referred to as a lane (Lane), appropriately.

The reception unit 131 of the DSP 112 receives the pixel data transmitted from the transmission unit 122 via the eight lanes, and outputs, in order, the pieces of data of the respective pixels to the image processing unit 132.

The image processing unit 132 generates a one-frame image on the basis of the pixel data supplied from the reception unit 131, and performs various types of image processing using the generated image. The image data transmitted from the image sensor 111 to the DSP 112 is raw data, and the image processing unit 132 performs various types of processing such as compression of image data, display of an image, and recording of the image data on a recording medium.

<Frame Format>

Figure 16:
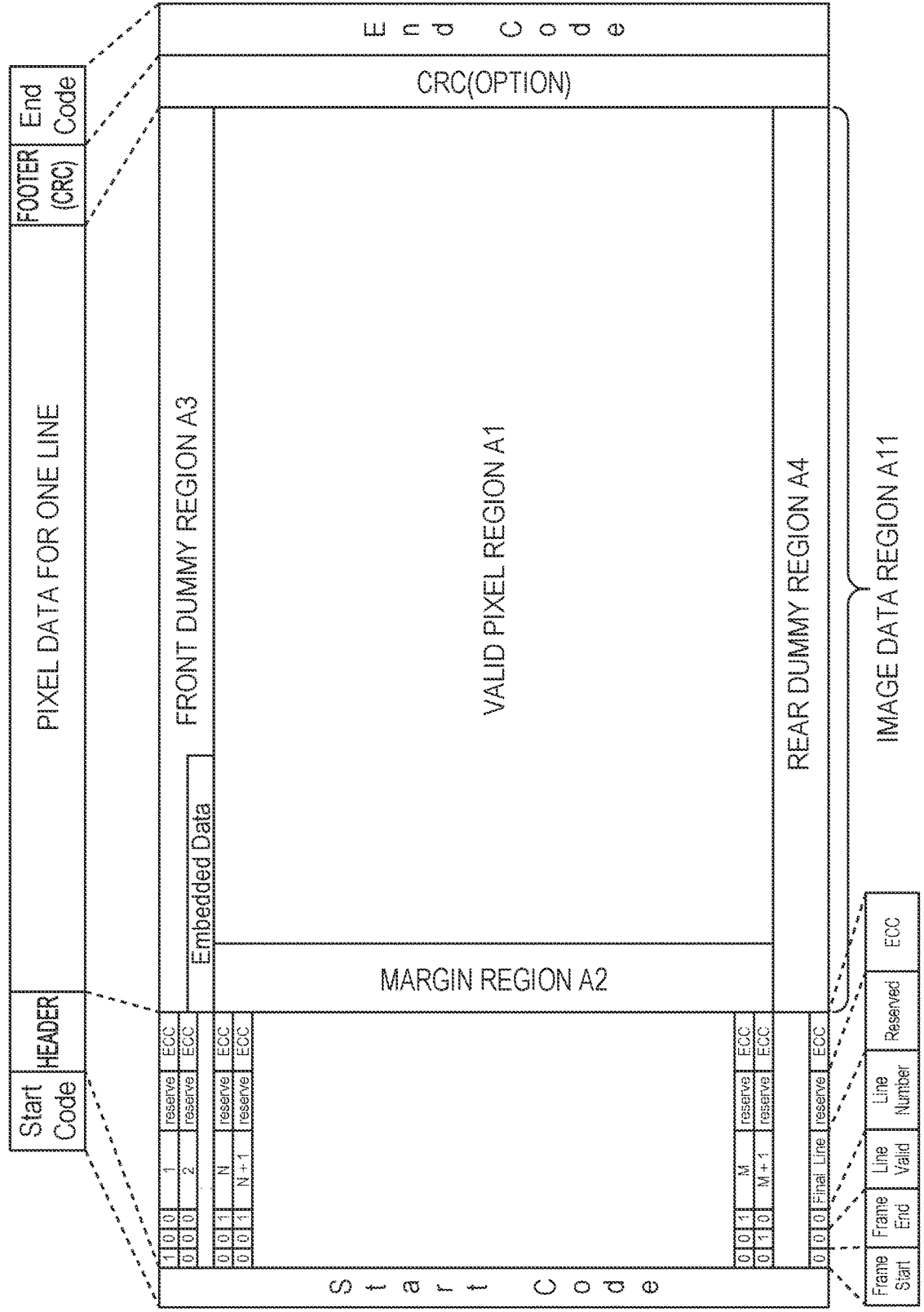
FIG. 16 illustrates an example of a frame format.

FIG. 16 illustrates an example of a format used to transmit the one-frame image data between the image sensor 111 and the DSP 112.

A valid pixel region A1 is a region of valid pixels of the one-frame image captured by the imaging unit 121. On left side of the valid pixel region A1, a margin region A2 is set in which the number of pixels in a vertical direction is the same as the number of pixels in the vertical direction of the valid pixel region A1.

On upper side of the valid pixel region A1, a front dummy region A3 is set in which the number of pixels in a horizontal direction is the same as the total number of pixels in the horizontal direction of the valid pixel region A1 and the margin region A2. In the example of FIG. 16, Embedded Data is inserted into the front dummy region A3. The Embedded Data includes information on set values related to the imaging by the imaging unit 121, such as shutter speed, aperture, and gain. The Embedded Data may also be inserted into a rear dummy region A4.

On lower side of the valid pixel region A1, the rear dummy region A4 is set in which the number of pixels in the horizontal direction is the same as the total number of pixels in the horizontal direction of the valid pixel region A1 and the margin region A2.

The valid pixel region A1, the margin region A2, the front dummy region A3, and the rear dummy region A4 are included in an image data region A11.

A header is added to a front of each line included in the image data region A11, and Start Code is added to a front of the header. In addition, a footer is optionally added to a rear of each line included in the image data region A11, and a later-described control code, such as End Code, is added to a rear of the footer. In a case where no footer is added, a control code such as the End Code is added to the rear of each line included in the image data region A11.

Every time a one-frame image captured by the imaging unit 121 is transmitted from the image sensor 111 to the DSP 112, the entire data of the format illustrated in FIG. 16 is transmitted as transmission data.

An upper band in FIG. 16 indicates a structure of a packet used for the transmission of the transmission data illustrated on the lower side. Assume that the arrangement of pixels in the horizontal direction is a line, data of pixels included in one line of the image data region A11 is stored in the payload of the packet. The transmission of the entire one-frame image data is to be performed using packets of the number equal to or more than the number of pixels in the vertical direction of the image data region A11.

One packet is formed by adding a header and a footer to the payload in which pixel data for one line is stored. As described later in detail, the header includes additional information on the pixel data stored in the payload, such as Frame Start, Frame End, Line Valid, Line Number, and ECC. At least the Start Code and the End Code, which are control codes, are added to each packet.

In this manner, employing a format to transmit pixel data included in a one-frame image for each line makes it possible to transmit additional information such as a header and control codes such as the Start Code and the End Code during a blanking period for each line.

<Configuration of Transmission Unit 122 and Reception Unit 131>

Figure 17:
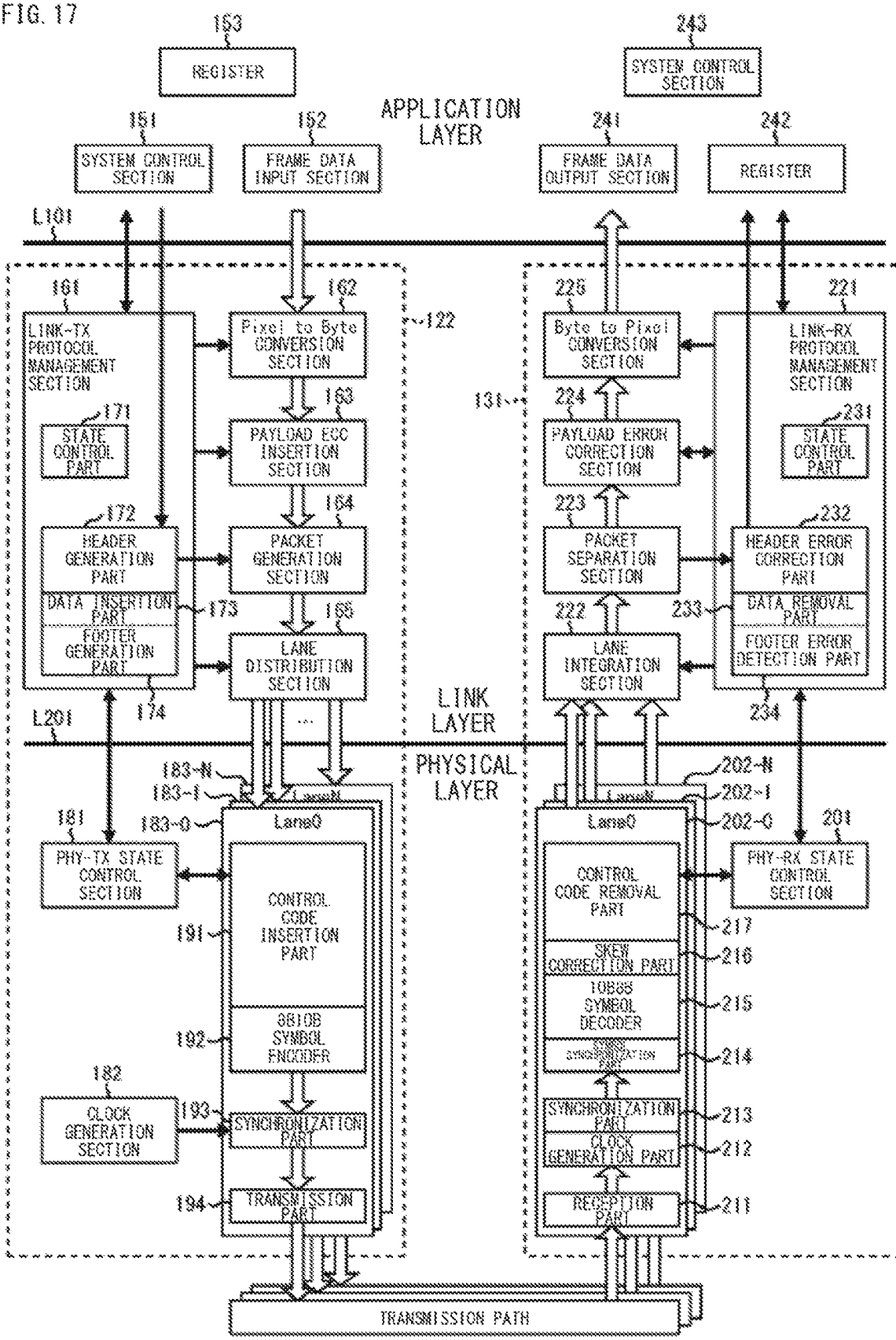
FIG. 17 illustrates a configuration example of a transmission unit and a reception unit.

FIG. 17 illustrates a configuration example of the transmission unit 122 and the reception unit 131.

The configuration surrounded by a broken line on left side of FIG. 17 is a configuration of the transmission unit 122, and the configuration surrounded by a broken line on right side is the configuration of the reception unit 131. The transmission unit 122 and the reception unit 131 each include a link layer configuration and a physical layer configuration. The configuration illustrated on upper side of a solid line L201 is the link layer configuration, and the configuration illustrated on lower side of the solid line L201 is the physical layer configuration.

It is to be noted that the configuration illustrated above a solid line L101 is an application layer configuration. A system control section 151, a frame data input section 152, and a register 153 are implemented in the imaging unit 121. The system control section 151 communicates with a LINK-TX protocol management section 161 of the transmission unit 122 to control transmission of image data, for example, by providing information concerning a frame format. The frame data input section 152 performs imaging in accordance with an instruction or the like by a user to supply a Pixel to Byte conversion section 162 of the transmission unit 122 with data of respective pixels included in an image obtained by performing the imaging. The register 153 stores information such as the number of Lanes and the number of bits of Pixel to Byte conversion. Transmission processing of the image data is performed in accordance with the information stored in the register 153.

In addition, a frame data output section 241, a register 242, and a system control section 243 of the application layer configuration are implemented in the image processing unit 132. The frame data output section 241 generates and outputs a one-frame image on the basis of pixel data of each line supplied from the reception unit 131. The image outputted from the frame data output section 241 is used to perform various types of processing. The register 242 stores various set values related to reception of the image data, such as the number of Lanes and the number of bits of Byte to Pixel conversion. Image data reception processing is performed in accordance with the information stored in the register 242. The system control section 243 communicates with a LINK-RX protocol management section 221 to control sequences such as mode changes.

<Link Layer Configuration of Transmission Unit 122>

First, description is given of a link layer configuration of the transmission unit 122.

The transmission unit 122 includes, as the link layer configuration, the LINK-TX protocol management section 161, the Pixel to Byte conversion section 162, a payload ECC insertion section 163, a packet generation section 164, and a lane distribution section 165. The LINK-TX protocol management section 161 includes a state control part 171, a header generation part 172, a data insertion part 173, and a footer generation part 174.

The state control part 171 of the LINK-TX protocol management section 161 manages a state of the link layer of the transmission unit 122.

The header generation part 172 generates a header to be added to the payload in which the pixel data for one line is stored, and outputs the generated header to the packet generation section 164.

Figure 18:
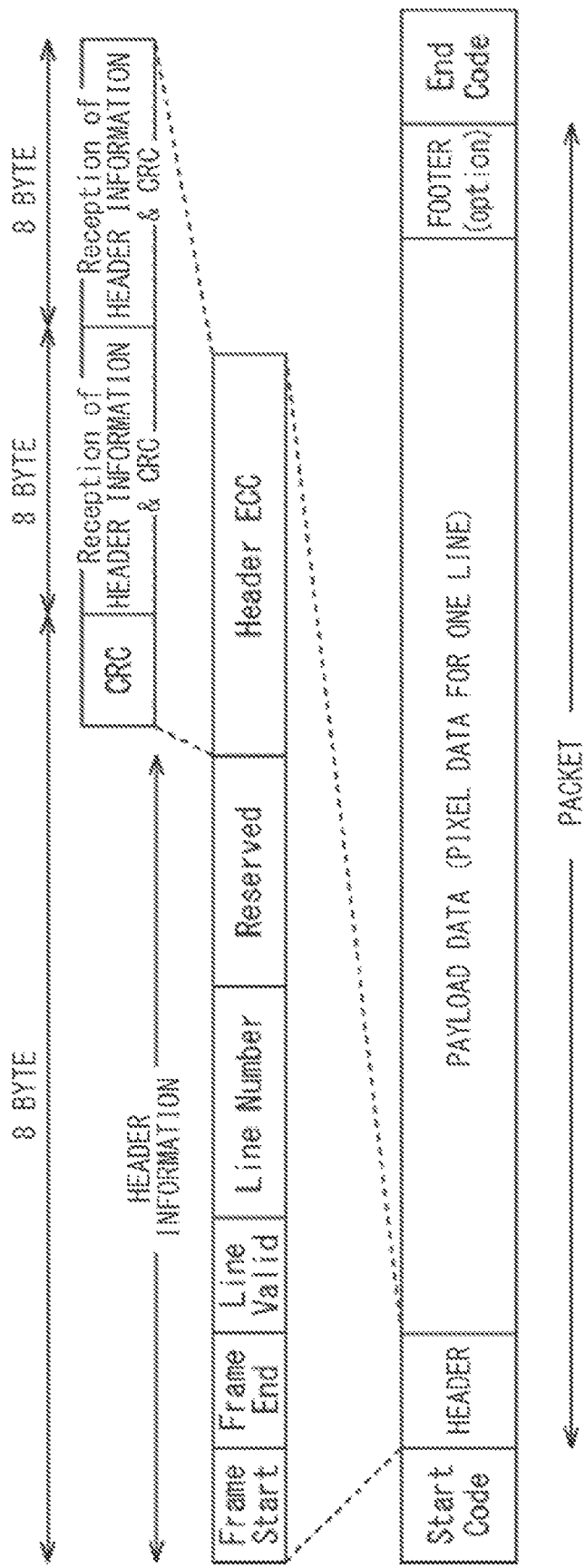
FIG. 18 illustrates a header structure.

FIG. 18 illustrates a structure of the header generated by the header generation part 172.

As described above, the entire one packet includes a header and payload data which is pixel data for one line. A footer may be added to the packet in some cases. The header includes header information and Header ECC.

The header information includes the Frame Start, the Frame End, the Line Valid, the Line Number, and Reserved. FIG. 19 illustrates contents of each information and information amount thereof.

The Frame Start is one-bit information indicating the head of a frame. A value of one is set for the Frame Start of the header of the packet used for transmission of the pixel data of the first line of the image data region A11 of FIG. 16, and a value of zero is set for the Frame Start of the header of the packet used for transmission of the pixel data of another line.

The Frame End is one-bit information indicating the end of the frame. A value of one is set for the Frame End of the header of the packet including in the payload the pixel data of the end line of the valid pixel region A1, and a value of zero is set for the Frame End of the header of the packet used for transmission of the pixel data of another line.

The Frame Start and the Frame End constitute frame information which is information concerning the frame.

The Line Valid is one-bit information indicating whether or not the line of pixel data stored in the payload is a valid pixel line. A value of one is set for the Line Valid of the header of the packet used for transmission of the pixel data of the line inside the valid pixel region A1, and a value of zero is set for the Line Valid of the header of the packet used for transmission of the pixel data of another line.

The Line Number is a 13-bit information indicating the line number of a line including the pixel data stored in the payload.

The Line Valid and the Line Number constitute line information which is information concerning the line.

The Reserved is a 32-bit region for extension. The data amount of the entire header information is six bytes.

As illustrated in FIG. 18, the Header ECC arranged subsequent to the header information includes a CRC (Cyclic Redundancy Check) code, which is a two-byte error-detecting code, calculated on the basis of the six-byte header information. In addition, the Header ECC includes, subsequent to the CRC code, two pieces of information which is the same as 8-byte information of a set of the header information and the CRC code.

That is, the header of one packet includes the same three sets of the header information and the CRC code. The data amount of the entire header totals to 24 bytes, of eight bytes of the first set of the header information and the CRC code, eight bytes of the second set of the header information and the CRC codes, and eight bytes of the third set of the header information and the CRC code.

FIG. 20 illustrates an example of an 8-byte bit array included in one set of the header information and the CRC code.

A byte H7, which is the first one byte of the eight bytes included in the header, includes, in order from the first bit, each one bit of the Frame Start, the Frame End, and the Line Valid and the first to fifth bits of the 13 bits of the Line Number. In addition, a byte H6, which is the second one byte, includes sixth to thirteenth bits of the 13 bits of the Line Number.

A byte H5, which is the third one byte, to a byte H2, which is the sixth one byte, constitute the Reserved. A byte H1, which is the seventh one byte, and a byte H0, which is the eighth one byte, include respective bits of the CRC codes.

Returning to the description for FIG. 17, the header generation part 172 generates the header information under the control of the system control section 151. For example, information indicating the line number of pixel data outputted by the frame data input section 152 and information indicating the head and the end of the frame are supplied from the system control section 151.

In addition, the header generation part 172 applies the header information to a generator polynomial to calculate the CRC code. The generator polynomial of the CRC code to be added to the header information is represented, for example, by the following expression (1).

$$CRC16 = X^{16} + X^{15} + X^2 + 1 \tag{1}$$

The header generation part 172 adds the CRC code to the header information to thereby generate a set of the header information and the CRC code, and repeatedly arranges the same three sets of the header information and the CRC code to thereby generate the header. The header generation part 172 outputs the generated header to the packet generation section 164.

The data insertion part 173 generates data used for stuffing (stuffing), and outputs the generated data to the Pixel to Byte conversion section 162 and the lane distribution section 165. Payload stuffing data, which is stuffing data supplied to the Pixel to Byte conversion section 162, is added to pixel data after Pixel to Byte conversion, and is used for adjustment of the data amount of the pixel data stored in the payload. In addition, lane stuffing data, which is stuffing data supplied to the lane distribution section 165, is added to data after lane assignment, and is used for adjustment of the amount of data between lanes.

The footer generation part 174 appropriately applies payload data to the generator polynomial under the control of the system control section 151 to calculate a 32-bit CRC code, and outputs the calculated CRC code as a footer to the packet generation section 164. The generator polynomial of the CRC code to be added as a footer is represented, for example, by the following expression (2).

$$CRC32=X^{32}+X^{31}+X^4+X^3+X+1 \quad (2)$$

The Pixel to Byte conversion section 162 acquires the pixel data supplied from the frame data input section 152, and performs Pixel to Byte conversion to convert data of each pixel into data in one byte unit. For example, pixel values (RGB) of each pixel of an image captured by the imaging unit 121 are represented by any number of bits of 8 bits, 10 bits, 12 bits, 14 bits, and 16 bits.

Figure 21:
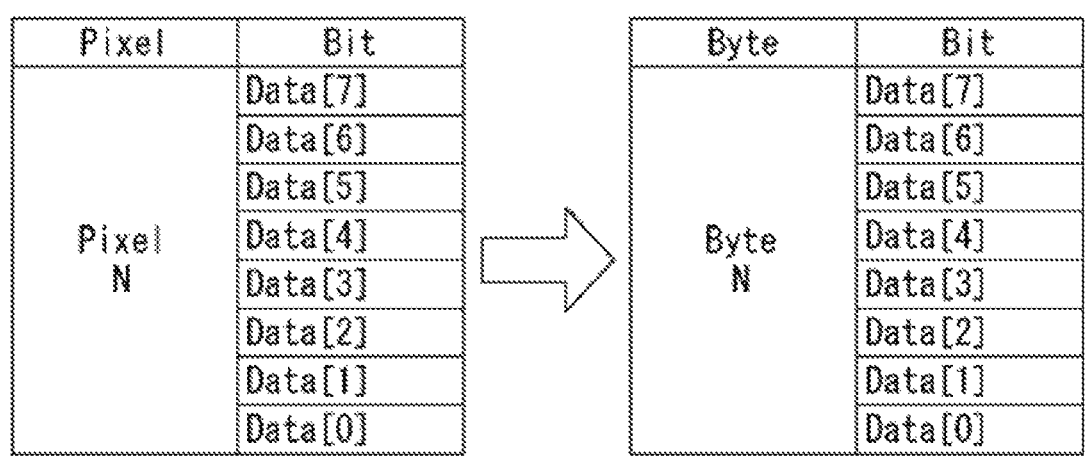
FIG. 21 illustrates an example of Pixel to Byte conversion in a case where pixel values of each pixel are represented by 8 bits.

FIG. 21 illustrates an example of Pixel to Byte conversion in a case where pixel values of each pixel are represented by 8 bits.

Data [0] denotes LSB, and Data [7] having the largest number denotes MSB. In this case, 8 bits of Data [7] to [0] representing pixel values of a pixel N are converted into a Byte N including Data [7] to [0], as indicated by an open arrow. In a case where the pixel values of the pixel are represented by 8 bits, the number of data in a byte unit after the Pixel to Byte conversion is the same as the number of pixels.

Figure 22:
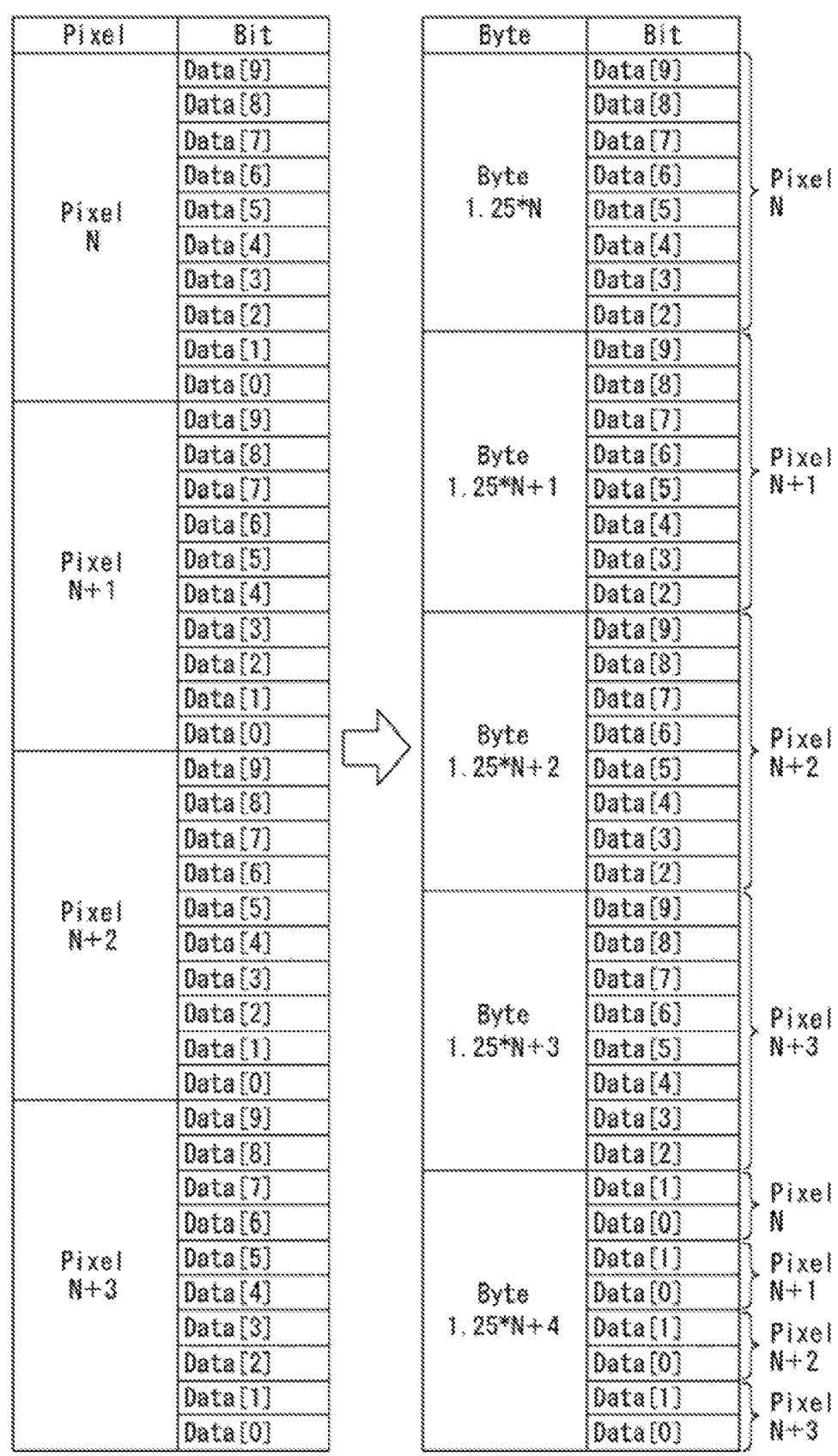
FIG. 22 illustrates an example of Pixel to Byte conversion in a case where pixel values of each pixel are represented by 10 bits.

FIG. 22 illustrates an example of the Pixel to Byte conversion in a case where pixel values of each pixel are represented by 10 bits.

In this case, 10 bits of Data [9] to [0] representing pixel values of the pixel N are converted into Byte 1.25*N including Data [9] to [2].

Likewise, also for pixels N+1 to N+3, 10 bits of Data [9] to [0] representing respective pixel values are converted into Byte 1.25*N+1 to Byte 1.25*N+3 each including Data [9] to [2]. In addition, Data [1] and Data [0], which are lower bits of the pixels N to N+3, are collected and converted into Byte 1.25*N+4. In a case where pixel values of each pixel are represented by 10 bits, the number of data in a byte unit after the Pixel to Byte conversion is 1.25 times the number of the pixels.

Figure 23:
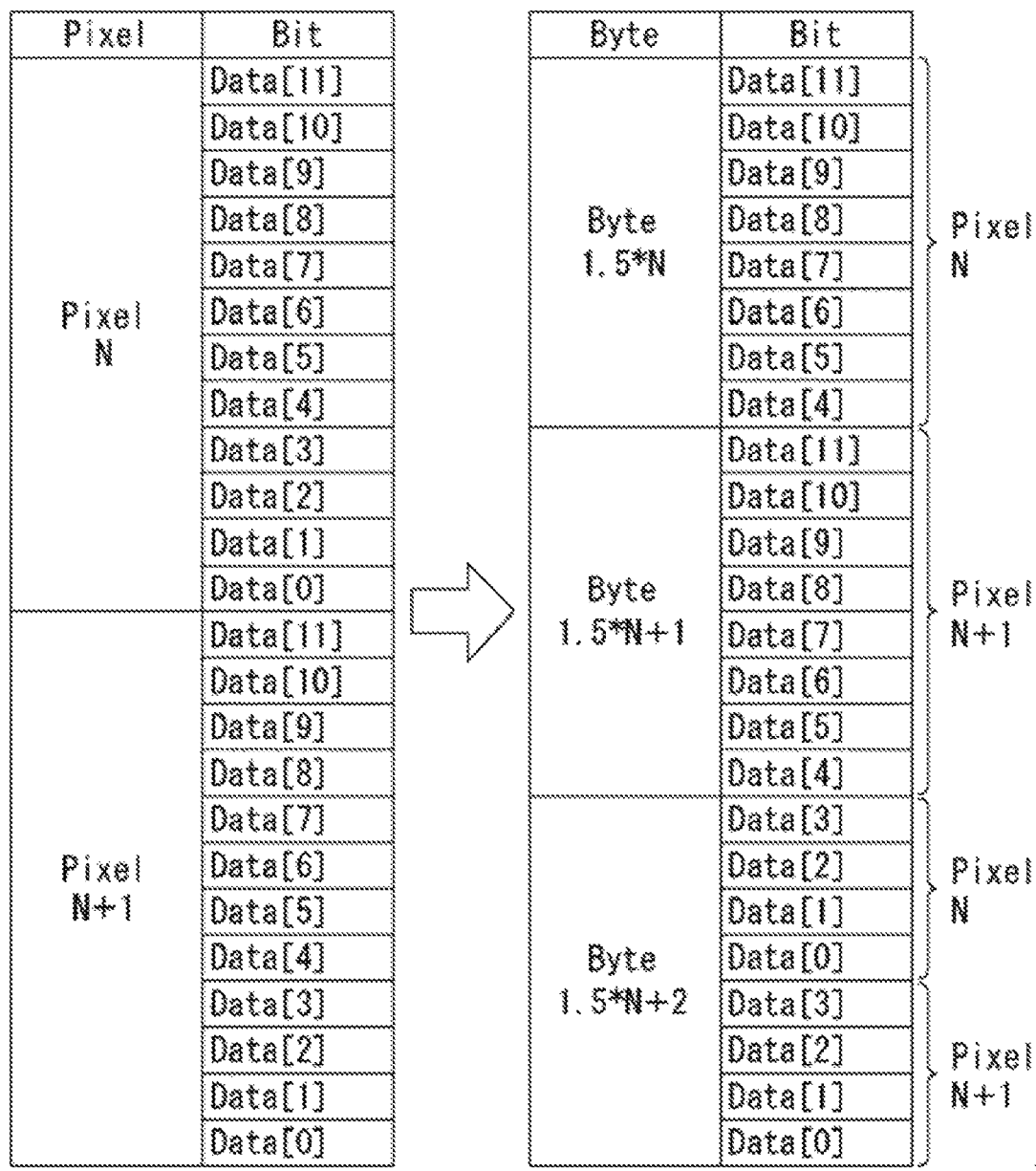
FIG. 23 illustrates an example of Pixel to Byte conversion in a case where pixel values of each pixel are represented by 12 bits.

FIG. 23 illustrates an example of Pixel to Byte conversion in a case where pixel values of each pixel are represented by 12 bits.

In this case, 12 bits of Data [11] to [0] representing pixel values of the pixel N are converted into Byte 1.5*N including Data [11] to [4].

Likewise, also for the pixel N+1, 12 bits of Data [11] to [0] representing pixel values of the pixel N+1 are converted into Byte 1.5*N+1 including Data [11] to [4]. In addition, Data [3] to [0], which are lower bits of the pixel N and the pixel N+1, are collected and converted into Byte 1.5*N+2. In a case where pixel values of each pixel are represented by 12 bits, the number of data in a byte unit after the Pixel to Byte conversion is 1.5 times the number of the pixels.

Figure 24:
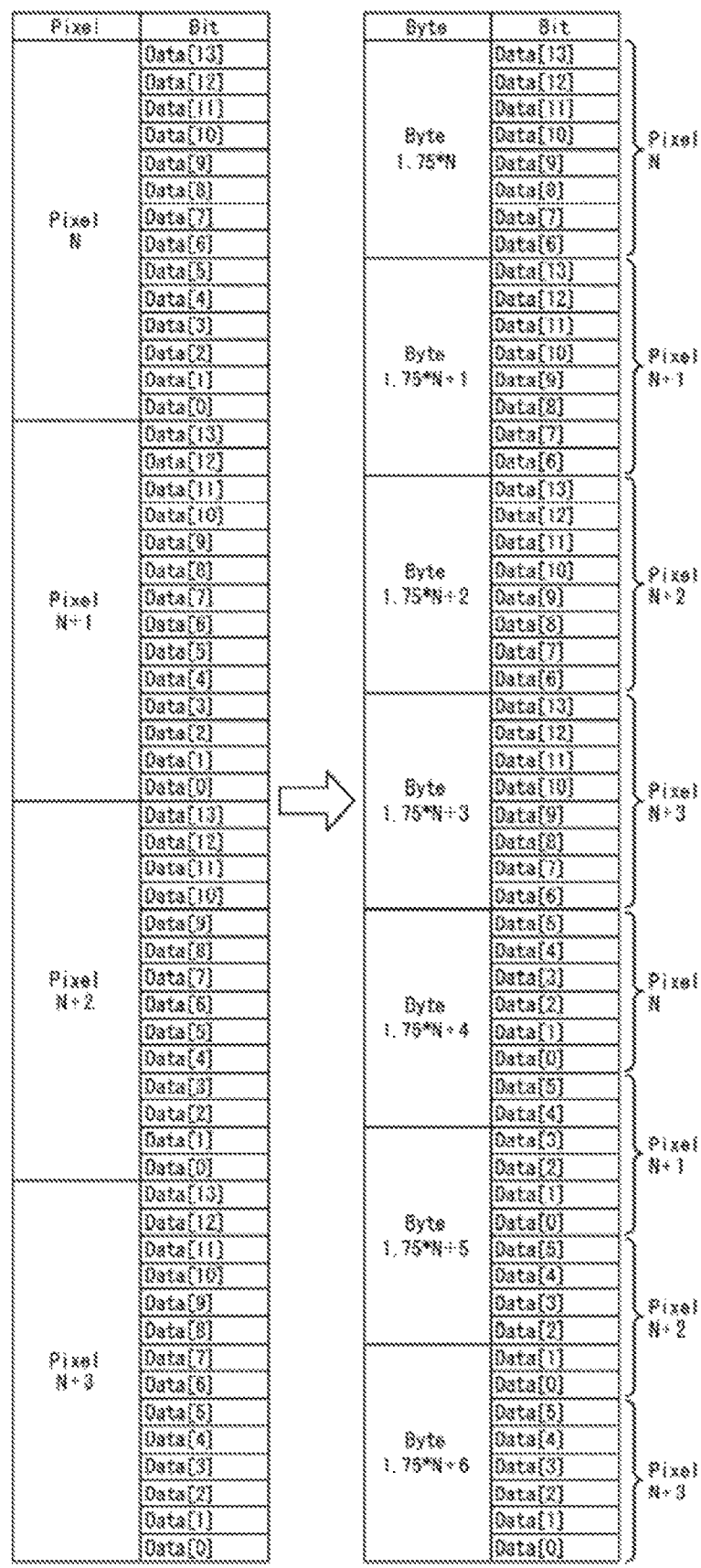
FIG. 24 illustrates an example of Pixel to Byte conversion in a case where pixel values of each pixel are represented by 14 bits.

FIG. 24 illustrates an example of Pixel to Byte conversion in a case where pixel values of each pixel are represented by 14 bits.

In this case, 14 bits of Data [13] to [0] representing pixel values of the pixel N are converted into Byte 1.75*N including Data [13] to [6].

Likewise, also for pixels N+1 to N+3, 14 bits of Data [13] to [0] representing respective pixel values are converted into Byte 1.75*N+1 to Byte 1.75*N+3 each including Data [13] to [6]. In addition, remaining bits of the bits of the pixels N to N+3 are collected in order from the lower bits, and, for example, Data [5] to [0], which are bits of the pixel N, and Data [5] and [4], which are bits of the pixel N+1, are converted into Byte 1.75*N+4.

Likewise, Data [3] to [0], which are bits of the pixel N+1, and Data [5] to [2], which are bits of a pixel N+2, are converted into Byte 1.75*N+5. Data [1] and [0], which are bits of the pixel N+2, and Data [5] to [0], which are bits of the pixel N+3, are converted into Byte 1.75*N+6. In a case where pixel values of each pixel are represented by 14 bits, the number of data in a byte unit after the Pixel to Byte conversion is 1.75 times the number of the pixels.

Figure 25:
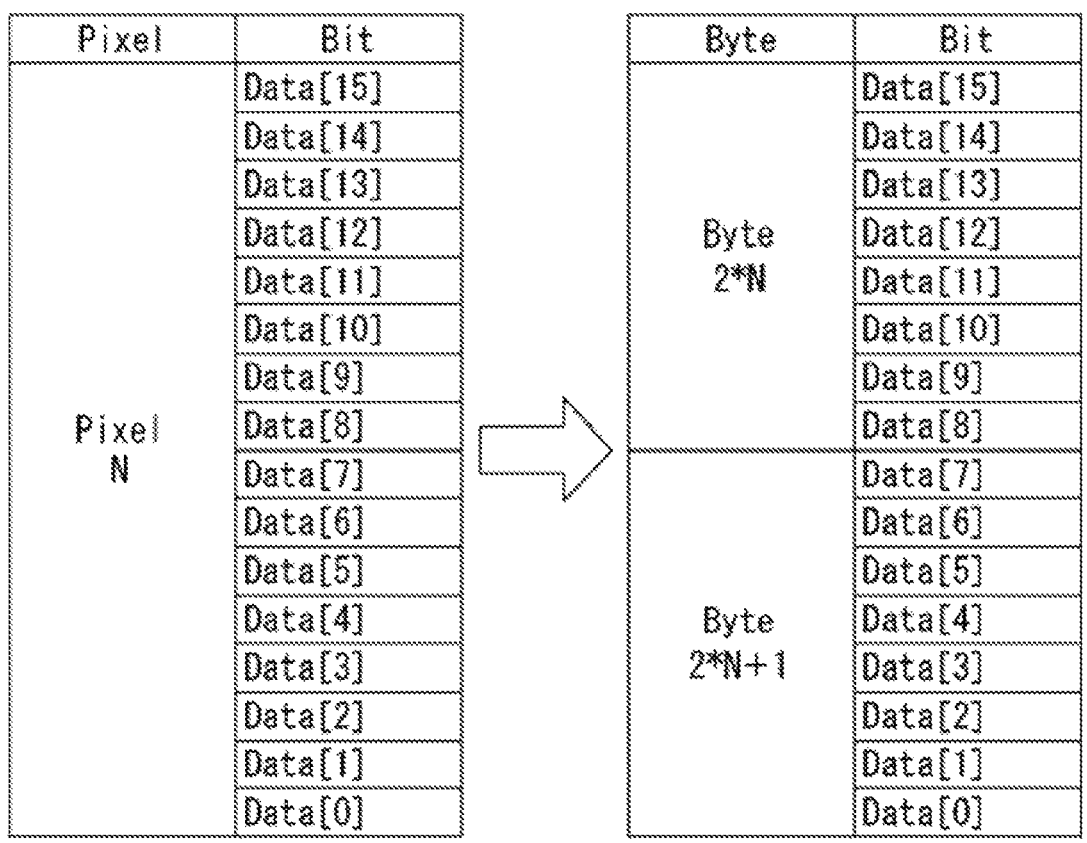
FIG. 25 illustrates an example of Pixel to Byte conversion in a case where pixel values of each pixel are represented by 16 bits.

FIG. 25 illustrates an example of Pixel to Byte conversion in a case where pixel values of each pixel are represented by 16 bits.

In this case, 16 bits of Data [15] to [0], representing pixel values of the pixel N, are converted into Byte 2*N including Data [15] to [8] and Byte 2*N+1 including Data [7] to [0]. In a case where pixel values of each pixel are represented by 16 bits, the number of data in a byte unit after the Pixel to Byte conversion is twice the number of pixels.

The Pixel to Byte conversion section 162 of FIG. 17 subjects each pixel to such Pixel to Byte conversion in order starting from the pixel at the left end of the line, for example. In addition, the Pixel to byte conversion section 162 adds payload stuffing data supplied from the data insertion part 173 to the pixel data in a byte unit obtained by the Pixel to Byte conversion to thereby generate payload data, and outputs the generated payload data to the payload ECC insertion section 163.

Figure 26:
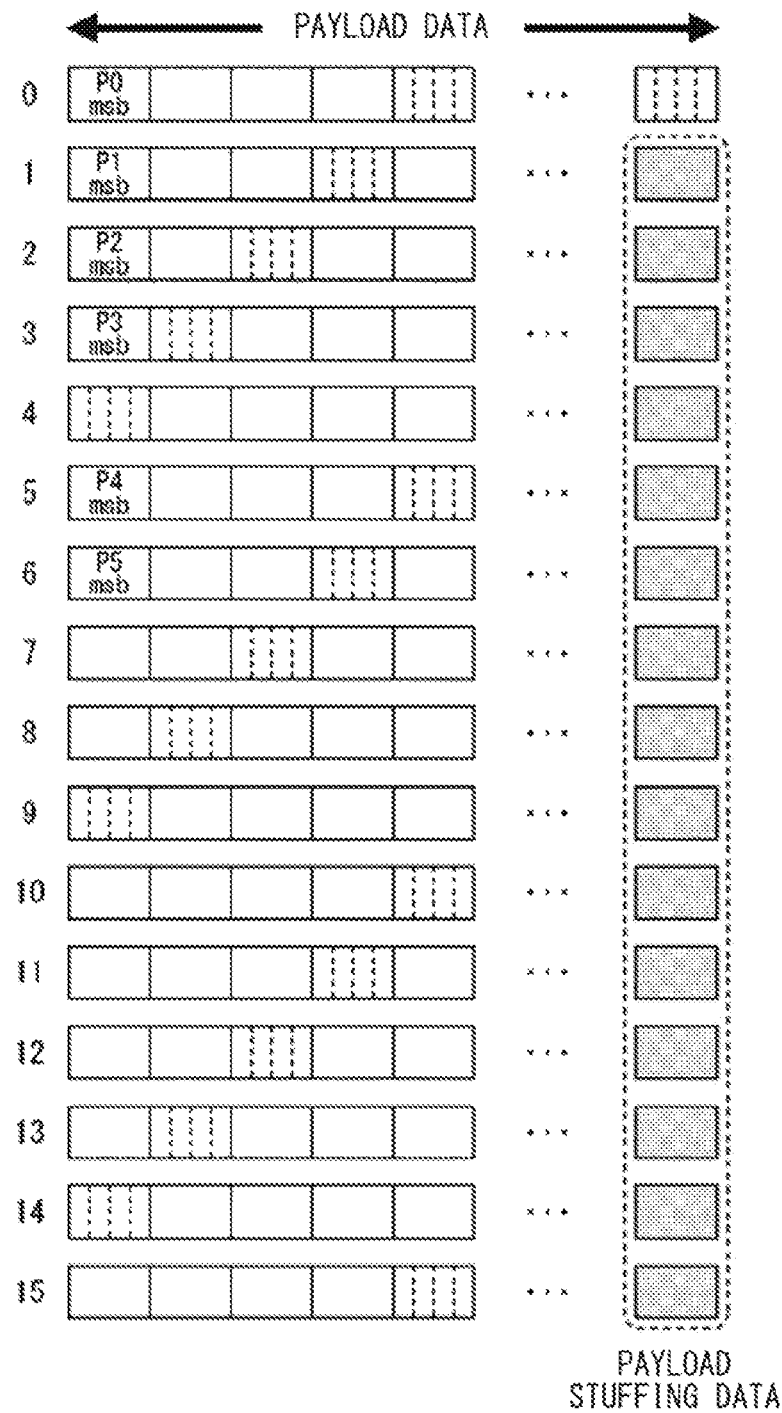
FIG. 26 illustrates an example of payload data.

FIG. 26 illustrates an example of the payload data.

FIG. 26 illustrates payload data including the pixel data obtained by the Pixel to Byte conversion in a case where pixel values of each pixel are represented by 10 bits. One uncolored block indicates pixel data in a byte unit after the Pixel to Byte conversion. In addition, one colored block indicates payload stuffing data generated by the data insertion part 173.

The pixel data after the Pixel to Byte conversion is grouped into a predetermined number of groups in the order of being obtained by the conversion. In the example of FIG. 26, each pixel data is grouped into 16 groups of groups 0 to 15; pixel data including MSB of a pixel P0 is assigned to a group 0, and pixel data including MSB of a pixel P1 is assigned to a group 1. In addition, pixel data including MSB of a pixel P2 is assigned to a group 2, pixel data including MSB of a pixel P3 is assigned to a group 3, and pixel data including LSB of each of the pixels P0 to P3 is assigned to a group 4.

Pixel data including MSB of a pixel P4 and subsequent pixel data are also assigned, in order, to respective groups of a group 5 and subsequent groups. When certain pixel data is assigned to a group 15, subsequent pieces of pixel data are assigned, in order, to respective groups of the group 0 and subsequent group. It is to be noted that, of the blocks representing the pixel data, a block with three broken lines attached inside represents pixel data in a byte unit generated to include LSB of each of pixels N to N+3 during the Pixel to Byte conversion.

In the link layer of the transmission unit 122, the grouping is performed in this manner, and thereafter processing is performed in parallel on pieces of pixel data, as targets, at the same position in respective groups in each period defined by a clock signal. That is, in a case where pieces of pixel data are assigned to 16 groups as illustrated in FIG. 26, processing of 16 pieces of pixel data is carried out to allow the pieces of pixel data arranged in respective columns to be processed during the same period.

As described above, the payload of one packet includes pixel data of one line. The entire pixel data illustrated in FIG. 26 is pixel data included in one line. Although the description is given here of processing of pixel data in the valid pixel region A1 of FIG. 16, pixel data in other regions such as the margin region A2 is also processed together with the pixel data in the valid pixel region A1.

After the pixel data for one line is grouped, the payload stuffing data is added to allow data lengths of the respective groups to be the same. The payload stuffing data is one-byte data.

In the example of FIG. 26, no payload stuffing data is added to the pixel data of the group 0, and one payload stuffing data is added to the end of each pixel data of the groups 1 to 15 as indicated by a surrounding broken line. The data length (Byte) of the payload data including the pixel data and the stuffing data is represented by the following expression (3).

$$PayloadLength = LineLength \times \frac{BitPix}{8} + PayloadStuffing \quad (3)$$

LineLength in the expression (3) denotes the number of pixels of the line, and BitPix denotes the number of bits representing the pixel value of one pixel. PayloadStuffing denotes the number of pieces of payload stuffing data.

In a case where the pixel data is assigned to 16 groups as illustrated in FIG. 26, the number of pieces of payload stuffing data is represented by the following expression (4). The % in the expression (4) indicates the remainder.

$$PayloadStuffing = 16 - \left(\left(LineLength \times \frac{BitPix}{8}\right)\%16\right) \quad (4)$$

Figure 27:
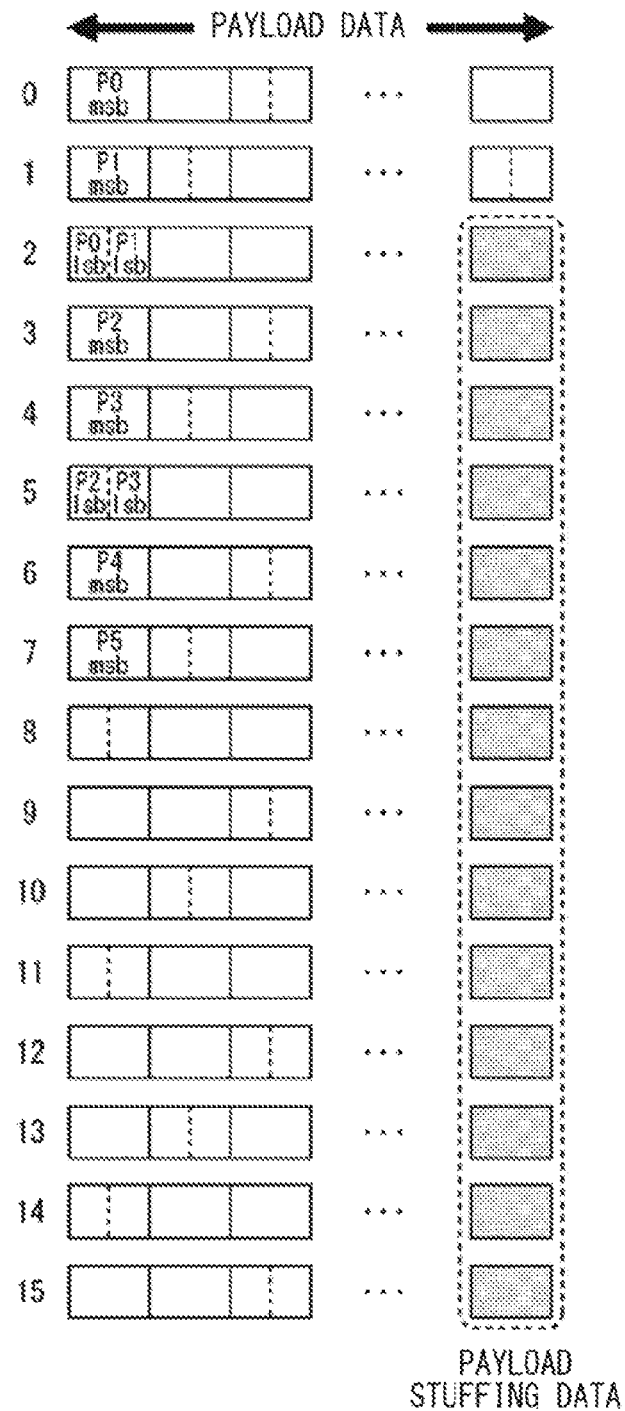
FIG. 27 illustrates another example of the payload data.

FIG. 27 illustrates another example of the payload data.

FIG. 27 illustrates payload data including pixel data obtained by Pixel to Byte conversion in a case where pixel values of each pixel are represented by 12 bits.

In the example of FIG. 27, pixel data including MSB of the pixel P0 is assigned to the group 0, pixel data including MSB of the pixel P1 is assigned to the group 1, and pixel data including LSB of each of the pixel P0 and the pixel P1 is assigned to the group 2. Pixel data including MSB of the pixel P2 and subsequent pixel data are also assigned, in order, to respective groups of the group 3 and subsequent groups. Of the blocks representing the pixel data, a block with one broken line attached inside represents pixel data in a byte unit generated to include LSB of each of the pixel N and the pixel N+1 during the Pixel to Byte conversion.

In the example of FIG. 27, the payload stuffing data is not added to the pixel data of the group 0 and the group 1, and one payload stuffing data is added to the end of each pixel data of the groups 2 to 15.

The payload data having such a configuration is supplied from the Pixel to Byte conversion section 162 to the payload ECC insertion section 163.

On the basis of the payload data supplied from the Pixel to Byte conversion section 162, the Payload ECC insertion section 163 calculates an error-correcting code used for error correction of the payload data, and inserts a parity, which is the error-correcting code obtained by the calculation, into the payload data. As the error-correcting code, for example, a Reed-Solomon code is used. It is to be noted that the insertion of the error-correcting code is optional; it may be possible, for example, to perform only one of the insertion of parity by the payload ECC insertion section 163 and the addition of a footer by the footer generation part 174.

Figure 28:
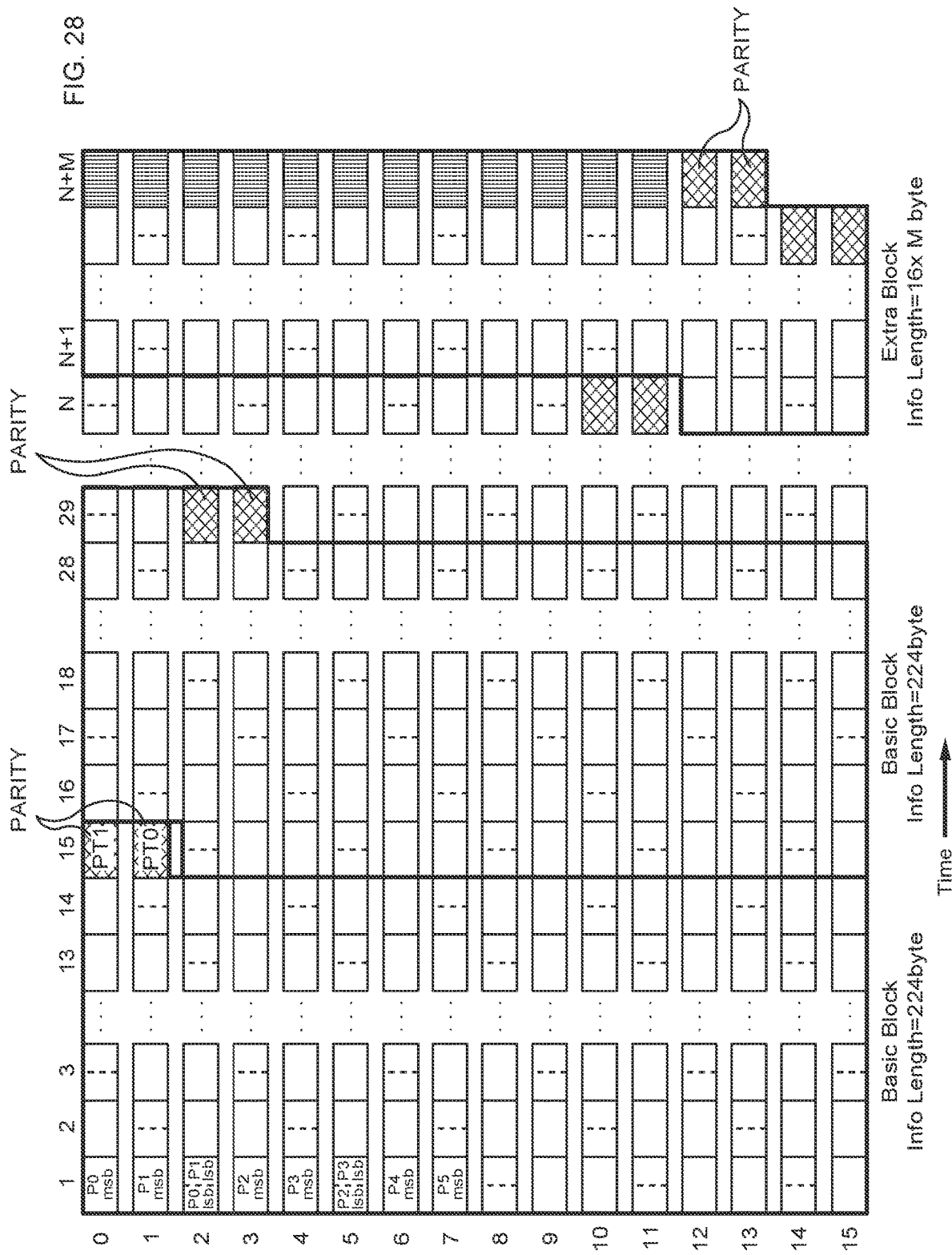
FIG. 28 illustrates an example of payload data into which parity is inserted.

FIG. 28 illustrates an example of the payload data into which the parity is inserted.

The payload data illustrated in FIG. 28 is payload data including the pixel data obtained by the Pixel to Byte conversion in a case where pixel values of each pixel are represented by 12 bits, as described with reference to FIG. 27. A block indicated by hatching indicates the parity.

In the example of FIG. 28, 14 pieces of pixel data are selected in order from the head pieces of pixel data of each of the groups 0 to 15, and two-byte parities are determined on the basis of selected 224 pieces (224 bytes) of pixel data. The two-byte parities are inserted as the fifteenth data of each of groups 0 and 1 subsequent to the 224 pieces of pixel data used in the calculation to form a first Basic Block from the 224 pieces of pixel data and the two-byte parities.

In this manner, in the payload ECC insertion section 163, basically, the two-byte parities are generated on the basis of the 224 pieces of pixel data, and inserted subsequent to the 224 pieces of pixel data.

In addition, In the example of FIG. 28, the 224 pieces of pixel data subsequent to the first Basic Block are selected in order from each group, and the two-byte parities are determined on the basis of the selected 224 pieces of pixel data. The two-byte parities are inserted as the 29th data of the groups 2 and 3 subsequent to the 224 pieces of pixel data used in the calculation to form a second Basic Block from the 224 pieces of pixel data and the two-byte parities.

In a case where 16×M, which is the number of pixel data and payload stuffing data subsequent to a certain Basic Block, is less than 224, two-byte parities are determined on the basis of remaining 16×M pieces of blocks (pixel data and payload stuffing data). In addition, the determined two-byte parities are inserted subsequent to the payload stuffing data to form an Extra Block from 16×M pieces of blocks and two-byte parities.

The payload ECC insertion section 163 outputs, to the packet generation section 164, the payload data into which the parity is inserted. In a case where no parity is inserted, the payload data supplied from the Pixel to Byte conversion section 162 to the payload ECC insertion section 163 is outputted as it is to the packet generation section 164.

The packet generation section 164 adds the header generated by the header generation part 172 to the payload data supplied from the payload ECC insertion section 163 to thereby generate a packet. In a case where the footer is generated by the footer generation part 174, the packet generation section 164 also adds the footer to the payload data.

Figure 29:
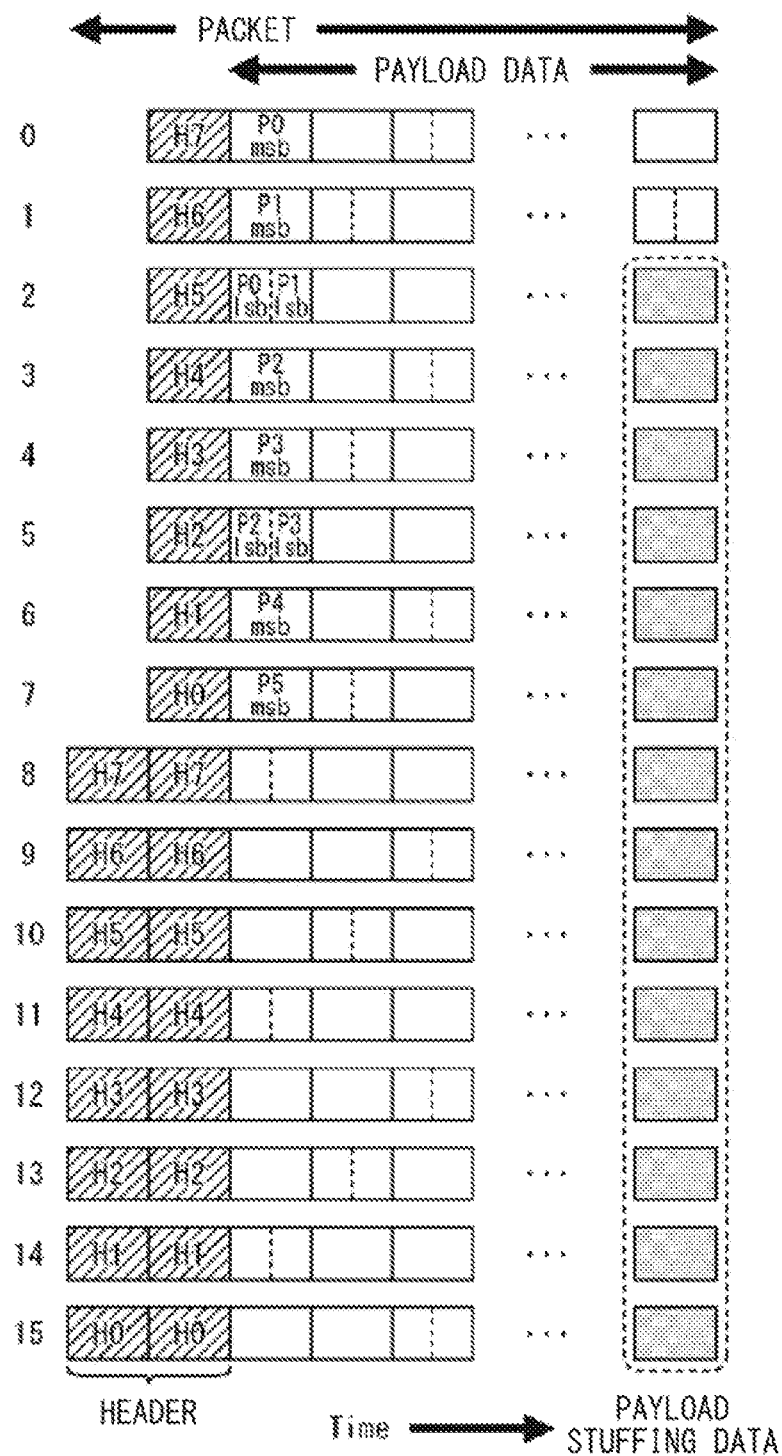
FIG. 29 illustrates a state in which a header is added to the payload data.

FIG. 29 illustrates a state in which a header is added to the payload data.

The 24 pieces of blocks marked with letters H7 to H0 represent header information, or header data in a byte unit, which is the CRC code of the header information. As described with reference to FIG. 18, the header of one packet includes three sets of the header information and the CRC code.

For example, pieces of header data H7 to H2 are each header information (6 bytes), and pieces of header data H1 and H0 are each a CRC code (2 bytes).

In the example of FIG. 29, one header data H7 is added to payload data of the group 0, and one header data H6 is added to payload data of the group 1. One header data H5 is added to payload data of the group 2, and one header data H4 is added to payload data of the group 3. One header data H3 is added to payload data of the group 4, and one header data H2 is added to payload data of the group 5. One header data H1 is added to payload data of the group 6, and one header data H0 is added to payload data of the group 7.

In addition, in the example of FIG. 29, two pieces of header data H7 are added to payload data of the group 8, and two pieces of header data H6 are added to payload data of the group 9. Two pieces of header data H5 are added to payload data of the group 10, and two pieces of header data H4 are added to payload data of the group 11. Two pieces of header data H3 are added to payload data of the group 12, and two pieces of header data H2 are added to payload data of the group 13. Two pieces of header data H1 are added to payload data of the group 14, and two pieces of header data H0 are added to payload data of the group 15.

Figure 30:
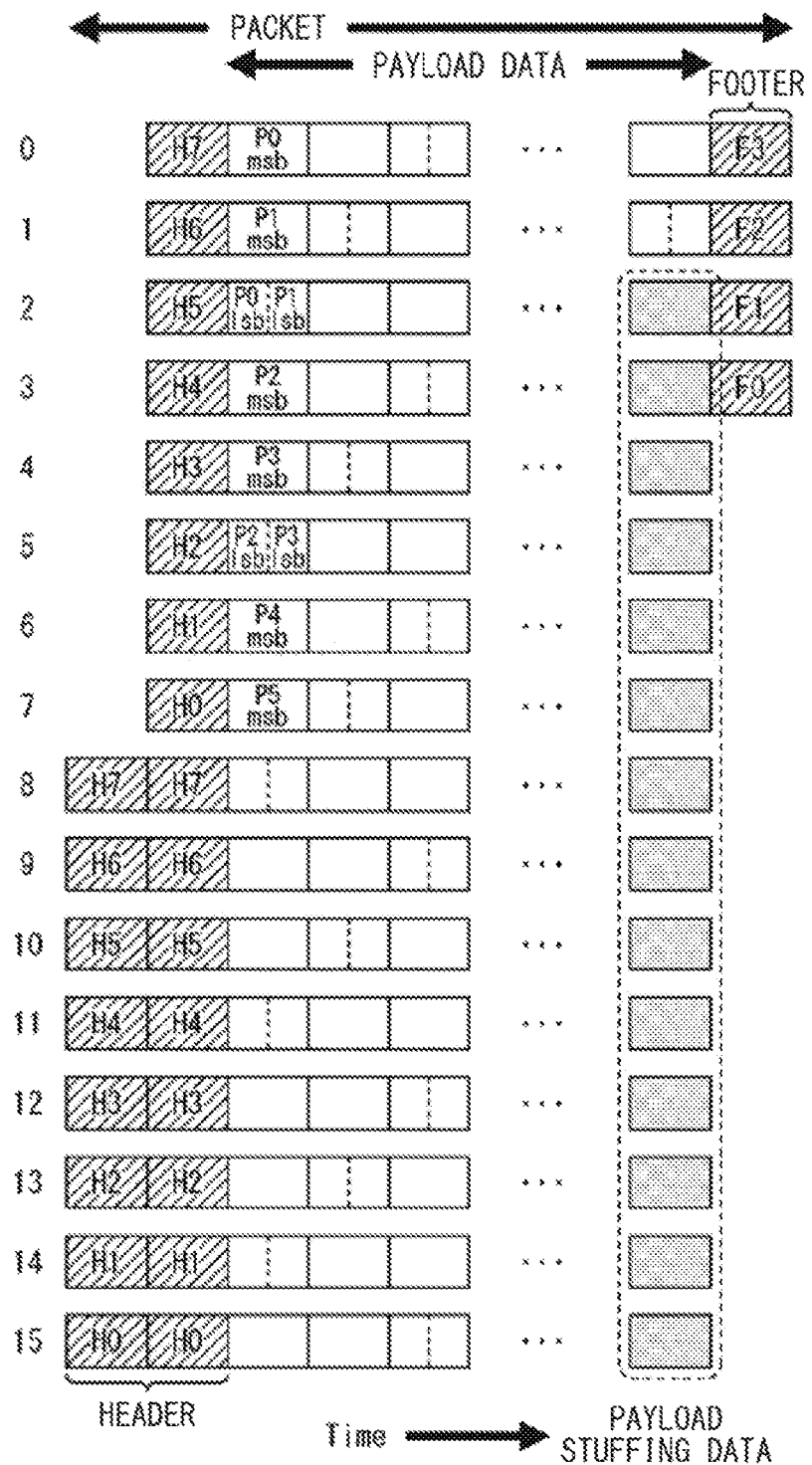
FIG. 30 illustrates a state in which a header and a footer are added to the payload data.

FIG. 30 illustrates a state in which a header and a footer are added to the payload data.

Four blocks marked with letters F3 to F0 represent pieces of footer data which are 4-byte CRC codes each generated as a footer. In the example of FIG. 30, pieces of footer data F3 to F0 are added to respective pieces of payload data of the groups 0 to the group 3.

Figure 31:
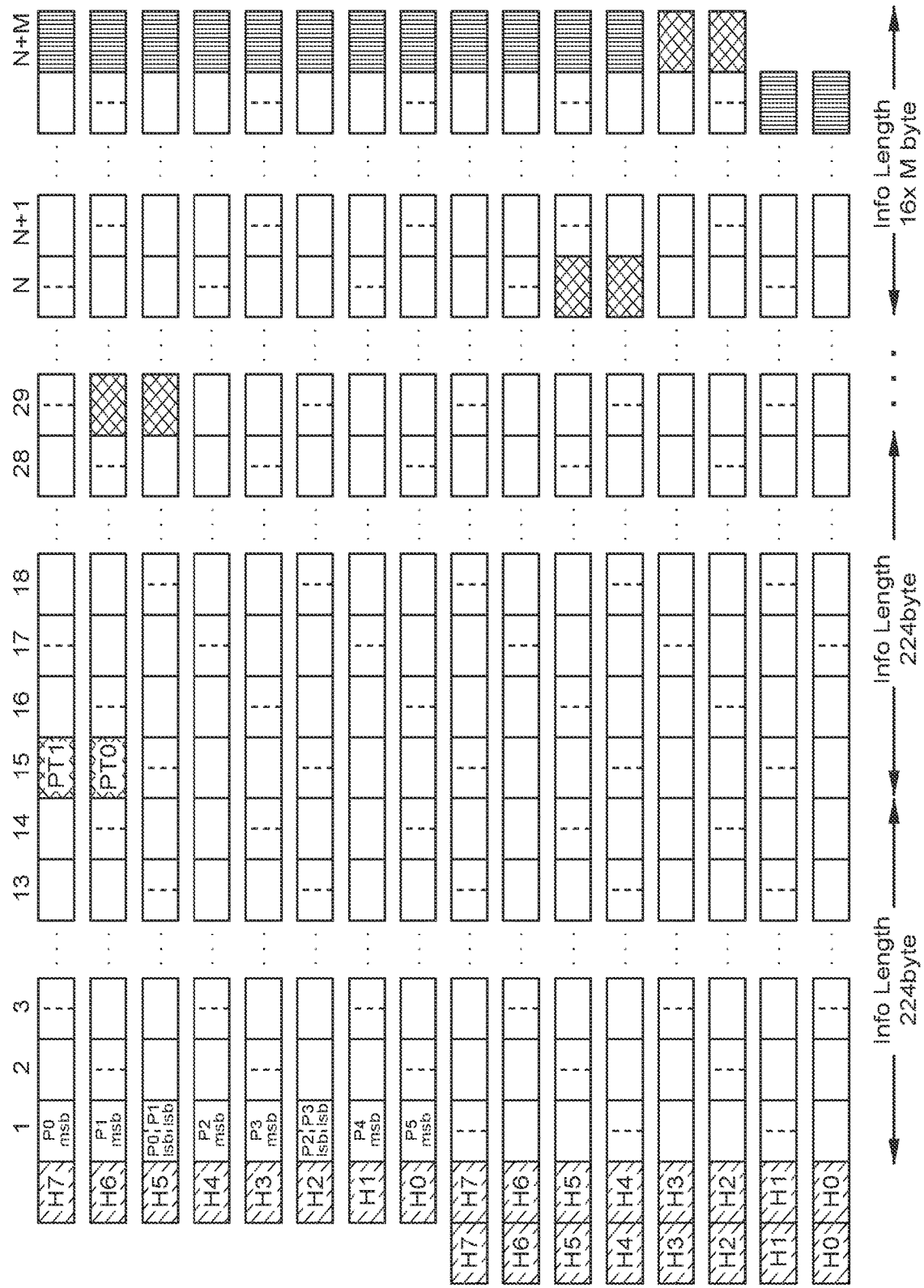
FIG. 31 illustrates a state in which a header is added to the payload data into which the parity is inserted.

FIG. 31 illustrates a state in which a header is added to the payload data into which the parity is inserted.

In the example of FIG. 31, the pieces of header data H7 to H0 are each added to the payload data of FIG. 28 into which the parity is inserted, similarly to the cases of FIGS. 29 and 30.

The packet generation section 164 outputs, to the lane distribution section 165, the packet data which is data included in one packet generated in this manner. The lane distribution section 165 is supplied with packet data including header data and payload data; packet data including header data, payload data, and footer data; or packet data including header data and payload data into which a parity is inserted. The packet structure of FIG. 18 is logical; in the link layer and the physical layer, data of the packet having the structure of FIG. 18 is processed on a byte unit basis.

The lane distribution section 165 assigns, in order from the head data, the packet data supplied from the packet generation section 164 to each of lanes, of Lanes 0 to 7, used for data transmission.

Figure 32:
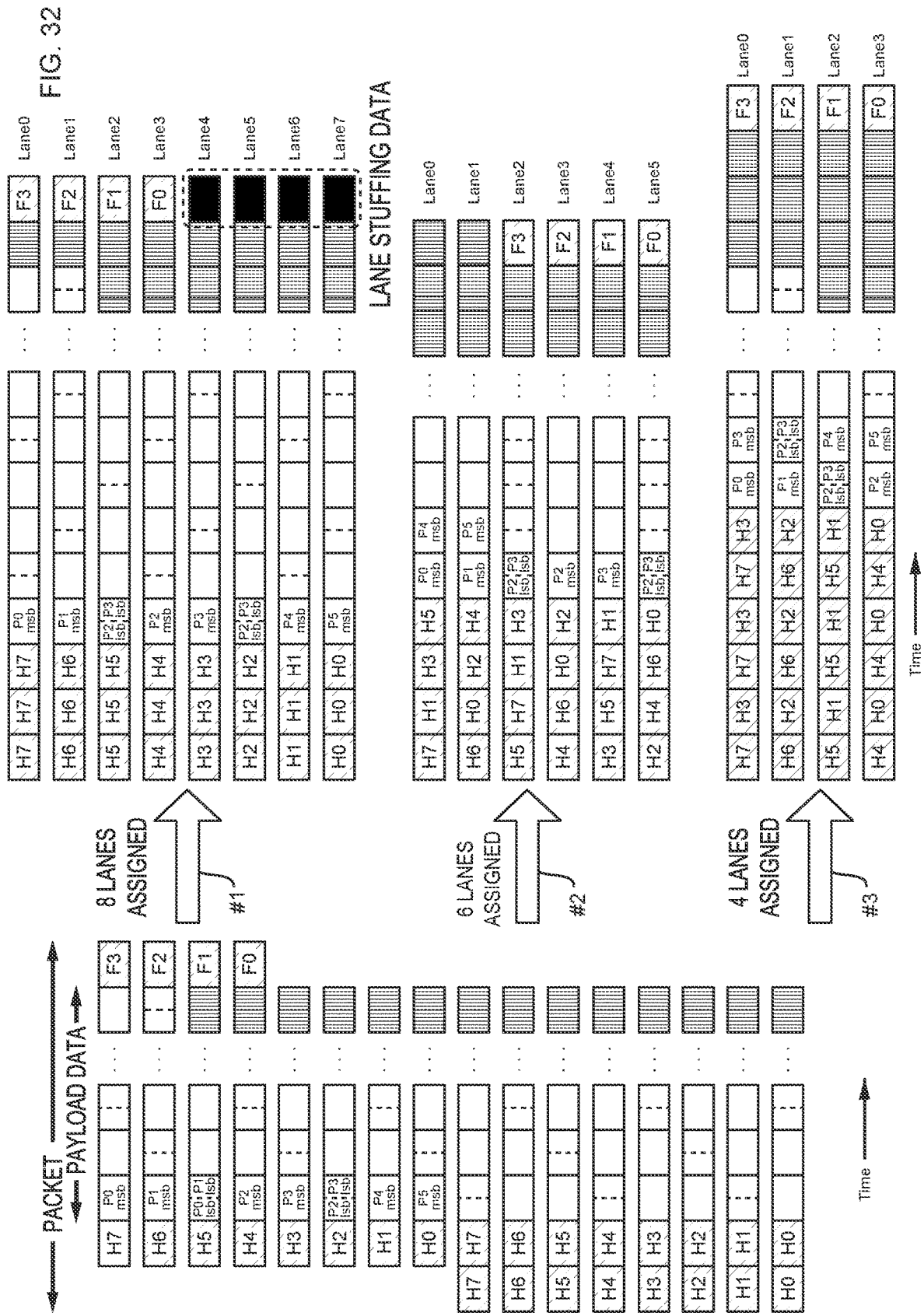
FIG. 32 illustrates an example of packet data assignment.

FIG. 32 illustrates an example of packet data assignment.

Description is given here of assignment of packet data (FIG. 30) including header data, payload data, and footer data. Examples of the assignment of packet data in a case where data transmission is performed using eight lanes of the Lanes 0 to 7 are illustrated as indicated by an open arrow #1.

In this case, respective pieces of header data, of the pieces of header data H7 to H0, that constitute three repetitions are assigned to the Lanes 0 to 7 in order from the head of the header data. When a certain header data is assigned to the Lane 7, subsequent pieces of header data are assigned, in order, to respective lanes of the Lane 0 and the subsequent lanes. It follows that the same three pieces of header data are assigned to each lane of the Lanes 0 to 7.

In addition, the payload data is assigned to the Lanes 0 to 7 in order from the head of the payload data. When a certain payload data is assigned to the Lane 7, subsequent pieces of payload data are assigned, in order, to respective lanes of the Lane 0 and the subsequent lanes.

The pieces of footer data F3 to F0 are assigned, in order, to respective lanes from the head of the footer data. In the example of FIG. 32, the last payload stuffing data included in the payload data is assigned to the Lane 7, and the pieces of footer data F3 to F0 are assigned one by one to the Lanes 0 to 3.

A block marked with black indicates lane stuffing data generated by the data insertion part 173. After packet data for one packet is assigned to each lane, the lane stuffing data is assigned to a lane having the smaller number of pieces of data to allow data lengths assigned to respective lanes are the same. The lane stuffing data is one-byte data. In the example of FIG. 32, pieces of lane stuffing data are assigned one by one to the Lanes 4 to 7 having the smaller number of data assignment.

In a case where the packet data includes header data, payload data, and footer data, the number of the pieces of lane stuffing data is represented by the following expression (5).

$$\text{LaneStuffing}=\text{LaneNum}-((\text{PayloadLength}+\text{FooterLength})\%\text{LaneNum}) \quad (5)$$

LaneNum in the expression (5) denotes the number of lanes, and PayloadLength denotes payload data length (byte). In addition, FooterLength denotes footer length (byte).

In addition, in a case where the packet data includes header data and payload data into which a parity is inserted, the number of the pieces of lane stuffing data is represented by the following expression (6). ParityLength in the expression (6) denotes the total number of bytes of parities included in the payload.

$$\text{LaneStuffing}=\text{LaneNum}-((\text{PayloadLength}+\text{ParityLength})\%\text{LaneNum}) \quad (6)$$

Examples of the assignment of packet data in a case where data transmission is performed using six lanes of the Lanes 0 to 5 are illustrated as indicated by an open arrow #2.

In this case, respective pieces of header data, of the pieces of header data H7 to H0, that constitute three repetitions are assigned, in order, to the Lanes 0 to 5 from the head of the header data. When a certain header data is assigned to the Lane 5, subsequent pieces of header data are assigned, in order, to respective lanes of the Lane 0 and the subsequent lanes. It follows that four pieces of header data are assigned to each lane of the Lanes 0 to 5.

In addition, the payload data is assigned to the Lanes 0 to 5 in order from the head of the payload data. When a certain payload data is assigned to the Lane 5, subsequent pieces of payload data are assigned, in order, to respective lanes of the Lane 0 and the subsequent lanes.

The pieces of footer data F3 to F0 are assigned, in order, to respective lanes from the head of the footer data. In the example of FIG. 32, the last payload stuffing data included in the payload data is assigned to the Lane 1, and the pieces of footer data F3 to F0 are assigned one by one to the Lanes 2 to 5. In this case, no lane stuffing data is used because the number of pieces of packet data of the Lanes 0 to 5 are the same.

Examples of the assignment of packet data in a case where data transmission is performed using four lanes of the Lanes 0 to 3 are illustrated as indicated by an open arrow #3.

In this case, respective pieces of header data, of the pieces of header data H7 to H0, that constitute three repetitions are assigned to the Lanes 0 to 3 in order from the head of the header data. When a certain header data is assigned to the Lane 3, subsequent pieces of header data are assigned, in order, to respective lanes of the Lane 0 and the subsequent lanes. It follows that six pieces of header data are assigned to each lane of the Lanes 0 to 3.

In addition, the payload data is assigned to the Lanes 0 to 3 in order from the head of the payload data. When a certain payload data is assigned to the Lane 3, subsequent pieces of payload data are assigned, in order, to respective lanes of the Lane 0 and the subsequent lanes.

The pieces of footer data F3 to F0 are assigned, in order, to respective lanes from the head of the footer data. In the example of FIG. 32, the last payload stuffing data included in the payload data is assigned to the Lane 3, and the pieces of footer data F3 to F0 are assigned one by one to the Lanes 0 to 3. In this case, no lane stuffing data is used because the number of pieces of packet data of the Lanes 0 to 3 are the same.

The lane distribution section 165 outputs, to the physical layer, the packet data assigned to each lane in this manner. Hereinafter, description is given mainly of a case where data is transmitted using eight lanes of the Lanes 0 to 7; however, similar processing is performed also in a case where another number of lanes is used for the data transmission.

<Physical Layer Configuration of Transmission Unit 122>

Next, description is given of a physical layer configuration of the transmission unit 122.

The transmission unit 122 includes, as the physical layer configuration, a PHY-TX state control section 181, a clock generation section 182, and signal processing sections 183-0 to 183-N. The signal processing section 183-0 includes a control code insertion part 191, an 8B10B symbol encoder 192, a synchronization part 193, and a transmission part 194.

The encoder 11 that performs the encoding as described with reference to FIGS. 1 to 13 may be used instead of the 8B10B symbol encoder 192. Description is given first of a case where the 8B10B symbol encoder 192 is adopted, and description is given of a case where the encoder 11 is used instead of the 8B10B symbol encoder 192 with reference to FIG. 42 and subsequent drawings.

The packet data assigned to the Lane 0 outputted from the lane distribution section 165 is inputted to the signal processing section 183-0, and the packet data assigned to the Lane 1 is inputted to the signal processing section 183-1. In addition, the packet data assigned to a Lane N is inputted to the signal processing section 183-N.

In this manner, the physical layer of the transmission unit 122 includes the same number of the signal processing sections 183-0 to 183-N as the number of lanes, and pieces of processing of the packet data to be transmitted using respective lanes are performed in parallel in the respective signal processing sections 183-0 to 183-N. Description is given of a configuration of the signal processing section 183-0; however, the signal processing sections 183-1 to 183-N each also have a similar configuration.

The PHY-TX state control section 181 controls various parts of the signal processing sections 183-0 to 183-N. For example, a timing of each processing to be performed by the signal processing sections 183-0 to 183-N is controlled by the PHY-TX state control section 181.

The clock generation section 182 generates a clock signal to output the generated clock signal to each of the synchronization parts 193 of the signal processing sections 183-0 to 183-N.

The control code insertion part 191 of the signal processing section 183-0 adds a control code to the packet data supplied from the lane distribution section 165. The control code is a code represented by one symbol selected from among a plurality of types of symbols prepared in advance, or by a combination of the plurality of types of symbols. Each symbol to be inserted by the control code insertion part 191 is 8-bit data. Carrying out 8B10B conversion in a circuit in a subsequent stage causes one symbol inserted by the control code insertion part 191 to be 10-bit data. Meanwhile, 10B8B conversion is carried out on received data in the reception unit 131 as described later; however, each symbol before the 10B8B conversion included in the received data is 10-bit data, whereas each symbol after the 10B8B conversion is 8-bit data.

FIG. 33 illustrates an example of control codes to be added by the control code insertion part 191.

Examples of the control codes include Idle Code, the Start Code, the End Code, the Pad Code, Sync Code, Deskew Code, and Standby Code.

The Idle Code is a symbol group repeatedly transmitted during a period other than packet data transmission. The Idle Code is represented by D00.0 (00000000) of D Character which is 8B10B Code.

The Start Code is a symbol group indicating the start of a packet. As described above, the Start Code is added to the front of the packet. The Start Code is represented by four symbols of K28.5, K27.7, K28.2, and K27.7 which are a combination of three types of K Characters. The values of the respective K Characters are illustrated in FIG. 34.

The End Code is a symbol group indicating the end of a packet. As described above, the End Code is added to the rear of the packet. The End Code is represented by four symbols of K28.5, K29.7, K30.7, and K29.7 which are a combination of three types of K Characters.

The Pad Code is a symbol group inserted into the payload data to make up for a difference between the pixel data band and the PHY transmission band. The pixel data band is a transmission rate of the pixel data outputted from the imaging unit 121 and inputted to the transmission unit 122, and the PHY transmission band is a transmission rate of the pixel data transmitted from the transmission unit 122 and inputted to the reception unit 131. The Pad Code is represented by four symbols of K23.7, K28.4, K28.6, and K28.3 which are a combination of four types of K Characters.

Figure 35:
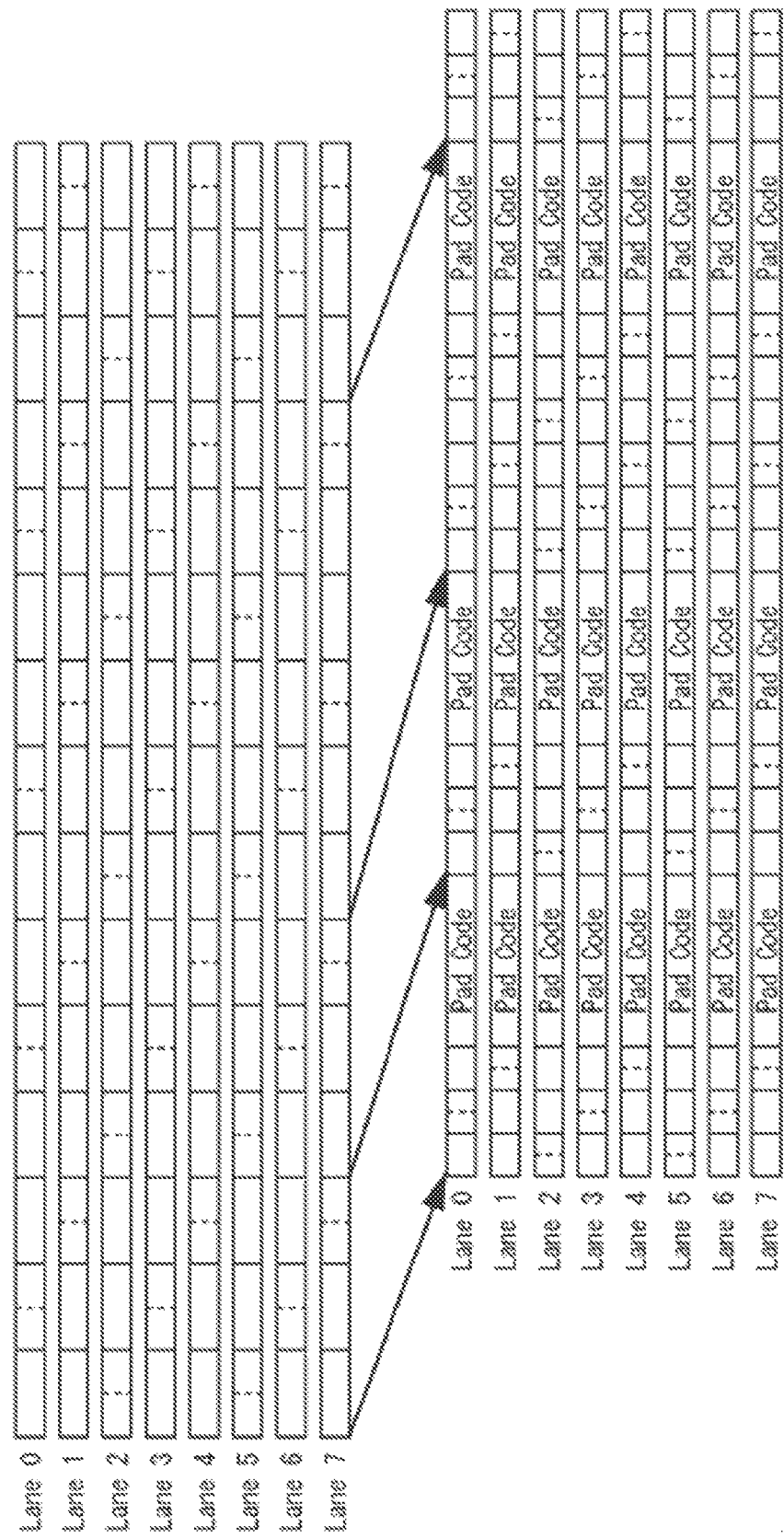
FIG. 35 illustrates an example of insertion of Pad Code.

FIG. 35 illustrates an example of insertion of the Pad Code.

Upper side of FIG. 35 illustrates payload data assigned to each lane before Pad Code insertion, and lower side thereof illustrates payload data after Pad Code insertion. In the example of FIG. 35, the Pad Code is inserted between the third pixel data and the fourth pixel data from the head, between the sixth pixel data and the seventh pixel data, and between the twelfth pixel data and the thirteenth pixel data.

In this manner, the Pad Code is inserted into the same position as the payload data of each lane of the Lanes 0 to 7.

The Pad Code is inserted into the payload data assigned to the Lane 0 by the control code insertion part 191 of the signal processing section 183-0. Likewise, the Pad Code insertion into the payload data assigned to another lane is also performed at the same timing in each of the signal processing sections 183-1 to 183-N. The number of the Pad Codes is determined on the basis of the difference between the pixel data band and the PHY transmission band, a frequency of the clock signal generated by the clock generation section 182, and the like.

In this manner, in a case where the pixel data band is narrow and the PHY transmission band is wide, the Pad Code insertion is performed in order to adjust the difference between both of the bands. For example, the Pad Code insertion allows for adjustment of the difference between the pixel data band and the PHY transmission band to be within a certain range.

Returning to the description of FIG. 33, the Sync Code is a symbol group used for performing bit synchronization and symbol synchronization between the transmission unit 122 and the reception unit 131. The Sync Code is represented by two symbols of K28.5 and Any . The Any  denotes that any type of symbols may be used. The Sync Code is repeatedly transmitted in a training mode before the packet data transmission between the transmission unit 122 and the reception unit 131, for example.

The Deskew Code is a symbol group used for correcting Data Skew between lanes, i.e., deviation in reception timings of data received in the lanes of the reception unit 131. The Deskew Code is represented by two symbols of K28.5 and Any **. Description is given later of the correction of the Data Skew between lanes using the Deskew Code.

The Standby Code is a symbol group used for notifying the reception unit 131 that an output of the transmission unit 122 is brought into a state of High-Z (high-impedance) to cause no data transmission to be performed. That is, the Standby Code is transmitted to the reception unit 131 when the packet data transmission is ended to bring it into a Standby state. The Standby Code is represented by two symbols of K28.5 and Any **.

The control code insertion part 191 outputs, to the 8B10B symbol encoder 192, packet data to which such a control code is added.

Figure 36:
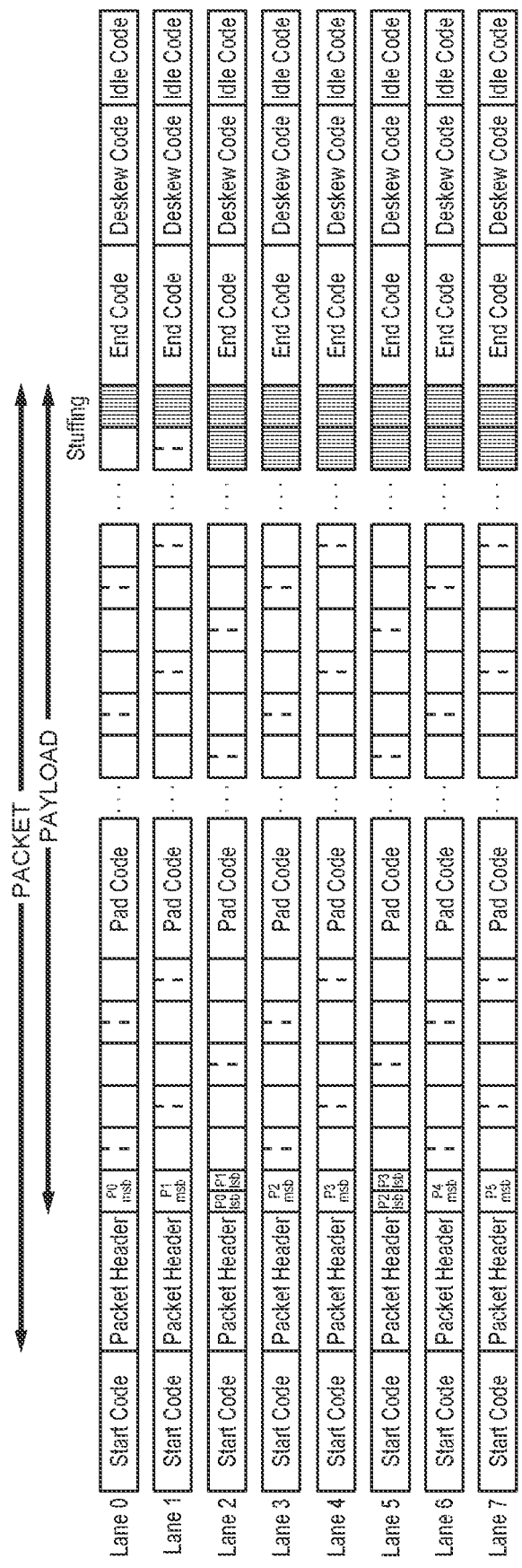
FIG. 36 illustrates an example of packet data after insertion of the control code.

FIG. 36 illustrates an example of the packet data after the insertion of the control code.

As illustrated in FIG. 36, in each of the signal processing sections 183-0 to 183-N, the Start Code is added to the front of the packet data, and the Pad Code is inserted into the payload data. The End Code is added to the rear of the packet data, and the Deskew Code is added to the rear of the End Code. In the example of FIG. 36, the Idle Code is added to a rear of the Deskew Code.

The 8B10B symbol encoder 192 carries out the 8B10B conversion on the packet data (packet data to which the control code is added) supplied from the control code insertion part 191 to output the packet data converted into 10-bit unit data to the synchronization part 193.

The synchronization part 193 outputs, to the transmission part 194, each bit of the packet data supplied from the 8B10B symbol encoder 192 in accordance with the clock signal generated by the clock generation section 182. It is to be noted that the transmission unit 122 may not include the synchronization part 193. In this case, the packet data outputted from the 8B10B symbol encoder 192 is supplied as it is to the transmission part 194.

The transmission part 194 transmits the packet data supplied from the synchronization part 193 to the reception unit 131 via a transmission path included in the Lane 0. In a case where the data transmission is performed using eight lanes, the packet data is transmitted to the reception unit 131 also using transmission paths included in the Lanes 1 to 7.

<Physical Layer Configuration of Reception Unit 131>

Next, description is given of a physical layer configuration of the reception unit 131.

The reception unit 131 includes, as the physical layer configuration, a PHY-RX state control section 201 and signal processing sections 202-0 to 202-N. The signal processing section 202-0 includes a reception part 211, a clock generation part 212, a synchronization part 213, a symbol synchronization part 214, a 10B8B symbol decoder 215, a skew correction part 216, and a control code removal part 217.

The decoder 12 that performs decoding described with reference to FIGS. 1 to 13 may be used instead of the 10B8B symbol decoder 215. Description is given first of a case where the 10B8B symbol decoder 215 is adopted, and description is given of a case where the decoder 12 is used instead of the 10B8B symbol decoder 215 with reference to FIG. 42 and subsequent drawings.

The packet data transmitted via the transmission path included in the Lane 0 is inputted to the signal processing section 202-0, and the packet data transmitted via a transmission path included in the Lane 1 is inputted to the signal processing section 202-1. In addition, the packet data transmitted via a transmission path included in the Lane N is inputted to the signal processing section 202-N.

In this manner, the physical layer of the reception unit 131 includes the same number of the signal processing sections 202-0 to 202-N as the number of lanes, and pieces of processing of the packet data transmitted using respective lanes are performed in parallel in the respective signal processing sections 202-0 to 202-N. Description is given of a configuration of the signal processing section 202-0; however, the signal processing sections 202-1 to 202-N each also have a similar configuration.

The reception part 211 receives a signal representing the packet data transmitted from the transmission unit 122 via transmission path included in the Lane 0, and outputs the received signal to the clock generation part 212.

The clock generation part 212 detects an edge of the signal supplied from the reception part 211 to thereby perform bit synchronization, and generates a clock signal on the basis of a detection cycle of the edge. The clock generation part 212 outputs, to the synchronization part 213, the signal supplied from the reception part 211 together with the clock signal.

The synchronization part 213 samples the signal received by the reception part 211 in accordance with the clock signal generated by the clock generation part 212 to output the packet data obtained by the sampling to the symbol synchronization part 214. CDR (Clock Data Recovery) function is achieved by the clock generation part 212 and the synchronization part 213.

The symbol synchronization part 214 performs symbol synchronization by detecting a control code included in the packet data or by detecting some of symbols included in the control code. For example, the symbol synchronization part 214 detects the symbol of K28.5 included in the Start Code, the End Code, and the Deskew Code to perform symbol synchronization. The symbol synchronization part 214 outputs 10-bit unit packet data representing each symbol to the 10B8B symbol decoder 215.

In addition, the symbol synchronization part 214 performs symbol synchronization by detecting a boundary of the symbols included in the Sync Code repeatedly transmitted from the transmission unit 122 at the time of the training mode before the start of the packet data transmission.

The 10B8B symbol decoder 215 carries out the 10B8B conversion on the 10-bit unit packet data supplied from the symbol synchronization part 214 to output the packet data converted into 8-bit unit data to the skew correction part 216.

The skew correction part 216 detects the Deskew Code from the packet data supplied from the 10B8B symbol decoder 215. Information on a detection timing of the Deskew Code by the skew correction part 216 is supplied to the PHY-RX state control section 201.

In addition, the skew correction part 216 corrects the Data Skew between lanes to match the timing of the Deskew Code with a timing indicated by the information supplied from the PHY-RX state control section 201. The PHY-RX state control section 201 supplies information indicating the latest timing of timings of the Deskew Code detected in each of the signal processing sections 202-0 to 202-N.

Figure 37:
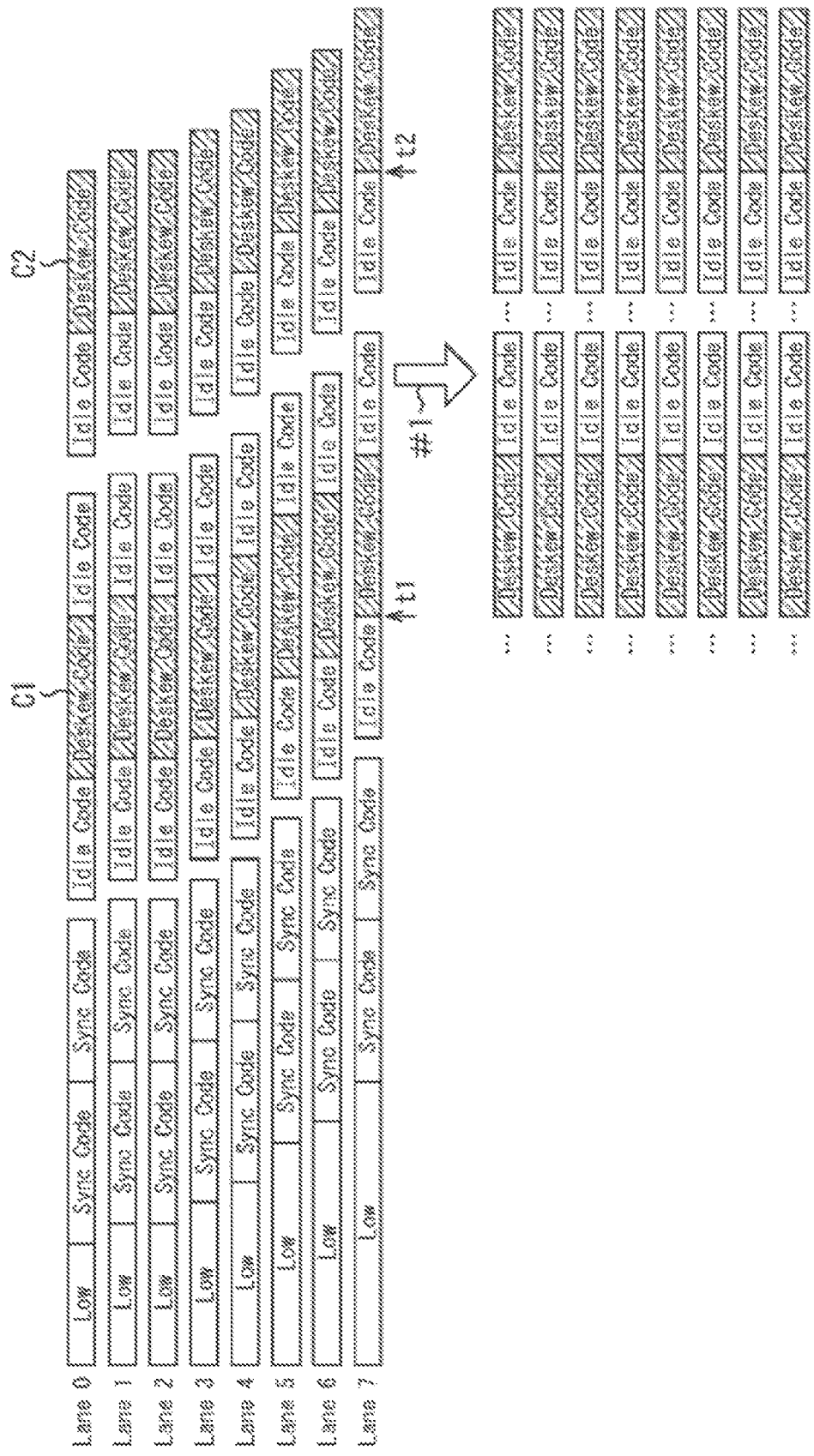
FIG. 37 illustrates an example of correction of Data Skew.

FIG. 37 illustrates an example of correction of the Data Skew between lanes using the Deskew Code.

In the example of FIG. 37, Sync Code, Sync Code, . . . , Idle Code, Deskew Code, Idle Code, . . . , Idle Code, and Deskew Code are transmitted in each lane of the Lanes 0 to 7, and each of the control codes is received by the reception unit 131. The reception timing of the same control code varies for each lane, resulting in a state where the Data Skew between lanes occurs.

In this case, the skew correction part 216 detects a Deskew Code C1, which is the first Deskew Code, and performs correction to match a timing of the head of the Deskew Code C1 with clock time t1 indicated by the information supplied from the PHY-RX state control section 201. The PHY-RX state control section 201 supplies the information on the clock time t1 at which the Deskew Code C1 is detected in the Lane 7 and which is the latest timing of the timings at which the Deskew Code C1 is detected in each lane of the Lanes 0 to 7.

In addition, the skew correction part 216 detects a Deskew Code C2, which is the second Deskew Code, and performs correction to match a timing of the head of the Deskew Code C2 with clock time t2 indicated by the information supplied from the PHY-RX state control section 201. The PHY-RX state control section 201 supplies the information on the clock time t2 at which the Deskew Code C2 is detected in the Lane 7 and which is the latest timing of the timings at which the Deskew Code C2 is detected in each lane of the Lanes 0 to 7.

Performing similar processing in each of the signal processing sections 202-1 to 202-N allows for correction of the Data Skew between lanes as illustrated by indication of an arrow #1 of FIG. 37.

The skew correction part 216 outputs the packet data of which the Data Skew has been corrected to the control code removal part 217.

The control code removal part 217 removes the control code added to the packet data to output, as the packet data, data from the Start Code to the End Code, to the link layer.

The PHY-RX state control section 201 controls each part of the signal processing sections 202-0 to 202-N to perform correction or the like of the Data Skew between lanes. In addition, in a case where a transmission error occurs in a predetermined lane to lose a control code, the PHY-RX state control section 201 performs error correction of the control code by adding a control code transmitted in another lane instead of the lost control code.

<Link Layer Configuration of Reception Unit 131>

Next, description is given of a link layer configuration of the reception unit 131.

The reception unit 131 includes, as the link layer configuration, the LINK-RX protocol management section 221, a lane integration section 222, a packet separation section 223, a payload error correction section 224, and a Byte to Pixel conversion section 225. The LINK-RX protocol management section 221 includes a state control part 231, a header error correction part 232, a data removal part 233, and a footer error detection part 234.

The lane integration section 222 rearranges, in the reverse order, the distribution order of the pieces of packet data supplied from the signal processing sections 202-0 to 202-N of the physical layer to the respective lanes by the lane distribution section 165 of the transmission unit 122 to integrate the pieces of packet data.

For example, in a case where the distribution of the packet data by the lane distribution section 165 is performed as illustrated by indication of an arrow #1 of FIG. 32, the packet data on left side of FIG. 32 is acquired by integrating the pieces of packet data of the respective lanes. Upon the integration of the pieces of packet data of the respective lanes, the lane stuffing data is removed by the lane integration section 222 under the control of the data removal part 233. The lane integration section 222 outputs the integrated packet data to the packet separation section 223.

The packet separation section 223 separates the packet data for one packet integrated by the lane integration section 222 into packet data included in the header data and packet data included in the payload data. The packet separation section 223 outputs the header data to the header error correction part 232, and outputs the payload data to the payload error correction section 224.

In addition, in a case where the packet includes a footer, the packet separation section 223 separates the data for one packet into packet data included in the header data, packet data included in the payload data, and packet data included in the footer data. The packet separation section 223 outputs the header data to the header error correction part 232, and outputs the payload data to the payload error correction section 224. In addition, the packet separation section 223 outputs the footer data to the footer error detection part 234.

In a case where a parity is inserted into the payload data supplied from the packet separation section 223, the payload error correction section 224 performs an error correction operation on the basis of the parity to thereby detect an error in the payload data, and corrects the detected error. For example, in a case where the parities are inserted as illustrated in FIG. 28, the payload error correction section 224 uses the two parities inserted into the last of the first Basic Block to perform error correction of 224 pieces of pixel data prior to the parities.

The payload error correction section 224 outputs, to the Byte to Pixel conversion section 225, error-corrected pixel data obtained by performing error correction on each of Basic Block and Extra Block, as a target. In a case where no parity is inserted into the payload data supplied from the packet separation section 223, the payload data supplied from the packet separation section 223 is outputted as it is to the Byte to Pixel conversion section 225.

The Byte to Pixel conversion section 225 removes payload stuffing data included in the payload data supplied from the payload error correction section 224 under the control of the data removal part 233.

In addition, the Byte to Pixel conversion section 225 performs Byte to Pixel conversion to convert data of each pixel in a byte unit obtained by removing the payload stuffing data into 8-bit, 10-bit, 12-bit, 14-bit, or 16-bit unit pixel data. The Byte to Pixel conversion section 225 performs reverse conversion of the Pixel to Byte conversion by the Pixel to Byte conversion section 162 of the transmission unit 122, which has been described with reference to FIGS. 21 to 25.

The Byte to Pixel conversion section 225 outputs, to the frame data output section 241, the 8-bit, 10-bit, 12-bit, 14-bit, or 16-bit unit pixel data obtained by the Byte to Pixel conversion. In the frame data output section 241, for example, respective lines of valid pixels specified by the Line Valid of the header information are generated on the basis of the pixel data obtained by the Byte to Pixel conversion section 225, and the respective lines are arranged in accordance with the Line Number of the header information, thereby generating a one-frame image.

The state control part 231 of the LINK-RX protocol management section 221 manages a state of the link layer of the reception unit 131.

The header error correction part 232 acquires three sets of the header information and the CRC code on the basis of the header data supplied from the packet separation section 223. The header error correction part 232 performs an error detection operation, which is an operation to detect an error in the header information, on each set of the header information and the CRC code, as targets, using a CRC code of the same set as the header information.

In addition, the header error correction part 232 infers correct header information on the basis of at least one of an error detection result of the header information of each set or a comparison result between pieces of data obtained by the error detection operation to output header information inferred to be correct and a decoding result. The data obtained by the error detection operation is a value obtained by applying the CRC generator polynomial to the header information. In addition, the decoding result is information indicating successful decoding or failed decoding.

The three sets of the header information and the CRC code are defined as a set 1, a set 2, and a set 3. In this case, the header error correction part 232 performs an error detection operation on the set 1, as a target, to acquire whether or not there is an error in the header information of the set 1 (error detection result), and data 1 which is data obtained by the error detection operation. In addition, the header error correction part 232 performs an error detection operation on the set 2, as a target, to acquire whether or not there is an error in the header information of the set 2, and data 2 which is data obtained by the error detection operation. The header error correction part 232 performs an error detection operation on the set 3, as a target, to acquire whether or not there is an error in the header information of the set 3, and data 3 which is data obtained by the error detection operation.

In addition, the header error correction part 232 determines whether or not the data 1 and the data 2 coincide with each other, whether or not the data 2 and the data 3 coincide with each other, and whether or not the data 3 and the data 1 coincide with each other.

For example, in a case where no error is detected by any of the error detection operations on the sets 1, 2, and 3, as targets, and all of the comparison results of the pieces of data obtained by the error detection operations coincide with each other, the header error correction part 232 selects information indicating successful decoding as the decoding result. In addition, the header error correction part 232 infers that any of the pieces of header information is correct to select, as output information, one of the header information of the set 1, the header information of the set 2, and the header information of the set 3.

Meanwhile, in a case where no error is detected only by the error detection operation on the set 1, as a target, the header error correction part 232 selects information indicating successful decoding as the decoding result, and also infers that the header information of the set 1 is correct to select the header information of the set 1 as the output information.

In addition, in a case where no error is detected only by the error detection operation on the set 2, as a target, the header error correction part 232 selects information indicating successful decoding as the decoding result, and also infers that the header information of the set 2 is correct to select the header information of the set 2 as the output information.

In a case where no error is detected only by the error detection operation on the set 3, as a target, the header error correction part 232 selects information indicating successful decoding as the decoding result, and also infers that the header information of the set 3 is correct to select the header information of the set 3 as the output information.

The header error correction part 232 outputs the decoding result and the output information selected as described above to the register 242 for storing. In this manner, the error correction of the header information by the header error correction part 232 is performed to allow the header information without an error to be detected from among the plurality of pieces of header information using the CRC code and the detected header information to be outputted.

The data removal part 233 controls the lane integration section 222 to remove the lane stuffing data, and controls the Byte to Pixel conversion section 225 to remove the payload stuffing data.

The footer error detection part 234 acquires the CRC code stored in the footer on the basis of the footer data supplied from the packet separation section 223. The footer error detection part 234 performs an error detection operation using the acquired CRC code to detect an error in the payload data. The footer error detection part 234 outputs an error detection result, and causes the register 242 to store the error detection result.

<Operations of Image Sensor 111 and DSP 112>

Next, description is given of a series of processing of the transmission unit 122 and the reception unit 131 having the above-described configurations.

Figure 38:
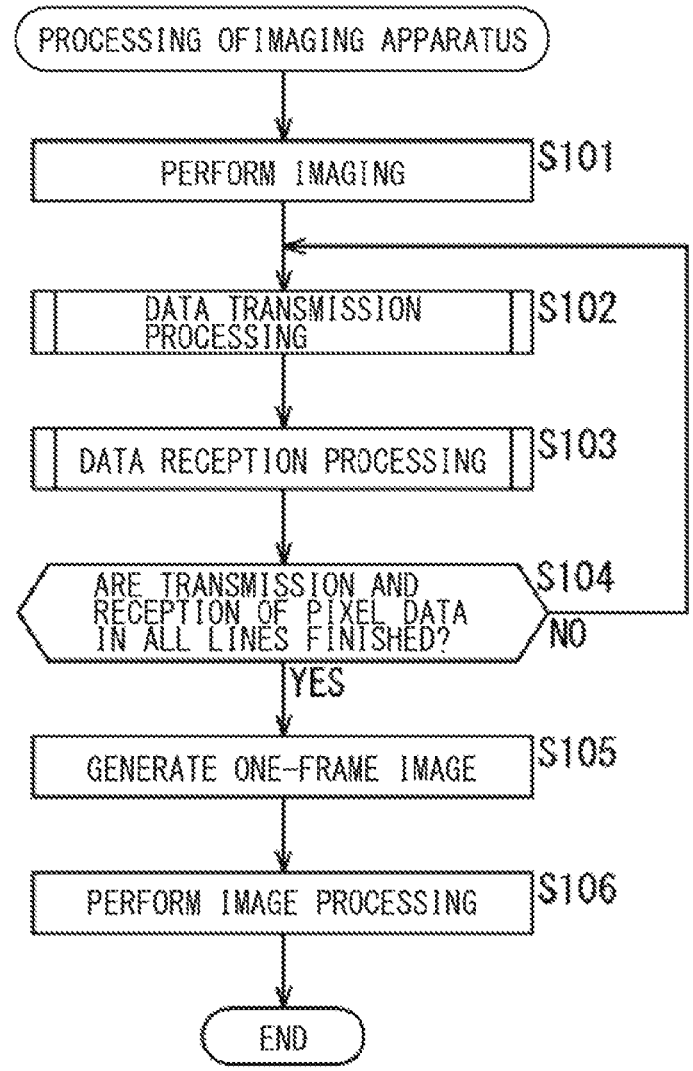
FIG. 38 is a flowchart that describes processing of an imaging apparatus.

First, description is given of an operation of an imaging apparatus including the transmission system 100 with reference to a flowchart of FIG. 38. The processing of FIG. 38 is started when the start of imaging is instructed, for example, by pressing a shutter button provided on the imaging apparatus.

In step S101, the imaging unit 121 of the image sensor 111 performs imaging. The frame data input section 152 of the imaging unit 121 (FIG. 17) outputs, in order, pixel data included in a one-frame image obtained by the imaging, by one-pixel data.

In step S102, data transmission processing is performed by the transmission unit 122. The data transmission processing allows for generation of a packet in which pixel data for one line is stored in the payload, and packet data included in the packet is transmitted to the reception unit 131. The data transmission processing is described later with reference to a flowchart of FIG. 39.

In step S103, data reception processing is performed by the reception unit 131. The data reception processing allows for reception of the packet data transmitted from the transmission unit 122, and pixel data stored in the payload is outputted to the image processing unit 132. The data reception processing is described later with reference to a flowchart of FIG. 40.

The data transmission processing performed by the transmission unit 122 in step S102 and the data reception processing performed by the reception unit 131 in step S103 are performed alternately on pixel data for one line, as a target. That is, when the pixel data for one line is transmitted by the data transmission processing, the data reception processing is performed, and when the pixel data for one line is received by the data reception processing, the data transmission processing is performed on the pixel data of the next one line, as a target. The data transmission processing by the transmission unit 122 and the data reception processing by the reception unit 131 may be appropriately performed temporally in parallel, in some cases. In step S104, the frame data output section 241 of the image processing unit 132 determines whether or not the transmission and the reception of the pixel data in all lines included in the one-frame image are finished; in a case where determination is made that the transmission and the reception of the pixel data are not finished, the frame data output section 241 causes pieces of processing in and after step S102 to be repeatedly performed.

In a case where determination is made in step S104 that the transmission and the reception of the pixel data in all lines included in the one-frame image are finished, the frame data output section 241 of the image processing unit 132 generates the one-frame image on the basis of the pixel data supplied from the reception unit 131.

In step S106, the image processing unit 132 performs image processing using the one-frame image to finish the processing.

Figure 39:
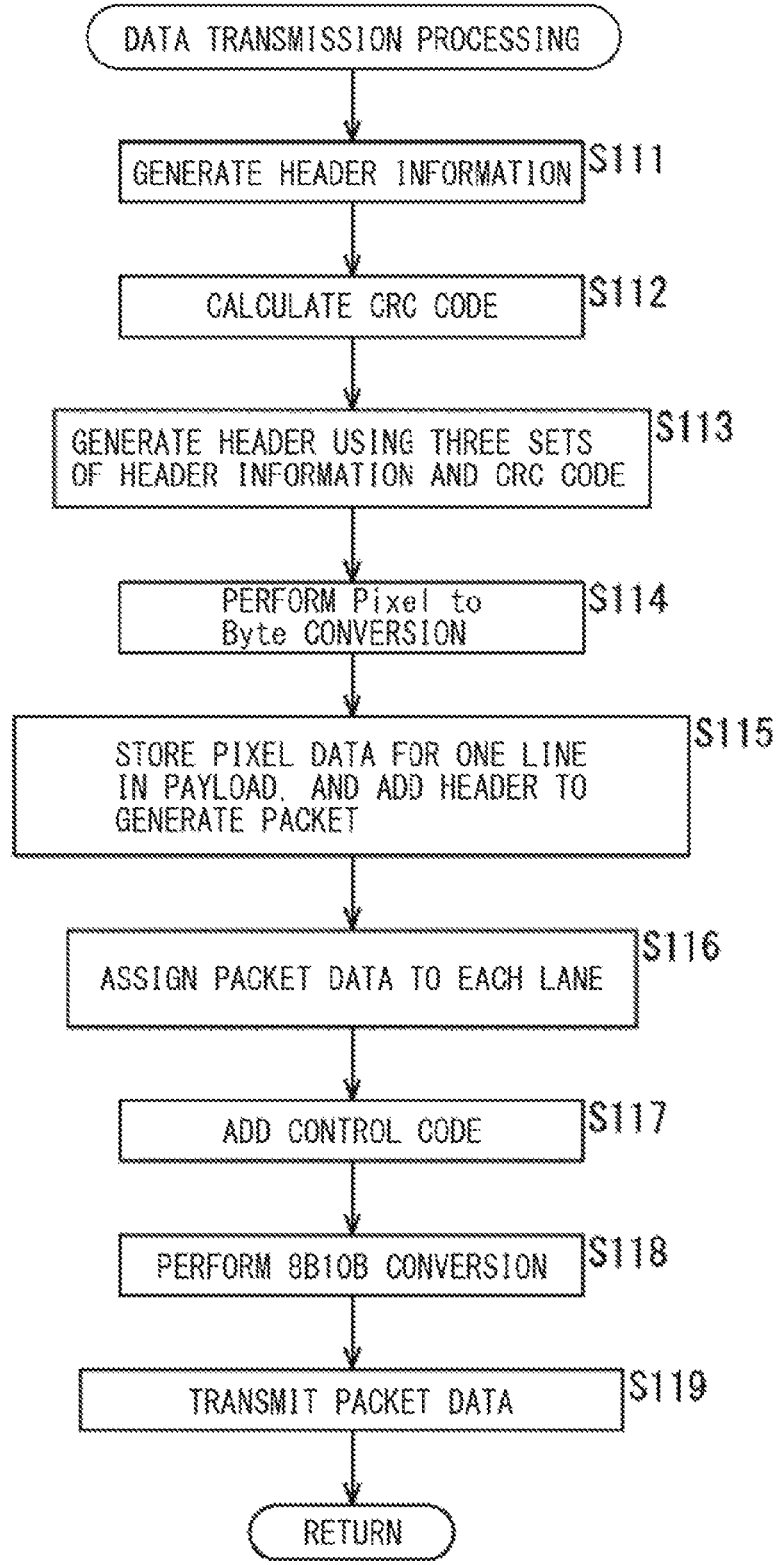
FIG. 39 is a flowchart that describes data transmission processing performed in step S102 of FIG. 38.

Next, description is given of data transmission processing performed in step S102 of FIG. 38 with reference to the flowchart of FIG. 39.

In step S111, the header generation part 172 generates the header information including the Frame Start, the Frame End, the Line Valid, the Line Number, and the Reserved.

In step S112, the header generation part 172 applies the header information to the generator polynomial to calculate the CRC code.

In step S113, the header generation part 172 adds the CRC code to the header information to thereby generate a set of the header information and the CRC code, and repeatedly arranges the same three sets of the header information and the CRC code to thereby generate the header.

In step S114, the Pixel to Byte conversion section 162 acquires the pixel data supplied from the frame data input section 152 to perform Pixel to Byte conversion. The Pixel to Byte conversion section 162 outputs payload data generated by grouping pieces of pixel data in a byte unit obtained by the Pixel to Byte conversion, adding payload stuffing data, and the like. A parity is appropriately inserted into the payload data by the payload ECC insertion section 163.

In step S115, the packet generation section 164 generates a packet on the basis of the payload data including the pixel data for one line and the header generated by the header generation part 172 to output packet data included in one packet.

In step S116, the lane distribution section 165 assigns the packet data supplied from the packet generation section 164 to a plurality of lanes used for data transmission.

In step S117, the control code insertion part 191 adds a control code to the packet data supplied from the lane distribution section 165.

In step S118, the 8B10B symbol encoder 192 performs the 8B10B conversion of the packet data to which the control code is added to output the packet data converted into 10-bit unit data.

In step S119, the synchronization part 193 outputs the packet data supplied from the 8B10B symbol encoder 192 in accordance with the clock signal generated by the clock generation section 182, and causes the transmission part 194 to transmit the packet data. Pieces of processing in steps S117 to S119 are performed in parallel by the signal processing sections 183-0 to 183-N. When the transmission of the pixel data for one line is finished, the processing returns to step S102 of FIG. 38, and subsequent pieces of processing are performed.

Figure 40:
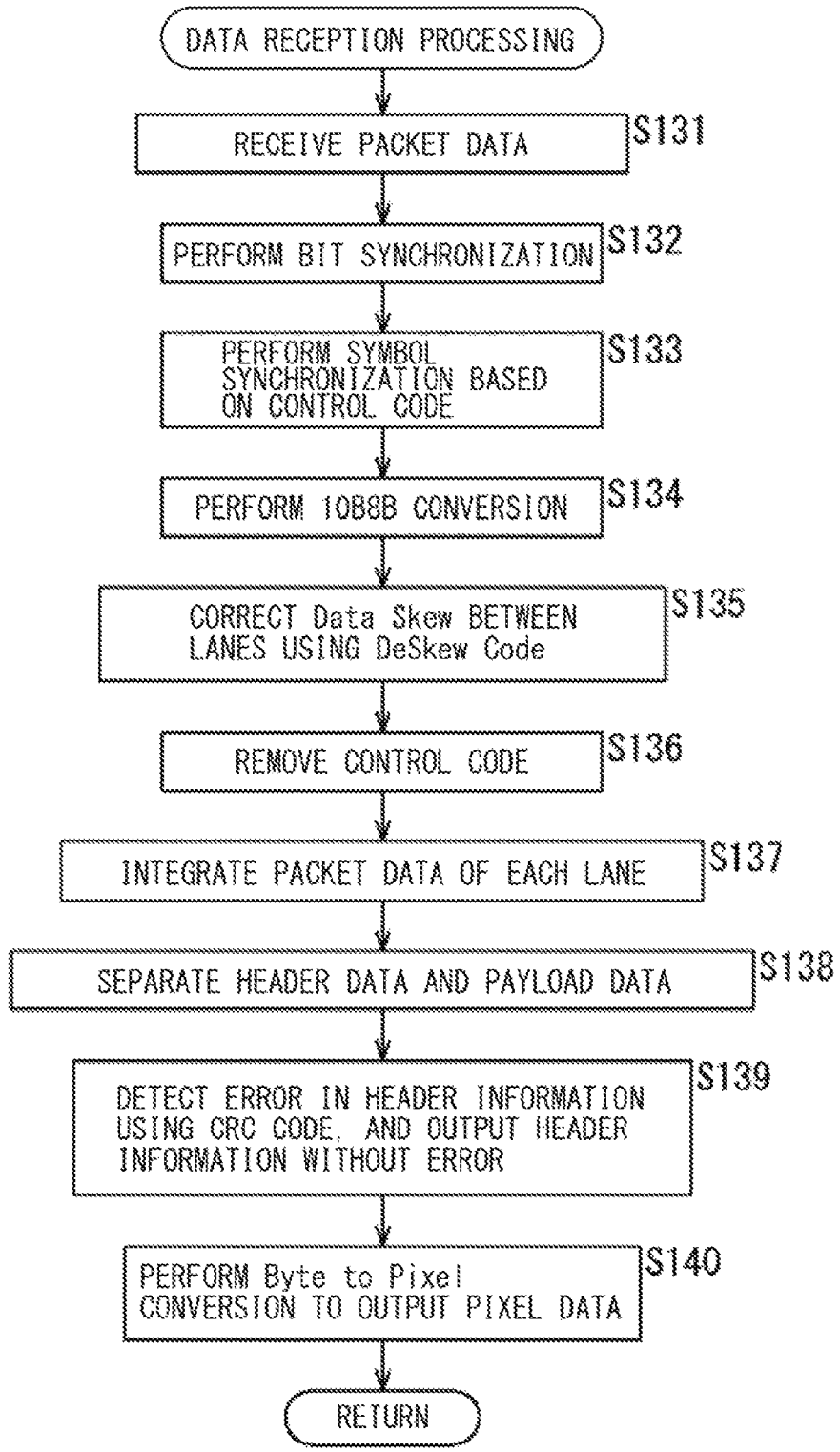
FIG. 40 is a flowchart that describes data reception processing performed in step S103 of FIG. 38.

Next, description is given of data reception processing performed in step S103 of FIG. 38 with reference to the flowchart of FIG. 40.

In step S131, the reception part 211 receives a signal representing the packet data transmitted from the transmission unit 122. Pieces of processing of steps S131 to S136 are performed in parallel by the signal processing sections 202-0 to 202-N.

In step S132, the clock generation part 212 detects an edge of a signal supplied from the reception part 211 to thereby perform bit synchronization. The synchronization part 213 samples the signal received by the reception part 211 to output the packet data to the symbol synchronization part 214.

In step S133, the symbol synchronization part 214 detects the control code included in the packet data, for example, to perform symbol synchronization.

In step S134, the 10B8B symbol decoder 215 carries out the 10B8B conversion on the packet data after the symbol synchronization to output the packet data converted into 8-bit unit data.

In step S135, the skew correction part 216 detects Deskew Code, and corrects Data Skew between lanes to match a timing of the Deskew Code with a timing indicated by the information supplied from the PHY-RX state control section 201, as described above.

In step S136, the control code removal part 217 removes the control code added to the packet data.

In step S137, the lane integration section 222 integrates the pieces of packet data supplied from the signal processing sections 202-0 to 202-N.

In step S138, the packet separation section 223 separates the packet data integrated by the lane integration section 222 into the packet data included in the header data and the packet data included in the payload data.

In step S139, the header error correction part 232 performs an error detection operation using the CRC code on each set of the header information and the CRC code, as a target, included in the pieces of header data separated by the packet separation section 223. In addition, the header error correction part 232 selects and outputs header information without an error on the basis of an error detection result of each set and a comparison result between pieces of data obtained by the error detection operation.

In step S140, the Byte to Pixel conversion section 225 performs Byte to Pixel conversion of the payload data, and outputs 8-bit, 10-bit, 12-bit, 14-bit, or 16-bit unit pixel data. The payload error correction section 224 appropriately performs error correction using a parity on the payload data to be subjected to the Byte to Pixel conversion.

When the processing of the pixel data for one line is finished, the processing returns to step S103 of FIG. 38, and subsequent pieces of processing are performed.

As described above, data transmission between the image sensor 111 and the DSP 112 is performed using a packet format in which one line of one frame corresponds to one packet.

The packet format used for the data transmission between the image sensor 111 and the DSP 112 can be said to be a format that minimizes transmission of the header information and the control codes that indicate a packet boundary, such as the Start Code and the End Code, thus making it possible to prevent a decrease in transmission efficiency. Suppose that a packet format is employed in which the pixel data stored in the payload of one packet is less than one line, more packets need to be transmitted in order to transmit pixel data of the entire one frame, thus resulting in a decrease in the transmission efficiency due to the increased number of the header information and the control codes to be transmitted.

In addition, preventing the decrease in the transmission efficiency enables suppression of transmission latency, thus making it possible to achieve a high-pixel and high-frame-rate interface that is required to transmit a large amount of image data at high speed.

By adopting a packet format which assumes that error correction is performed on side of the reception unit 131 by increasing reliability/redundancy of the transmission, it becomes possible to secure measures against the transmission error in the header information. The transmission of synchronization information, or the like of Frame/Line (V/H) is performed using the header information, and thus loss of the header information due to the transmission error may possibly cause a large failure in the system, which, however, is able to be prevented.

In addition, it is also possible to suppress an increase in mounting costs and power consumption for securing measures against the transmission error in the header information. That is, in the packet format used for the data transmission between the image sensor 111 and the DSP 112, the addition of the CRC code enables the DSP 112 to detect presence or absence of the transmission error in the header information. In addition, the transmission of three sets of the header information and the CRC code enables the DSP 112 to make a correction into correct header information in a case where a transmission error occurs in the header information.

Suppose that an error-correcting code is used as measures against the transmission error in the header information, it is necessary to prepare a circuit that calculates the error-correcting code in the transmission unit 122 and to prepare a circuit that performs the error correction operation in the reception unit 131. The CRC code which is the error-detecting code is added to the header information, thus making it possible to reduce the circuit size and power consumption, as compared with the case where the circuit is prepared that performs the operation related to the error correction. In addition, the reception unit 131 does not request the transmission unit 122 to retransmit the header information in a case of detecting an error in the header information, thus making it unnecessary to prepare a transmission path in a reverse direction for the retransmission request.

Increasing the redundancy and constructing the control code by combination of the plurality of K Characters of the 8B10B code enable reduction in error probability in the control code, thereby making it possible to secure measures against the transmission error in the control code using a relatively simple circuit.

Specifically, although a combination of four symbols including three types of K Characters is used for the Start Code, the reception unit 131 is able to specify the Start Code as long as at least a symbol other than K28.5 can be detected; thus, it can be said that a tolerance for the transmission error is high. The same applies also to the End Code.

In addition, although a combination of four types of K Characters is used for the Pad Code, assigning more types of K Characters than other control codes makes it possible to increase the error tolerance than other control codes. That is, the reception unit 131 is able to specify the Pad Code as long as one type of symbol of the four types thereof can be detected. The Pad Code has higher degree of frequency of the transmission than those of the Start Code and the End Code, and thus is configured to increase the error tolerance more.

Further, transmitting the same control code at the same timing for each lane makes it possible to reproduce a control code in which an error occurs, using a control code of another lane even in a case where the control code is lost due to occurrence of the transmission error in one lane.

In addition, because of the limited number of the K Characters, minimum necessary K Characters are combined to construct each control code. For example, a data structure is used that eliminates the need to assign an additional K Character, for the Sync Code, the Deskew Code, and the Standby Code that relatively tolerate the transmission error by repetitive transmission.

The control code necessary for resynchronization is assigned to each one packet (one line), thus making it possible to quickly perform the resynchronization in a case where bit synchronization is lost due to disturbance such as static electricity, noise, or the like. In addition, it is possible to minimize the influence of the transmission error due to the synchronization loss.

Specifically, detecting transition/edge of bit data after the 8B10B conversion in CDR implemented by the clock generation part 212 and the synchronization part 213 makes it possible to perform the bit synchronization. It follows that, when the transmission unit 122 continues to send data, it is possible to perform the bit synchronization within the expected CDR-lock time.

In addition, even in a case where the symbol synchronization is lost, detecting a specific K Character (K28.5) in the symbol synchronization part 214 makes it possible to quickly perform the resynchronization. K28.5 is used for each of the Start Code, the End Code, and the Deskew Code, thus making it possible to perform symbol synchronization at three locations during a period of transmission of the packet data for one packet.

In addition, enabling the correction of the Data Skew between lanes using the Deskew Code also makes it possible to perform synchronization between the lanes.

By performing, in the link layer, parallel processing on the pieces of packet data in a group unit of 16 pieces (16-byte unit, in a case of the example of FIG. 26), or the like, it is possible to suppress the circuit size and the memory amount, as compared with a case where the packet data is processed one by one in one clock cycle. In terms of mounting, it is possible to suppress the circuit size and the like in a case of collectively processing the packet data for each predetermined unit as compared with a case of processing the packet data one by one. Enabling suppression of the circuit size makes it possible to suppress power consumption as well.

In addition, upon lane assignment, assigning successive pieces of packet data to different lanes makes it possible to enhance the error tolerance. Even in a case where an error occurs in a certain lane across successive pieces of packet data of the number exceeding an error correction capacity of the parity, lane coupling made in the reception unit 131 allows for dispersion of the positions of the pieces of packet data in which errors have occurred, which may enable error correction using the parity in some cases. The error correction capacity by the parity is determined by length of the parity.

Further, by performing ECC processing at an upper level than lane distribution and lane integration, with a lane closer to the physical layer being set as a lower level, it becomes possible to reduce circuit sizes of the transmission unit 122 and the reception unit 131. For example, in a case where the parity of the ECC is inserted into the payload after the packet data is assigned to each lane in the transmission unit 122, the payload ECC insertion section 163 needs to be prepared for each lane, resulting in a larger circuit size; however, it is possible to prevent such a result.

Although the parallel processing of the packet data is performed in a plurality of circuits in the physical layer, sharing the PHY-TX state control section 181 and the clock generation section 182 makes it possible to achieve simplification of the circuits as compared with a case where the circuits are prepared for the respective lanes. In addition, using a protocol not to transmit different control codes for respective lanes makes it possible to achieve simplification of the circuits that process pieces of packet data of the respective lanes.

<Switching of Number of Lanes>

The transmission of the same control code in each lane at the same timing is performed not only at the time of normal data transmission but also in a case of switching the number of lanes, for example. Even in the case of switching the number of lanes, states of all active lanes (lanes used for data transmission) are the same.

Figure 41:
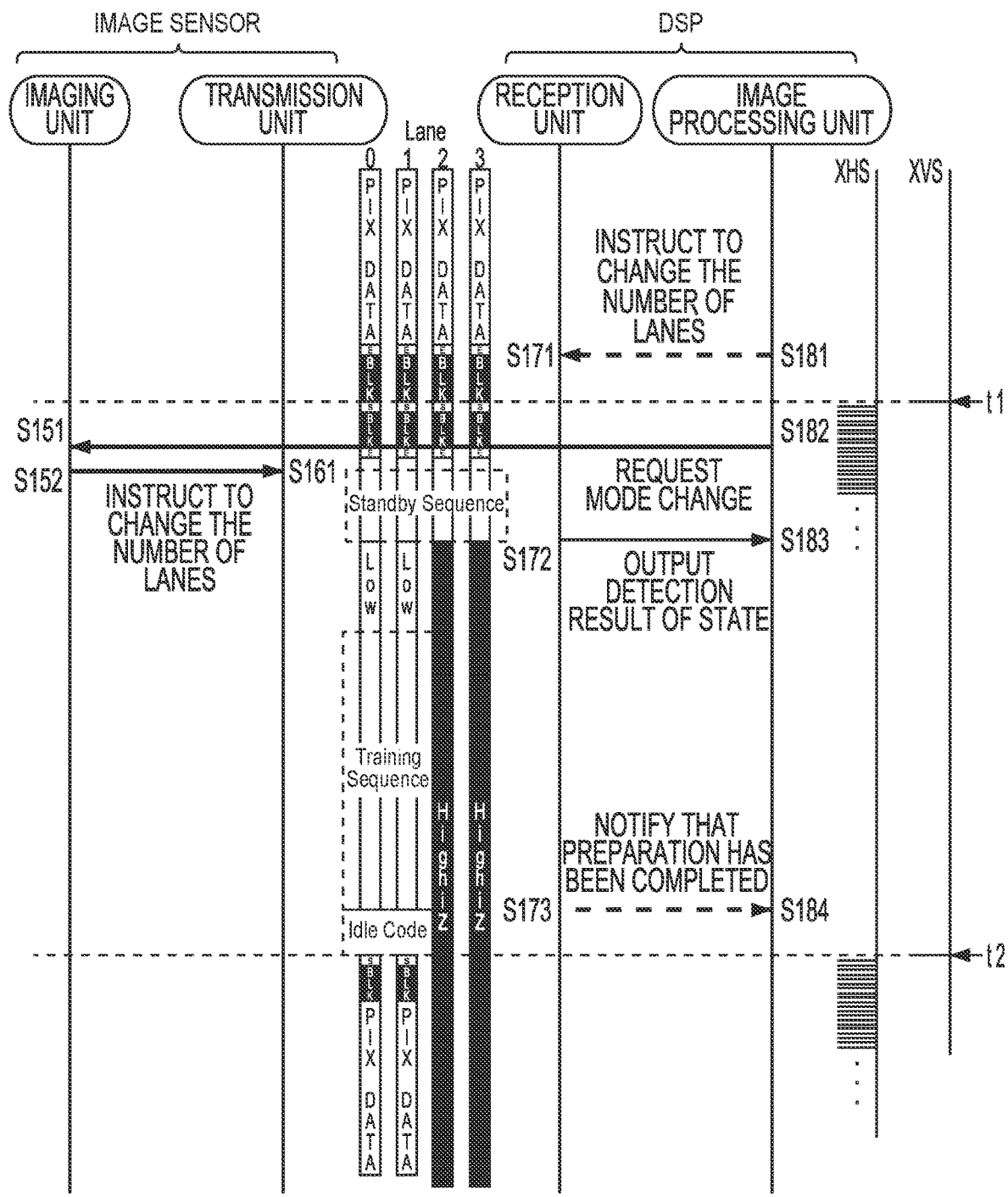
FIG. 41 illustrates a control sequence in a case of switching the number of lanes.

FIG. 41 illustrates a control sequence in the case of switching the number of lanes.

FIG. 41 illustrates, on right side, timings of a vertical synchronization signal (XVS) and a horizontal synchronization signal (XHS). Description is given of a case where pixel data of each line included in a one-frame image is transmitted in accordance with the horizontal synchronization signal until the clock time t1 at which the vertical synchronization signal is detected, and where lanes that are active are changed from four lanes to two lanes at a timing of the clock time t1. Until the clock time t1, four lanes are used for the data transmission.

FIG. 41 illustrates, at approximately the middle, a state of each lane in a longitudinal direction. "PIX DATA" denotes that pixel data is being transmitted in a lane to which the letters are attached. "E", "BLK", and "S" subsequent to the "PIX DATA" denote the Frame End, the blanking period, and the Frame Start, respectively.

In a case where the transmission of the pixel data of a frame to be transmitted in one frame period until the clock time t1 is finished, the image processing unit 132 instructs the reception unit 131 to switch the number of lanes from four to two in step S181. The instruction by the image processing unit 132 is received by the reception unit 131 in step S171.

At the clock time t1, the image processing unit 132 requests the imaging unit 121 of the image sensor 111 to change modes in step S182. The request to change modes transmitted to the imaging unit 121 also includes information indicating switching the number of lanes from four to two. Although not illustrated in FIG. 1 or other drawings, a transmission path is provided, between the imaging unit 121 and the image processing unit 132, for the image processing unit 132 to transmit, to the imaging unit 121, information on set values related to imaging, such as shutter speed and gain. The request to change modes is also transmitted to the imaging unit 121 via this transmission path.

In step S151, the imaging unit 121 receives the request to change modes from the image processing unit 132, and instructs the transmission unit 122 to switch the number of lanes from four to two in step S152. The instruction from the imaging unit 121 is received by the transmission unit 122 in step S161.

Standby Sequence is performed between the transmission unit 122 and the reception unit 131, and the Standby Code is repeatedly transmitted from the transmission unit 122 to the reception unit 131 using the Lanes 0 to 3. In a case where the Standby Sequence is finished, a detection result of the state is outputted from the reception unit 131 in step S172, and is received by the image processing unit 132 in step S183. In addition, the Lane 0 and the Lane 1 that maintain active states are brought into Low state, and Lane 2 and Lane 3 that finish the data transmission are brought into the state of High-Z.

Training Sequence is performed between the transmission unit 122 and the reception unit 131, and the Sync Code is repeatedly transmitted from the transmission unit 122 to the reception unit 131 using the Lane 0 and the Lane 1. Bit synchronization is performed in the reception unit 131, and symbol synchronization is performed by detection of the Sync Code.

When the Training Sequence is finished, the reception unit 131 notifies the image processing unit 132, in step S173, that the preparation has been completed. The notification by the reception unit 131 is received by the image processing unit 132 in step S184 to finish a series of control sequences in the case of switching the number of lanes.

In this manner, in the control sequence to switch the number of lanes, the Standby Code is transmitted at the time of the Standby Sequence even in the Lanes 2 and 3, in which the data transmission is finished, to have the same states as those of the Lanes 0 and 1 subsequently used for the data transmission. For example, the Lanes 2 and 3 are considered to remain as they are in the state of High-Z without transmitting the Standby Code, which results in being brought into a state different from that of the lane to be subsequently used for data transmission, thus requiring complicated control.

<Another Configuration of Transmission Unit 122 and Reception Unit 131>

Figure 42:
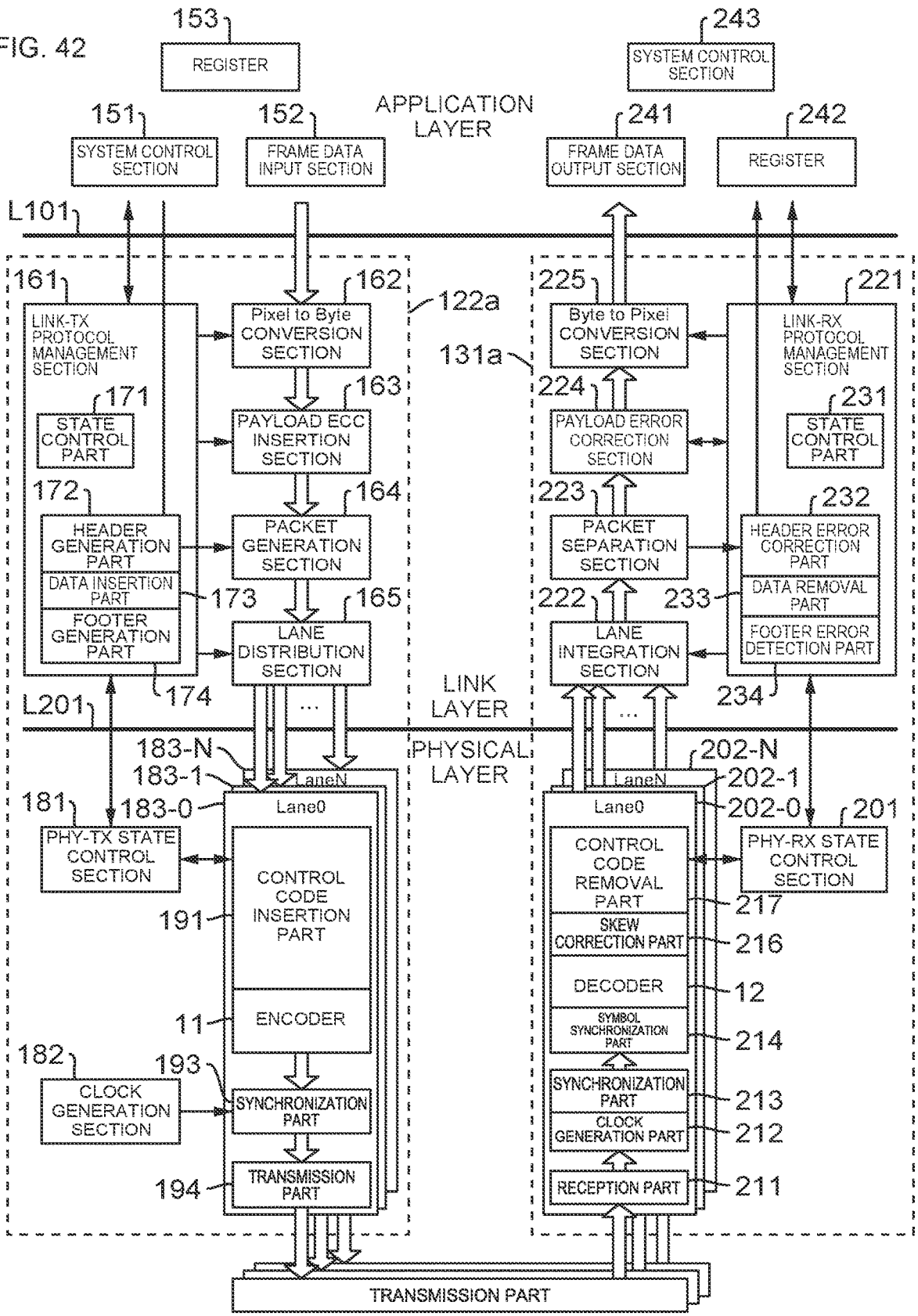
FIG. 42 illustrates another configuration example of the transmission system.

FIG. 42 illustrates another configuration example of the transmission unit 122 and the reception unit 131. In order to be distinguished from the transmission unit 122 illustrated in FIG. 17, the transmission unit illustrated in FIG. 42 is described as a transmission unit 122a. Likewise, in order to be distinguished from the reception unit 131 illustrated in FIG. 17, the transmission unit illustrated in FIG. 42 is described as a reception unit 131a.

When comparing the transmission unit 122 illustrated in FIG. 17 and the transmission unit 122a illustrated in FIG. 42 with each other, they differ from each other in that the 8B10B symbol encoder 192 of the transmission unit 122 is replaced by the encoder 11, but other components are configured similarly. When comparing the reception unit 131 illustrated in FIG. 17 and the reception unit 131a illustrated in FIG. 42 with each other, they differ from each other in that the 10B8B symbol decoder 215 of the reception unit 131 is replaced by the decoder 12, but other components are configured similarly. The similar components are denoted by the similar reference numerals, and descriptions thereof are omitted.

The encoder 11 and the decoder 12 described with reference to FIGS. 1 to 13 are applicable to the transmission system 100 that transmits and receives in accordance with the SLVS-EC specification. Specifically, as illustrated in FIG. 42, the encoder 11 is applicable to a part that encodes (encoding) data included in the signal processing section 183 inside the transmission unit 122a. In addition, as illustrated in FIG. 42, the decoder 12 is applicable to a part that decodes (decoding) data included in the signal processing section 202 inside the reception unit 131a.

Also in a case where the encoder 11 or the decoder 12 is applied to the transmission system 100 that performs transmission and reception in accordance with the SLVS-EC specification, encoding or decoding is performed as described with reference to FIGS. 1 to 13, and therefore descriptions thereof are omitted. More specific description is given here of each processing of the encoder 11 and the decoder 12 when performing transmission and reception in accordance with the SLVS-EC specification.

In a case where data is transmitted and received in accordance with the SLVS-EC specification, the data is divided into an N-bit block and an M-bit block as illustrated in B of FIG. 2, and processing is performed using one N-bit block and one M-bit block as one processing unit. In addition, as described with reference to FIGS. 33 and 34, a control code, in addition to data to be transmitted, is also inputted to the encoder 11 (the 8B10B symbol encoder 192 in FIG. 17).

Unlike the data to be transmitted (hereinafter, referred to as information transmission data appropriately, in order to be distinguished from the control code), the control code is a code having a special role of controlling communication, and thus is distinguished from the information transmission data for processing when encoding is performed by the encoder 11.

Figure 43:
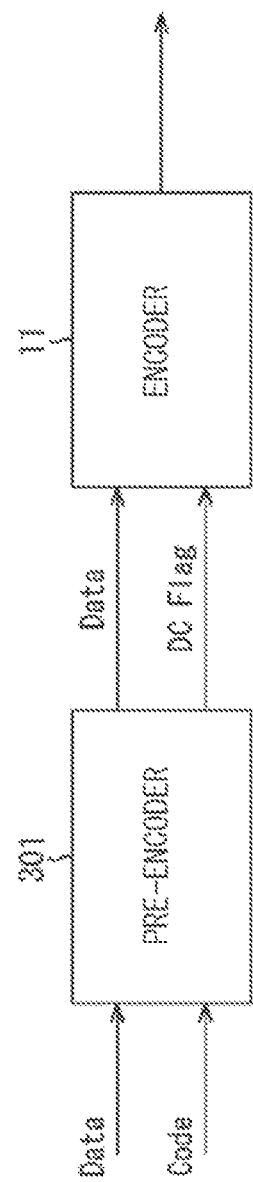
FIG. 43 illustrates a configuration example of an encoder provided with a pre-encoder.

As illustrated in FIG. 43, a pre-encoder 301, which performs pre-encoding in which processing is performed to distinguish the control code and the information transmission data from each other and to divide the data into N bits or M bits, is added to the front portion of the encoder 11. It is to be noted that, although the pre-encoder 301 and the encoder 11 are illustrated separately in FIG. 43, the pre-encoder 301 may also be included in a portion of the encoder 11.

The pre-encoder 301 is supplied with information transfer data (referred to as Data in the drawing) from the lane distribution section 165 (FIG. 42) and with a control code (referred to as Code in the drawing) from the control code insertion part 191. The pre-encoder 301 divides (converts) the inputted information transfer data or control code into N bits or M bits to supply the data or the code to the encoder 11. In addition, the pre-encoder 301 supplies the encoder 11 with a flag (hereinafter, referred to as a DC flag) indicating whether the supplied data is the information transfer data or the control code.

Here, reference is made again to FIG. 33. For example, referring to the Start Code as the control code, the Start Code is represented by four symbols of K28.5, K27.7, K28.2, and K27.7 which are a combination of three types of K Characters. Because one symbol is of 8 bits, the Start Code is a 32-bit code. Likewise, another control code is also configured by 32 bits.

The N bits and the M bits upon encoding may be set depending on the number of bits of the control code. Assume that the N-bit is set to 31 bits and the M bit is set to 33 bits in a case where the control code is of 32 bits. In such a case, (N+M) bits are set to 64 bits. In addition, a one-bit flag is added to the N bit, and thus one N-bit block is of 32 bits, and a one-bit flag is added to the M bits, and thus one M-bit block is of 34 bits.

Although, in the following description, description is given by exemplifying a case where N=31 and M=33 hold true, the present technology is applicable even when other number of bits are adopted. In addition, in the following, the description is continued, with (N+M)=64 bits being set as one processing unit. Of the 64 bits as the one processing unit, 32 bits of the first half to be inputted to the pre-encoder 301 are described as a first half block, and 32 bits of the second half are described as a second half block.

A data string to be converted into N bits (31 bits) by the pre-encoder 301 and to be outputted to the encoder 11 is described as a first block, and a data string to be converted into M bits (33 bits) and to be outputted to the encoder 11 is described as a second block.

Here, the pre-encoder 301 is described as dividing the inputted one processing unit data into the N-bit (31-bit) first block and then into the M-bit (33-bit) second block; however, it may also be possible to divide the data into an M-bit block and then into an N-bit block.

The pre-encoder 301 is supplied with 64-bit data of the first half block and the second half block. Each of the first half block and the second half block is the information transmission data or the control code, and thus there are the following four combinations thereof.

Case 1: first half block being information transmission data+second half block being information transmission data Case 2: first half block being information transmission data+second half block being control code Case 3: first half block being control code+second half block being information transfer data Case 4: first half block being control code+second half block being control code Description is given of each processing of the pre-encoder 301 and the encoder 11 for each of Cases 1 to 4.

<Concerning Encoding in Case 1>

Figure 44:
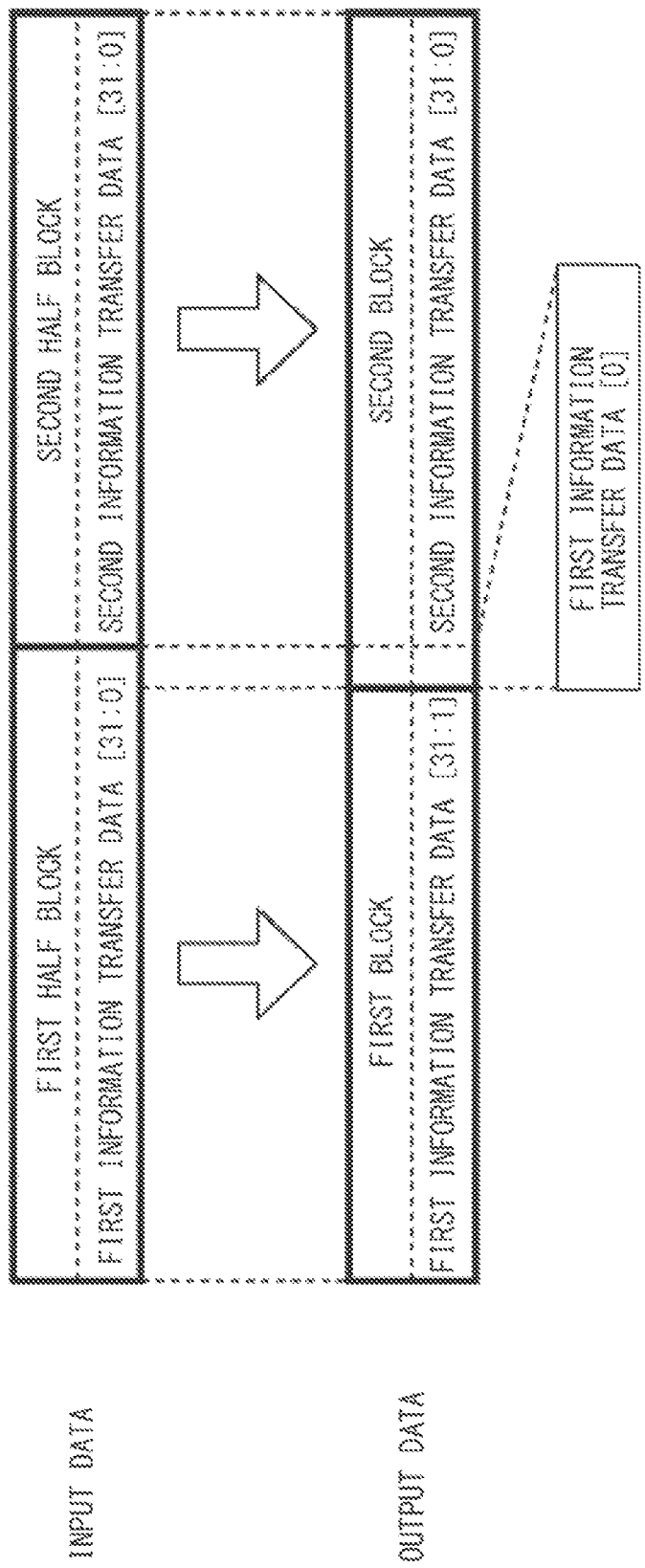
FIG. 44 is an explanatory diagram of conversion in Case 1.

Description is given of pre-encoding and encoding in Case 1 with reference to FIG. 44. Case 1 is a case where each of pieces of 64-bit data to be inputted to the pre-encoder 301 is information transfer data and where the data is divided into a first block of the information transfer data and a second block of the information transfer data.

That is, in Case 1, first information transfer data [31:0] as a 32-bit first half block and second information transfer data [31:0] as a 32-bit second half block are inputted to the pre-encoder 301.

The pre-encoder 301 outputs, as the first block, 31-bit information transfer data [31:1] of the first information transfer data [31:0] of the inputted 32-bit first half block, to the encoder 11.

The pre-encoder 301 allocates first information transfer data [0], which is the last bit of the inputted 32-bit first information transfer data [31:0], to the second block. In addition, 33 bits, in which the 32-bit second information transfer data [31:0] of the second half block is added to the rear of the first information transfer data [0], are outputted as the second block to the encoder 11.

In other words, the pre-encoder 301 divides the inputted 64-bit data string into first information transfer data [31:1] that constitutes first half 31 bits of the inputted 64 bits and 33 bits, which is a combination of the remaining one-bit first information transfer data [0] and the second information transfer data [31:0] that constitutes second half 32 bits of the inputted 64 bits.

When outputting the first block, which is the information transfer data, to the encoder 11, the pre-encoder 301 also supplies the encoder 11 with also a DC flag indicating that the first block is the information transfer data.

In a case where the supplied DC flag indicates the information transfer data, the encoder 11 performs encoding, in which the running disparity RD or the run length RL is controlled, on the supplied first block data, as described with reference to FIGS. 1 to 13. That is, processing is executed to add a flag indicating inversion of the first block data by the running disparity RD or the run length RL, or to add a flag indicating no inversion of the data.

The processing of the 31-bit first block by the encoder 11 allows for the addition of a one-bit flag, and thus data outputted from the encoder 11 is 32-bit data.

Likewise, when outputting the second block, which is the information transfer data, to the encoder 11, the pre-encoder 301 also supplies the encoder 11 with a DC flag indicating that the second block is the information transfer data.

In a case where the supplied DC flag indicates the information transfer data, the encoder 11 performs encoding, in which the running disparity RD or the run length RL is controlled, on the supplied second block of data, as described with reference to FIGS. 1 to 13. That is, processing is executed to add a flag indicating inversion of the second block data by the running disparity RD or the run length RL, or to add a flag indicating no inversion of the data.

The processing of a 33-bit second block by the encoder 11 allows for the addition of a one-bit flag, and thus data outputted from the encoder 11 is 34-bit data.

<Concerning Encoding in Case 2>

Figure 45:
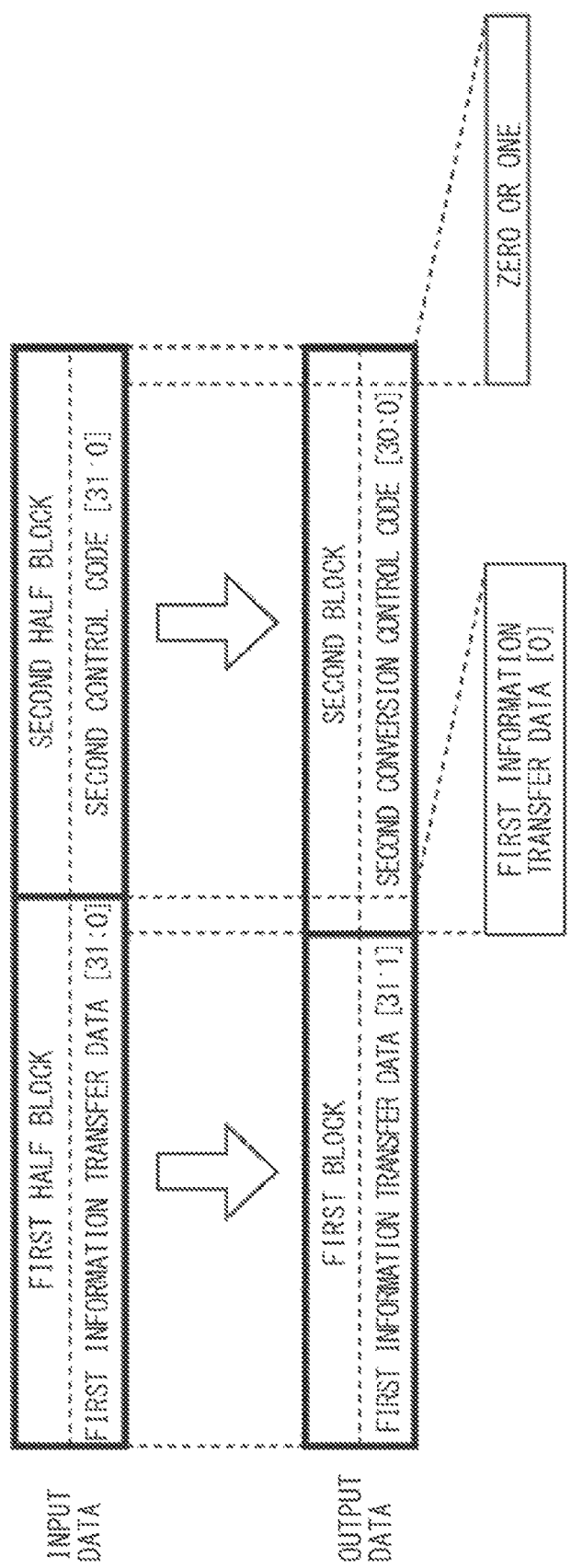
FIG. 45 is an explanatory diagram of conversion in Case 2.

Description is given of pre-encoding and encoding in Case 2 with reference to FIG. 45. Case 2 is a case where the first half block of 64-bit data inputted to the pre-encoder 301 is information transfer data and the second half block thereof is the control code and where the data is divided into the first block of the information transfer data and the second block of the control code.

That is, in Case 2, the first information transfer data [31:0] as the 32-bit first half block and a second control code [31:0] as the 32-bit second half block are inputted to the pre-encoder 301.

The pre-encoder 301 outputs, as the first block, 31-bit information transfer data [31:1] of the first information transfer data [31:0] of the inputted 32-bit first half block, to the encoder 11.

The pre-encoder 301 allocates the first information transfer data [0], which is the last bit of the inputted 32-bit first information transfer data [31:0], to the second block. In addition, the pre-encoder 301 adds, to the rear of the first information transfer data [0], the second conversion control code "30:0", in which the 32-bit second control code [31:0] of the second half block is converted into 31 bits, to convert it into a 32-bit data string, and further generates a 33-bit second block for outputting to the encoder 11.

In other words, the pre-encoder 301 divides the inputted 64-bit data string into the first information transfer data [31:1] that constitutes the first half 31 bits of the inputted 64 bits and the 33-bit second block thereof. The 33-bit second block is a data string including the remaining one-bit first information transfer data [0] of the first information transfer data [31:0], a second control code [30:0] in which the second control code [31:0] constituting the second half 32 bits of the inputted 64 bits is converted into a 31-bit control code, and an inverted bit of the first information transfer data [0].

Adding the first information transfer data [0] and the inverted bit of the first information transfer data [0] to the front and the rear of the second block allows the running disparity RD of the second block to be set to zero.

In addition, the inputted 32-bit control code is converted into the 31-bit control code. The inputted 32-bit control code is, for example, a control code corresponding to the above-described 8B10B encoding, and has the symbol configuration described with reference to FIG. 33, for example. Description is given of the inputted 32-bit control code and the 31-bit control code after the conversion with reference to FIG. 46.

In the following description, the encoding described with reference to FIGS. 1 to 13 is referred to as inversion encoding in order to distinguish between the 8B10B encoding and the encoding described with reference to FIGS. 1 to 13.

Examples of the control code in the 8B10B encoding (described as 8 b code in FIG. 46) include the Idle Code, the Start Code, the End Code, the Pad Code, the Sync Code, the Deskew Code, and the Standby Code as described with reference to FIG. 33.

The Idle Code is represented by D00.0 (00000000) of the D Character which is the 8B10B Code. The Idle Code is a data string in which all of 32 bits are "0" in the 8 b code. The running disparity RD of the Idle Code is "−32". In the inversion encoding (referred to as INV in the drawing) of the Idle Code, all of the first symbol (1st symbol) and the second symbol (2nd symbol) are "0", and all of bits other than the last one of the third symbol (3rd symbol) and the fourth symbol (4th symbol) are "1".

In the inversion encoding, the last one bit of the fourth symbol in the 8 b code is not used, and thus a 31-bit control code is obtained. In a case of the control code, "1" is assigned as a flag in the encoder 11. The flag of "1" indicates that data has been inverted; however, in the case of the control code, the flag is also set to "1", indicating that the data is the control code. In the case of the control code, the encoder 11 sets the flag to "1", but the data is not inverted.

In the case of the control code, the flag is set to "1", and thus the running disparity RD of the Idle Code in the inversion encoding including this flag is set to zero. As described below, the control code in the inversion encoding is set to allow the running disparity RD to be set to zero in 32 bits including the flag.

The data string described at a location of Inversion Inhibition of Inv in the Idle Code of FIG. 46 is a data string in which the Idle Code in the inversion encoding is inverted. That is, the first symbol (1st symbol) and the second symbol (2nd symbol) are all "1", and all of bits other than the last one of the third symbol (3rd symbol) and the fourth symbol (4th symbol) are "0". When such a data string is inputted as the information transfer data to the pre-encoder 301 (or the encoder 11), set as data to be inverted, and inverted, such a data results in being the same data string as that of the Idle Code.

Such a data string as to result in the same data string as that of the control code is set as an inversion-inhibited data string. Therefore, in a case where such an inversion-inhibited data string is inputted, the encoder 11 sets "0" as a flag to set it as a non-inverted data string. The data string set to be the inversion-inhibited is also a data string in which the running disparity RD including up to "0" as the flag is "0".

In the 8 b code, the Start Code is represented by four symbols of K28.5, K27.7, K28.2, and K27.7 which are a combination of three types of K Characters. The running disparity RD of the Start Code in the 8 b code is "14". The first symbol of the Start Code in the inversion encoding is "00111100", the second symbol is "11111010", the third symbol is "11000011", and the fourth symbol is "0000010".

The Start Code in the inversion encoding is also a 31-bit control code because the last one bit of the fourth symbol in the 8 b code is not used. In addition, the Start Code is also a control code, and thus "1" is assigned as a flag to the encoder 11. Therefore, the running disparity RD of the Start Code in the inversion encoding including the flag is zero.

In addition, an inversion-inhibited data string of the Start Code is also set; the data string to be the same as the Start Code through inversion is set as a data string not to be inverted. In a case where the inversion-inhibited data string of the Start Code is also inputted as the information transfer data to the encoder 11, "0" is set as a flag, and is processed as a non-inverted data string. The data string set to be the inversion-inhibited is also the data string in which the running disparity RD including up to "0" as the flag is "0".

The End Code is represented by four symbols of K28.5, K29.7, K30.7, and K29.7 which are a combination of three types of K Characters. The running disparity RD of the End Code in the 8 b code is "20". The first symbol of the End Code in the inversion encoding is "00111100", the second symbol is "11111100", the third symbol is "11000011", and the fourth symbol is "0000001".

The End Code in the inversion encoding is also a 31-bit control code because the last one bit of the fourth symbol in the 8 b code is not used. In addition, the End Code is also a control code, and thus "1" is assigned as a flag to the encoder 11. Therefore, the running disparity RD of the End Code in the inversion encoding including the flag is zero.

In addition, an inversion-inhibited data string of the End Code is also set; the data string to be the same as the End Code through inversion is set as a data string not to be inverted. In a case where the inversion-inhibited data string of the End Code is also inputted as the information transfer data to the encoder 11, "0" is set as a flag, and is processed as a non-inverted data string. The data string set to be the inversion-inhibited is also the data string in which the running disparity RD including up to "0" as the flag is "0".

The Pad Code is represented by four symbols of K23.7, K28.4, K28.6, and K28.3 which are a combination of three types of K Characters. The running disparity RD of the Pad Code in the 8 b code is "10". The first symbol of the Pad Code in the inversion encoding is "01110111", the second symbol is "10011100", the third symbol is "10001000", and the fourth symbol is "0110001".

The Pad Code in the inversion encoding is also a 31-bit control code because the last one bit of the fourth symbol in the 8 b code is not used. In addition, the Pad Code is also a control code, and thus "1" is assigned as a flag to the encoder 11. Therefore, the running disparity RD of the Pad Code in the inversion encoding including the flag is zero.

In addition, an inversion-inhibited data string of the Pad Code is also set; the data string to be the same as the Pad Code through inversion is set as a data string not to be inverted. In a case where the inversion-inhibited data string of the Pad Code is also inputted as the information transfer data to the encoder 11, "0" is set as a flag, and is processed as a non-inverted data string. The data string set to be the inversion-inhibited is also the data string in which the running disparity RD including up to "0" as the flag is "0".

The Sync Code is represented by four symbols including a combination of K28.5 of K Character and D10.5 of D Character in the 8 b code. In FIG. 33, the description has been given using Any ** as denoting that any type of symbols may be used, whereas, in FIG. 46, a specific case is exemplified where D10.5 of D Character is used.

The running disparity RD of the Sync Code in the 8 b code is "2". The first symbol of the Sync Code in the inversion encoding is "00111100", the second symbol is "10101010", the third symbol is "11000011", and the fourth symbol is "0101010".

The Sync Code in the inversion encoding is also a 31-bit control code because the last one bit of the fourth symbol in the 8 b code is not used. In addition, the Sync Code is also a control code, and thus "1" is assigned as a flag to the encoder 11. Therefore, the running disparity RD of the Sync Code in the inversion encoding including the flag is zero.

In addition, an inversion-inhibited data string of the Sync Code is also set; the data string to be the same as the Sync Code through inversion is set as a data string not to be inverted. In a case where the inversion-inhibited data string of the Sync Code is also inputted as the information transfer data to the encoder 11, "0" is set as a flag, and is processed as a non-inverted data string. The data string set to be the inversion-inhibited is also the data string in which the running disparity RD including up to "0" as the flag is "0".

The Deskew Code is represented by four symbols including a combination of K28.5 of K Character and D00.3 of D Character in the 8 b code. In FIG. 33, the description has been given using Any ** as denoting that any type of symbols may be used, whereas, in FIG. 46, a specific case is exemplified where D00.3 of D Character is used.

The running disparity RD of the Deskew Code in the 8 b code is "−10". The first symbol of the Deskew Code in the inversion encoding is "00111100", the second symbol is "01100000", the third symbol is "11000011", and the fourth symbol is "1001111".

The Deskew Code in the inversion encoding is also a 31-bit control code because the last one bit of the fourth symbol in the 8 b code is not used. In addition, the Deskew Code is also a control code, and thus "1" is assigned as a flag to the encoder 11. Therefore, the running disparity RD of the Deskew Code in the inversion encoding including the flag is zero.

In addition, an inversion-inhibited data string of the Deskew Code is also set; the data string to be the same as the Deskew Code through inversion is set as a data string not to be inverted. In a case where the inversion-inhibited data string of the Deskew Code is also inputted as the information transfer data to the encoder 11, "0" is set as a flag, and is processed as a non-inverted data string. The data string set to be the inversion-inhibited is also the data string in which the running disparity RD including up to "0" as the flag is "0".

The Standby Code is represented by four symbols including a combination of K28.5 of K Character and D03.0 of D Character in the 8 b code. In FIG. 33, the description has been given using Any  as denoting that any type of symbols may be used, whereas, in FIG. 46**, a specific case is exemplified where D03.0 of D Character is used.

The running disparity RD of the Standby Code in the 8 b code is "−10". The first symbol of the Standby Code in the inversion encoding is "00111100", the second symbol is "00000010", the third symbol is "11000011", and the fourth symbol is "111110".

The Standby Code in the inversion encoding is also a 31-bit control code because the last one bit of the fourth symbol in the 8 b code is not used. In addition, the Standby Code is also a control code, and thus "1" is assigned as a flag to the encoder 11. Therefore, the running disparity RD of the Standby Code in the inversion encoding including the flag is zero.

In addition, an inversion-inhibited data string of the Standby Code is also set; the data string to be the same as the Standby Code through inversion is set as a data string not to be inverted. In a case where the inversion-inhibited data string of the Standby Code is also inputted as the information transfer data to the encoder 11, "0" is set as a flag, and is processed as a non-inverted data string. The data string set to be the inversion-inhibited is also the data string in which the running disparity RD including up to "0" as the flag is "0".

In a case where such control codes are set, the pre-encoder 301 converts the inputted 8 b code into a code of the inversion encoding. When this conversion is performed, a table of correspondence between the control code in the 8 b code and the control code in the inversion encoding illustrated in FIG. 46 may be held and referred to appropriately for conversion. In addition, although the description is continued here on the assumption that conversion processing is included, the control code insertion part 191 may also be configured to insert the control code in the inversion encoding, and the pre-encoder 301 may also be configured not to perform the conversion.

Returning to the description with reference to FIG. 45, when outputting the first block, which is the information transfer data, to the encoder 11, the pre-encoder 301 also supplies the encoder 11 with the DC flag indicating that the first block is the information transfer data.

In a case where the supplied DC flag indicates the information transfer data, the encoder 11 performs encoding, in which the running disparity RD or the run length RL is controlled, on the supplied first block data, as described with reference to FIGS. 1 to 13. That is, processing is executed to add a flag indicating inversion of the first block data by the running disparity RD or the run length RL, or to add a flag indicating no inversion of the data.

It is to be noted that, in a case where the information transfer data is an inversion-inhibited data string, the pre-encoder 301 may determine whether or not the data is such an inversion-inhibited data string to output a result of the determination as the DC flag, and the encoder 11 may refer to the DC flag for the processing. Alternatively, in a case where the DC flag indicates the information transfer data, the encoder 11 may determine whether or not the information transfer data is in a form of the inversion-inhibited data string to execute processing in accordance with a result of the determination.

The processing of the 31-bit first block by the encoder 11 allows for the addition of a one-bit flag, and thus data outputted from the encoder 11 is 32-bit data.

Likewise, when outputting the second block including the second conversion control code to the encoder 11, the pre-encoder 301 also supplies the encoder 11 with a DC flag indicating that the second block is a control code.

In a case where the supplied DC flag indicates a control code, the encoder 11 sets the flag to "1", and adds it to the supplied 33-bit second block for outputting as 34-bit data.

<Concerning Encoding in Case 3>

Figure 47:
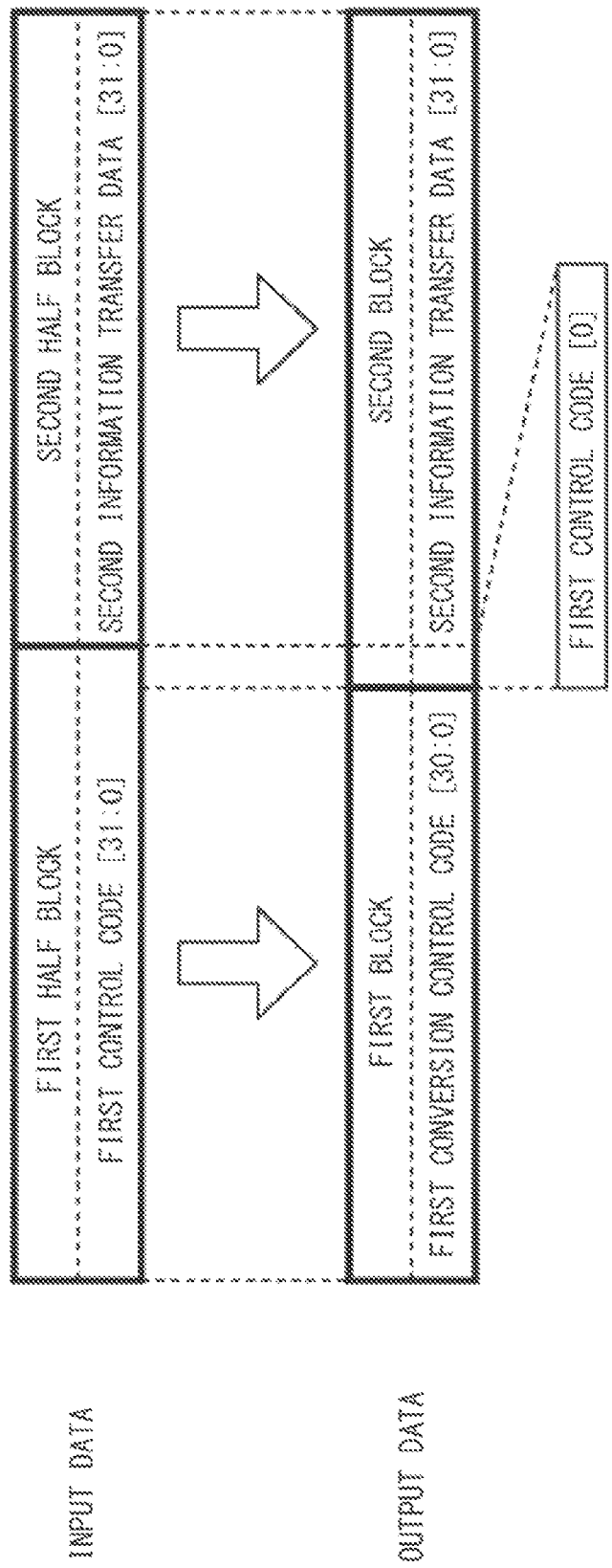
FIG. 47 is an explanatory diagram of conversion in Case 3.

Description is given of pre-encoding and encoding in Case 3 with reference to FIG. 47. Case 3 is a case where the first half block of 64-bit data inputted to the pre-encoder 301 is the control code and the second half block thereof is the information transfer data and where the data is divided into the first block of the control code and the second block of information transfer code.

That is, in Case 3, the first control code [31:0] as the 32-bit first half block and the second information transfer data [31:0] as the 32-bit second half block are inputted to the pre-encoder 301.

The pre-encoder 301 converts the first control code [31:0] of the inputted 32-bit first half block into a 31-bit first conversion control code [30:0] by referring to the table illustrated in FIG. 46, for example, to set the first conversion control code [30:0] as a first block for outputting to the encoder 11.

The pre-encoder 301 allocates the second information transfer data [31:0] of the inputted 32-bit second half block to the second block. The second block is of 33 bits, and thus one bit is added to the head of the second block. It may be possible to use, as the one bit to be added, a value of A of the fourth symbol of the control code in the 8 b code. That is, the last bit of the first control code of the first half block is assigned to a bit of the head of the second block of the second block.

For example, in a case of the Idle Code, the value of A of the fourth symbol of the control code in the 8 b code is "0", and thus the head bit of the second block is set to "0".

The bit inputted in the head of the second block, i.e., a first control code [0] in this case is handled as dummy data on the side of the decoder 12.

The pre-encoder 301 divides the inputted 64-bit data string into the first control code [31:0] that constitutes the first half 31 bits of the inputted 64 bits and the 33-bit second block thereof. The 33-bit second block is a 33-bit data string in which the second information transfer data [31:0] constituting the second half 32 bits of the inputted 64 bits is added to the remaining one-bit first control code [0] of the first control code [31:0].

When outputting the first block which is the control code to the encoder 11, the pre-encoder 301 also supplies the encoder 11 with the DC flag indicating that the first block is the control code.

In a case where the supplied DC flag indicates a control code, the encoder 11 sets the flag to "1", and adds it to the supplied 31-bit first block for outputting as 32-bit data.

When outputting the second block which is the information transfer data to the encoder 11, the pre-encoder 301 also supplies the encoder 11 with the DC flag indicating that the second block is the information transfer data.

In a case where the supplied DC flag indicates the information transfer data, the encoder 11 performs encoding, in which the running disparity RD or the run length RL is controlled, on the supplied second block data, as described with reference to FIGS. 1 to 13. That is, processing is executed to add a flag indicating inversion of the second block data by the running disparity RD or the run length RL, or to add a flag indicating no inversion of the data.

<Concerning Encoding in Case 4>

Figure 48:
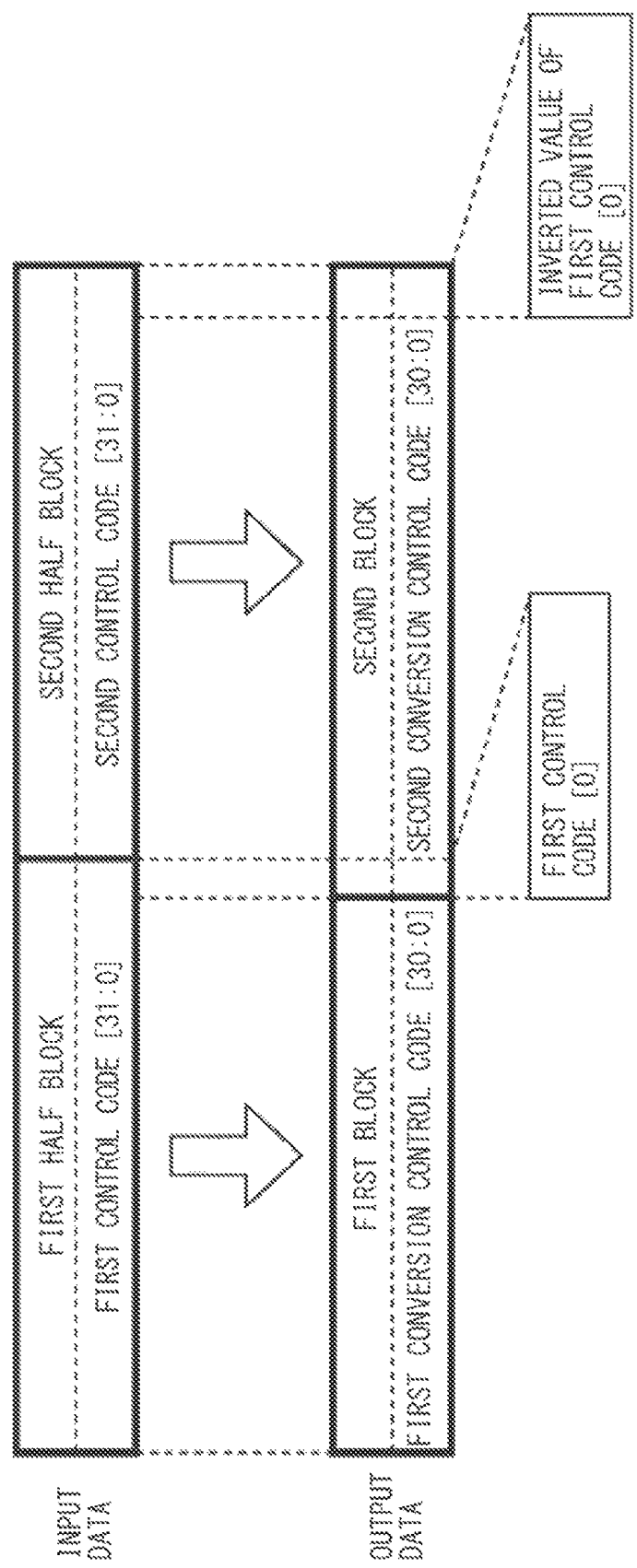
FIG. 48 is an explanatory diagram of conversion in Case 4.

Description is given of pre-encoding and encoding in Case 4 with reference to FIG. 48. Case 4 is a case where each of pieces of 64-bit data to be inputted to the pre-encoder 301 is a control code and where the data is divided into a first block of the control code and a second block of the control code.

That is, in Case 4, the first control code [31:0] as the 32-bit first half block and the second control code [31:0] as the 32-bit second half block are inputted to the pre-encoder 301.

The pre-encoder 301 converts the first control code [31:0] of the inputted 32-bit first half block into the 31-bit first conversion control code [30:0] by referring to the table illustrated in FIG. 46, for example, to output the first conversion control code [30:0] as the first block to the encoder 11.

The pre-encoder 301 converts the second control code [31:0] of the inputted 32-bit second half block into a 31-bit second conversion control code [30:0] by referring to the table illustrated in FIG. 46, for example, to allocate the second conversion control code [30:0] to the second block. The second block is of 33 bits, and thus a total of two bits of one bit of the head and one bit of the last of the second block are added.

The value of A of the fourth symbol of the control code in the 8 b code is applicable to the one bit to be added to the head. That is, the last bit of the first control code (the first control code [0]) of first half block is assigned to a bit of the head of the second block. For example, in a case of the Idle Code, the value of A of the fourth symbol of the control code in the 8 b code is "0", and thus the head bit of the second block is set to "0".

The last one bit to be added is an inverted value of the one bit added to the head. That is, the one bit to be added to the head is the first control code [0], and thus the inverted value of the first control code [0] is the last bit to be added. For example, in a case of the Idle Code, the value of A of the fourth symbol of the control code in the 8 b code is "0", and this value is added to the head; thus, the last bit of the second block is set to "1".

In this manner, two-bit data is added to the second block, whereas the running disparity RD may be set to zero by setting an inverted value of one value to the other value.

The bit inputted to the head of the second block and the bit inputted to the last thereof are each handled as dummy data on the side of the decoder 12.

The pre-encoder 301 converts the first control code [31:0] that constitutes first half 32 bits of the inputted 64 bits into the first conversion control code [30:0] and converts the second control code [31:0] that constitutes second half 32 bits thereof into the second conversion control code [30:0] to thereby divide the inputted 64-bit data string into two blocks. In addition, the pre-encoder 301 adds two bits to the second conversion control code [30:0] to thereby obtain a 33-bit data string, thus generating the second block.

When outputting the first block which is the control code to the encoder 11, the pre-encoder 301 also supplies the encoder 11 with the DC flag indicating that the first block is the control code. In a case where the supplied DC flag indicates a control code, the encoder 11 sets the flag to "1", and adds it to the supplied 31-bit first block for outputting as 32-bit data.

Likewise, when outputting the second block which is the control code to the encoder 11, the pre-encoder 301 also supplies the encoder 11 with the DC flag indicating that the second block is the control code. In a case where the supplied DC flag indicates the control code, the encoder 11 sets the flag to "1", and adds it to the supplied 33-bit second block for outputting as 34-bit data.

In this manner, the 64-bit data inputted by the pre-encoder 301 is divided into the 31-bit data and the 33-bit data. In the above description, the control code is converted with reference to the table illustrated in FIG. 46; however, in a case where the control code (8 b code described above) used in the 8B10B encoding is inputted and the 8 b code is converted, conversion as described with reference to FIGS. 49 and 50 may also be performed. In other words, as described with reference to FIGS. 49 and 50, the conversion control code has regularity, and generation may be made from the 8 b code on the basis of the regularity.

Figure 49:
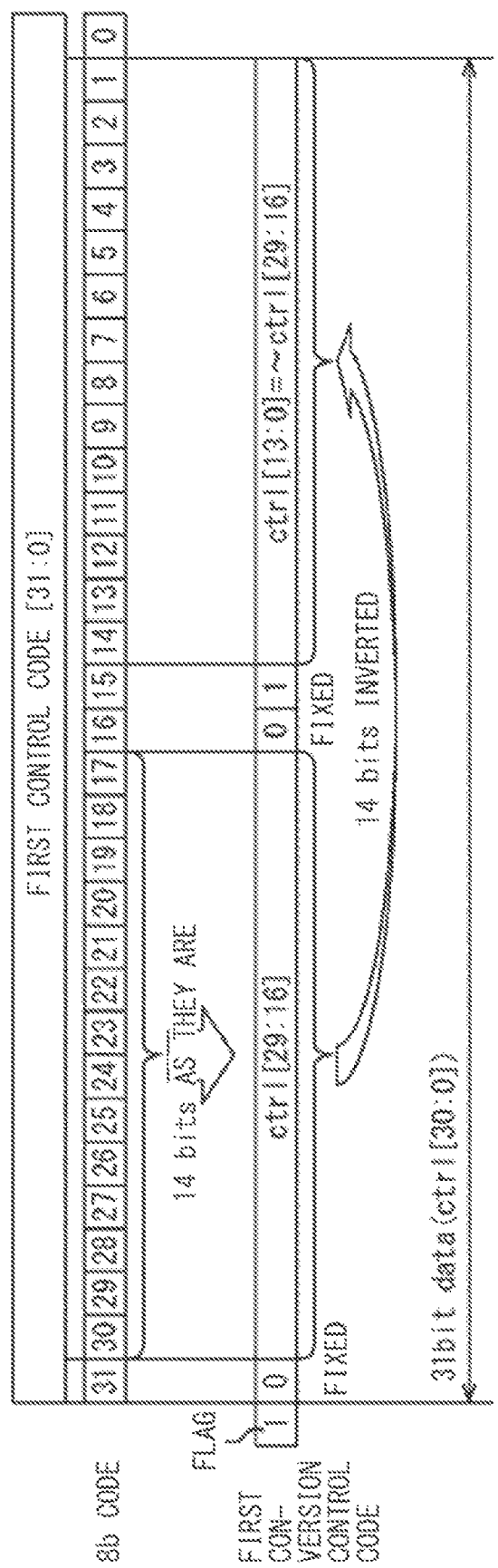
FIG. 49 is an explanatory diagram of a data conversion method.

FIG. 49 is an explanatory diagram of a conversion method in a case where the first half of the 64-bit data to be inputted to the pre-encoder 301 is a control code. That is, FIG. 49 concerns a case where the inputted 64-bit first half block described with reference to FIGS. 47 and 48 is the first control code [31:0] and where the first control code [31:0] is converted into the first conversion control code [30:0].

FIG. 49 illustrates, on upper side, the first control code of the 8 b code. The first control code [31:0] is 32-bit data. Of the first control code [31:0], 14 bits of a first conversion control code [30:17] are used as they are as 14 bits of 16th to 29th bits of the first conversion control code. That is, the first control code [30:17] is used as a first conversion control code [29:16]. The first conversion control code [30:17] is used as data to distinguish between the control codes.

The first bit of the first conversion control code, i.e., a first conversion control code [30], which is a bit prior to the first conversion control code [29:16], is fixed to "0". In addition, a first conversion control code [15] and a first conversion control code [14] of the first conversion control code, i.e., two bits subsequent to the first conversion control code [29:16] are fixed to "0" and "1".

The 14 bits of a first conversion control code [13:0] are set to inverted values of the 14 bits of the first conversion control code [29:16]. In other words, the 14 bits of the first conversion control code [13:0] are pieces of data in which 14 bits of the first control code [30:17] of the inputted 8 b code are inverted.

In this manner, the conversion control code is generated from the inputted 8 b code. In this manner, the first conversion control code [30:0] is generated by using 14 bits of the first control code [30:17] of the inputted first control code [31:0].

Zero is set as a bit to be the first conversion control code [30].

The 14 bits of the first control code [30:17] of the first control code [30:0] are set as the first conversion control code [29:16].

A first conversion control code [15:14] is set to zero and one as two bits subsequent to the first conversion control code [29:16].

The 14 bits obtained by inverting the 14 bits of the first control code [30:17] are set as the first conversion control code [13:0].

Performing such processing allows for generation of the first conversion control code [30:0].

Because the first conversion control code [29:16] and the first conversion control code [13:0] are in a data-inverted relationship, the running disparity RD for this portion is zero. In addition, the first conversion control code includes 0, 0, and 1 as fixed values, and the flag added to the control code is one; thus, the running disparity RD for this portion is also zero. Therefore, the running disparity RD for the first conversion control code [30:0] to be generated including also the flag is certainly zero.

Figure 50:
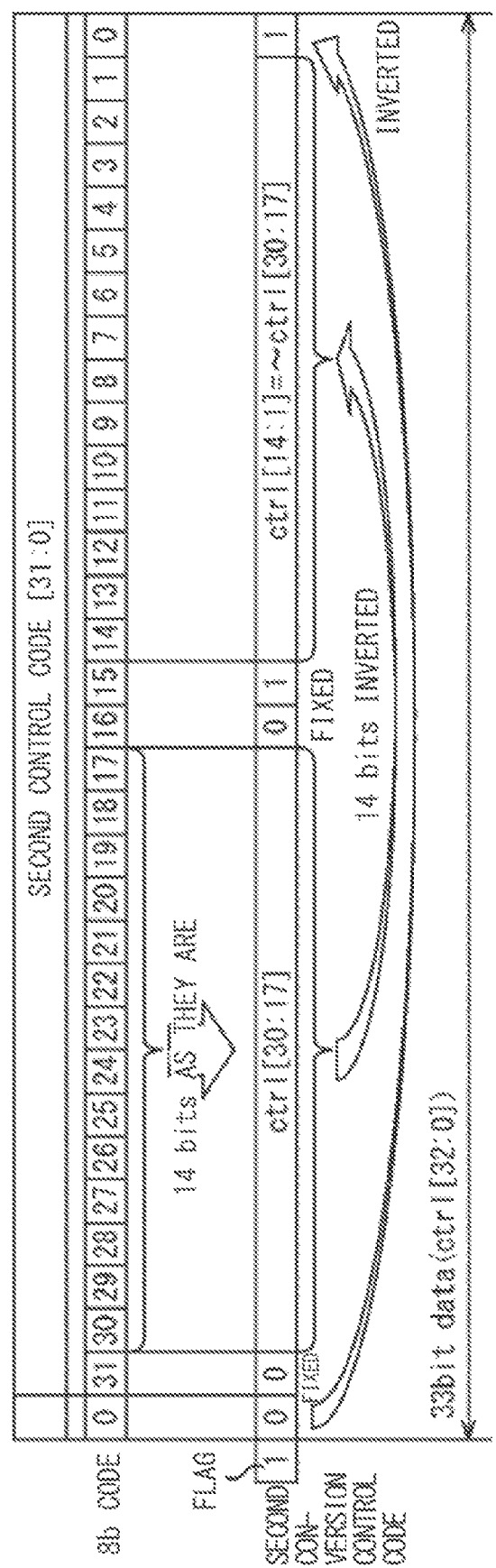
FIG. 50 is an explanatory diagram of a data conversion method.

Next, description is given, with reference to FIG. 50, of a conversion method in a case where the second half of the 64-bit data to be inputted to the pre-encoder 301 is the control code. That is, the description is given of a case where the inputted 64-bit second half block described with reference to FIGS. 45 and 48 is the second control code [31:0] and where the second control code [31:0] is converted into the second conversion control code [30:0].

The basic conversion is the same as that in the case illustrated in FIG. 49; however, the case illustrated in FIG. 49 is a case of conversion into 31 bits, and the case illustrated in FIG. 50 is a case of conversion into 33 bits. For this reason, processing of addition of further 2 bits is added. The two bits are bits corresponding to a second conversion control code [32] and a second conversion control code [0].

That is, also in the case illustrated in FIG. 50, 14 bits of the second control code [30:17] of the second control code [31:0] are used as they are as the 14 bits of 16th to 29th bits of the second conversion control code. In this case, the second control code [30:17] is used as a second conversion control code [30:17]. The second conversion control code [30:17] is used as data to distinguish between the control codes.

The first bit of the second conversion control code, i.e., a second conversion control code [31], which is a bit prior to the second conversion control code [30:17], is fixed to "0". In addition, a second conversion control code [16] and a second conversion control code [15], i.e., two bits subsequent to the second conversion control code [30:17] of the second conversion control code are fixed to "0" and "1".

The 14 bits of a second conversion control code [14:1] are set to inverted values of the 14 bits of a second conversion control code [29:16]. In other words, the 14 bits of the second conversion control code [14:1] are pieces of data in which the 14 bits of the second control code [30:17] of the inputted 8 b code are inverted.

Further, a bit corresponding to the second conversion control code [32] is added to the front of a second conversion control code [31:1], and a bit corresponding to the second conversion control code [0] is added to the front of the second conversion control code [31:1].

As for the second conversion control code [32], the last bit of the first half block of the inputted 64 bits, e.g., the first information transfer data [0] of the first information transfer data [31:0] is assigned in the example of FIG. 45. In addition, an inverted value of the second conversion control code [32] is assigned to the second conversion control code [0].

In this manner, the conversion control code is generated from the inputted 8 b code. In this manner, a second conversion control code [32:0] is generated by using the 14 bits of the second control code [30:17] of the inputted second control code [31:0].

The last bit of the preceding block is assigned as a bit to be the second conversion control code [32].

Zero is set as a bit to be the second conversion control code [31].

The 14 bits of the second control code [30:17] are set as the second conversion control code [30:17].

A second conversion control code [16:15] is set to zero and one as two bits subsequent to the second conversion control code [30:17].

The 14 bits obtained by inverting the 14 bits of the second control code [30:17] are set as the second conversion control code [14:1].

As a bit to be the second conversion control code [0], an inverted value of the second conversion control code [32] is set.

Performing such processing allows for generation of the second conversion control code [32:0].

Because the second conversion control code [30:17] and the second conversion control code [14:1] are in a data-inverted relationship, the running disparity RD for this portion is zero. In addition, because the second conversion control code [32] and the second conversion control code [0] are in a data-inverted relationship, the running disparity RD for this portion is zero. Further, the second conversion control code includes 0, 0, and 1 as fixed values, and the flag added to the control code is one; thus, the running disparity RD for this portion is also zero. Therefore, the running disparity RD for the second conversion control code [32:0] to be generated including also the flag is certainly zero.

A control code to be used in the inversion encoding may be generated by converting the inputted control code as described with reference to FIGS. 49 and 50.

Even in a case where the control code or the information transmission data is encoded in this manner, the operations of the transmission unit 122a and the reception unit 131a illustrated in FIG. 42 are operations based on flowcharts illustrated in FIGS. 38 to 40. Description is given here only of different processing to avoid overlapped description.

In step S117 (FIG. 39), the control code insertion part 191 adds a control code to the packet data supplied from the lane distribution section 165, as data transmission processing of the transmission unit 122a. This control code to be added is a code in which the control code in the 8B10B encoding is converted into the control code in the inversion encoding.

Alternatively, it may also be possible to configure the encoder 11 (the pre-encoder 301 included in the encoder 11), rather than the control code insertion part 191, to perform such conversion.

In step S118, the encoder 11 performs the inversion encoding of the packet data to which the control code is added. Description is given later of this processing in the encoder 11 with reference to FIG. 51.

In step S133 (FIG. 40), the symbol synchronization part 214 detects a control code included in the packet data, for example, to perform symbol synchronization, as the data reception processing of the reception unit 131a. The control code used at this time is the control code in the inversion encoding.

In a case where the symbol synchronization part 244 performs symbol synchronization with the control code in the 8B10B encoding, a control code, which is data decoded by the decoder 12 and is converted into the control code in the 8B10B encoding, may be used.

In step S134, the decoder 12 decodes encoded data having been subjected to the inversion encoding. Description is given later of this processing in the decoder 12 with reference to FIG. 52.

<Processing of Encoder Including Control Code>

Figure 51:
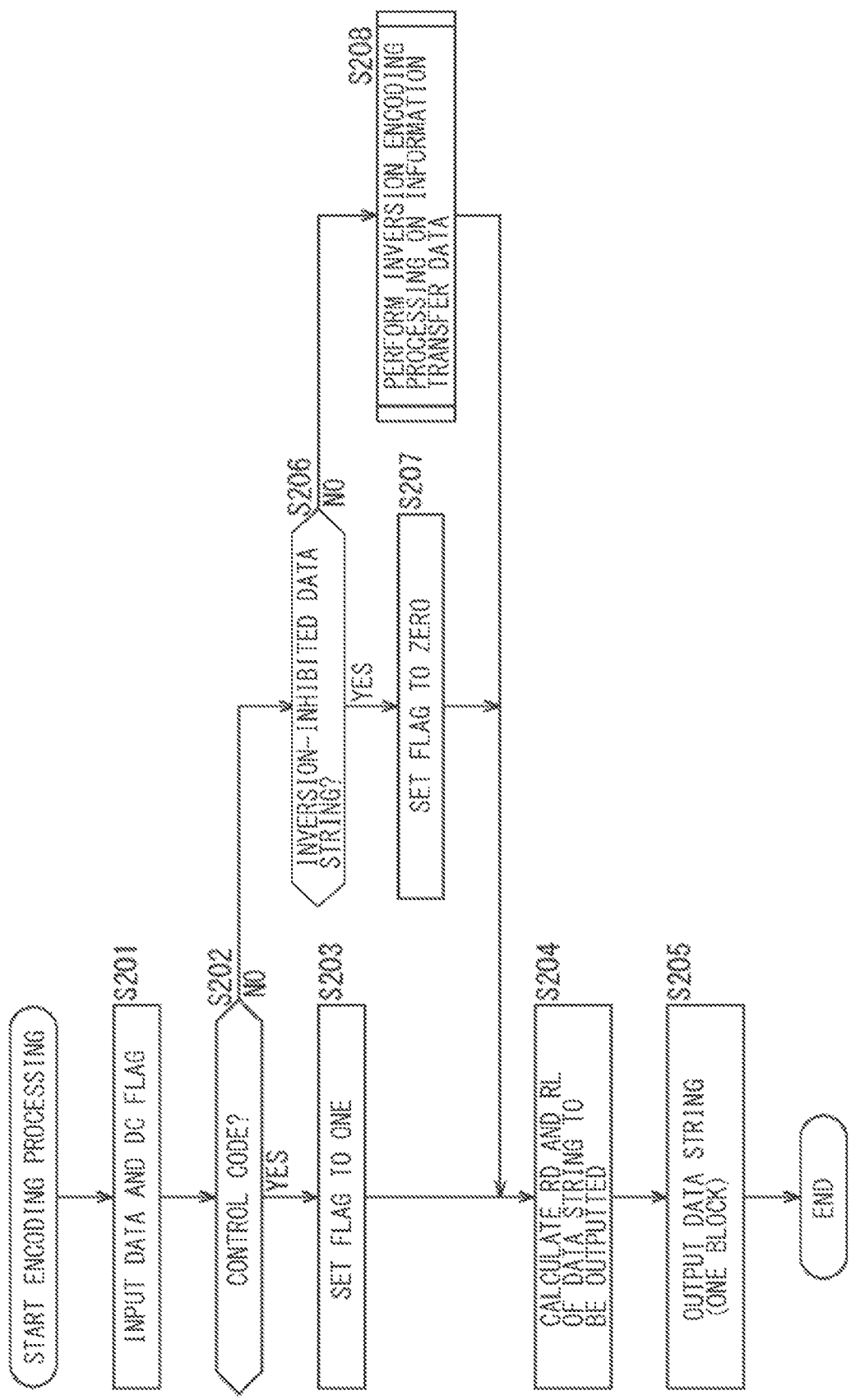
FIG. 51 is a flowchart that describes encoding processing.

Description is given, with reference to a flowchart of FIG. 51, of a control code with a particular role and processing of the encoder 11 in a case of encoding the information transfer data.

In step S201, the encoder 11 inputs data and a DC flag from the pre-encoder 301. In step S202, the encoder 11 determines whether or not the inputted data is a control code by referring to the DC flag. In step S202, in a case where determination is made that the inputted data is a control code, the processing proceeds to step S203.

In step S203, the flag is set to one. As described above, the control code is set as data in which inversion processing is not performed, with the flag being set to one. The pre-encoder 301 has changed the data into an N-bit or M-bit control code, and thus the control code with the flag being added is outputted to the encoder 11.

In step S204, the running disparity RD and the run length RL of the control code to be outputted are calculated. In step S205, a generated data string is transmitted to the receiving side. Step S204 and step S205 are the same types of processing as step S22 and step S23 (FIG. 9).

Meanwhile, in a case where determination is made, in step S202, that the inputted data is not a control code, the processing proceeds to step S206. Determination is made, in step S206, as to whether or not the inputted information transfer data is an inversion-inhibited data string. As described with reference to FIG. 46, the inversion-inhibited data string refers to a data string to be brought into the same data string as that of the control code when being inverted.

In a case where, determination is made, in step S206, that the inputted data is the inversion-inhibited data string, the processing proceeds to step S207. In step S207, the flag is set to zero. The pre-encoder 301 has changed the data into an N-bit or M-bit information transfer data, and thus the information transfer data with the flag being added is outputted to the encoder 11. Thereafter, processing of each of step S204 and step S205 is executed; however, the description has already been given of the processing of each of step S204 and step S205, and thus the descriptions thereof are omitted.

Meanwhile, in a case where determination is made, in step S206, that the inputted information transfer data is not the inversion-inhibited data string, the processing proceeds to step S208. In step S208, inversion encoding processing is executed for the information transfer data. In addition, processing of each of step S204 and step S205 is executed for the information transfer data on which the inversion encoding processing has been executed.

The inversion encoding processing executed in step S208 and the processing executed in each of steps S204 and S205 correspond to the pieces of processing of steps S12 to S23 in the flowchart illustrated in FIG. 9; the descriptions thereof have already been given and thus are omitted.

In this manner, in a case of also handling a code having a particular data string such as a control code in the inversion encoding, processing of adding a flag not to invert the control code or to identify the control code is included.

<Processing of Decoder Including Control Code>

Figure 52:
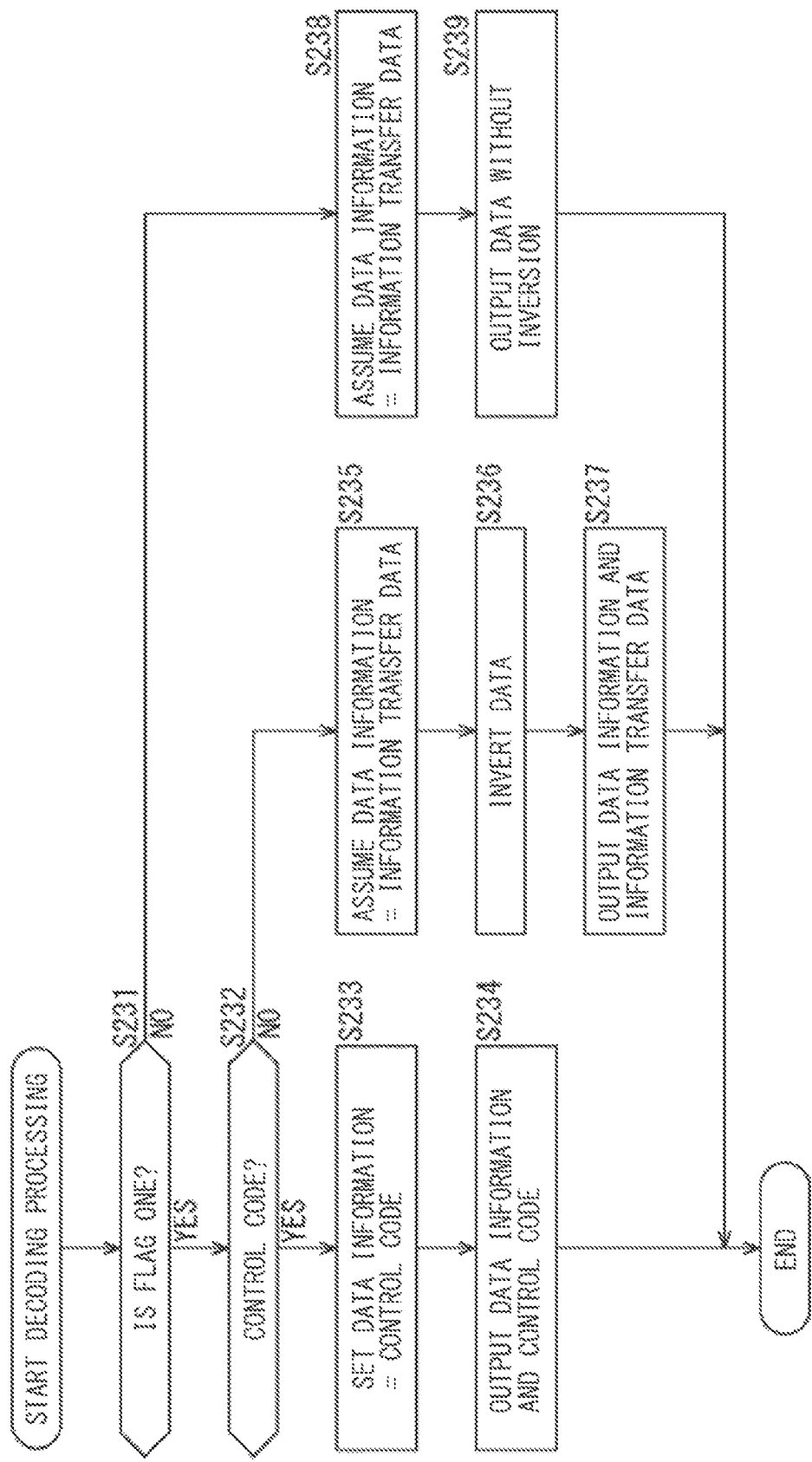
FIG. 52 is a flowchart that describes decoding processing.

Description is given, with reference to a flowchart of FIG. 52, of processing of the decoder 12 in a case of decoding a control code having a particular role and information transfer data.

In step S231, the decoder 12 determines whether or not the flag is one. In a case where the flag is determined to be one in step S231, the processing proceeds to step S232.

Determination is made, in step S232, as to whether or not a data string to be processed is a control code. In a case where determination is made, in step S232, that the data string to be processed is a control code, the processing proceeds to step S233.

In step S233, the data information is set to information indicating that it is the control code. The data information is information to be referred to when processing an output from the decoder 12 in processing in a subsequent stage of the decoder 12, and is information (flag) indicating whether or not to be the control code.

In step S234, the data information and the control code are outputted from the decoder 12.

Meanwhile, in a case where determination is made, in step S232, that it is not the control code, the processing proceeds to step S235. In a case where the flag is one but not the control code, the processing proceeds to step S235. That is, in a case where the processing proceeds to step S235, the data to be processed is inverted information transfer data.

In step S235, the data information is set to information indicating that it is the information transfer data. In step S236, the data string to be processed is inverted. Then, in step S237, the data information and the information transfer data are outputted from the decoder 12.

Meanwhile, in a case where determination is made, in step S231, that the flag is zero, the processing proceeds to step S238. In a case where the data to be processed is information transfer data that is not inverted, the processing proceeds to S238.

In step S238, the data information is set to information indicating that it is the information transfer data. In step S239, the data string to be processed is outputted as it is without being inverted. Then, in step S237, the data information and the information transfer data are outputted from the decoder 12.

In this manner, in a case of also handling a code having a particular data string such as a control code in decoding corresponding to the inversion encoding, a data string is processed to which a flag not to invert the control code or to identify the control code is added, by referring to the flag.

<Processing of Another Encoding and Decoding>

As described above, the control code is set not to be inverted, and one is added as a flag. In addition, the data to be the same data string as that of the control code when being inverted, of data (information transfer data) other than the control code, is set to be the inversion-inhibited data string, and is controlled not to be inverted, with zero being added as the flag.

In addition, in a case where the information transfer data is inverted, one is added as the flag. The addition of one as the flag is the same as the case of indicating the control code. Suppose that an error occurs in the inverted information transfer data to have the same data string as the control code, the inverted information transfer data results in being processed as a control code on the decoding side because of the flag being one and because of being the same data as the control code.

In addition, in a case where an error occurs in the control code, the control code may possibly be handled and decoded as inverted information transfer data on decoder side because of the flag being one. Therefore, description is given of encoding and decoding to allow handling as the control code even in a case where an error occurs in the control code.

Figure 53:
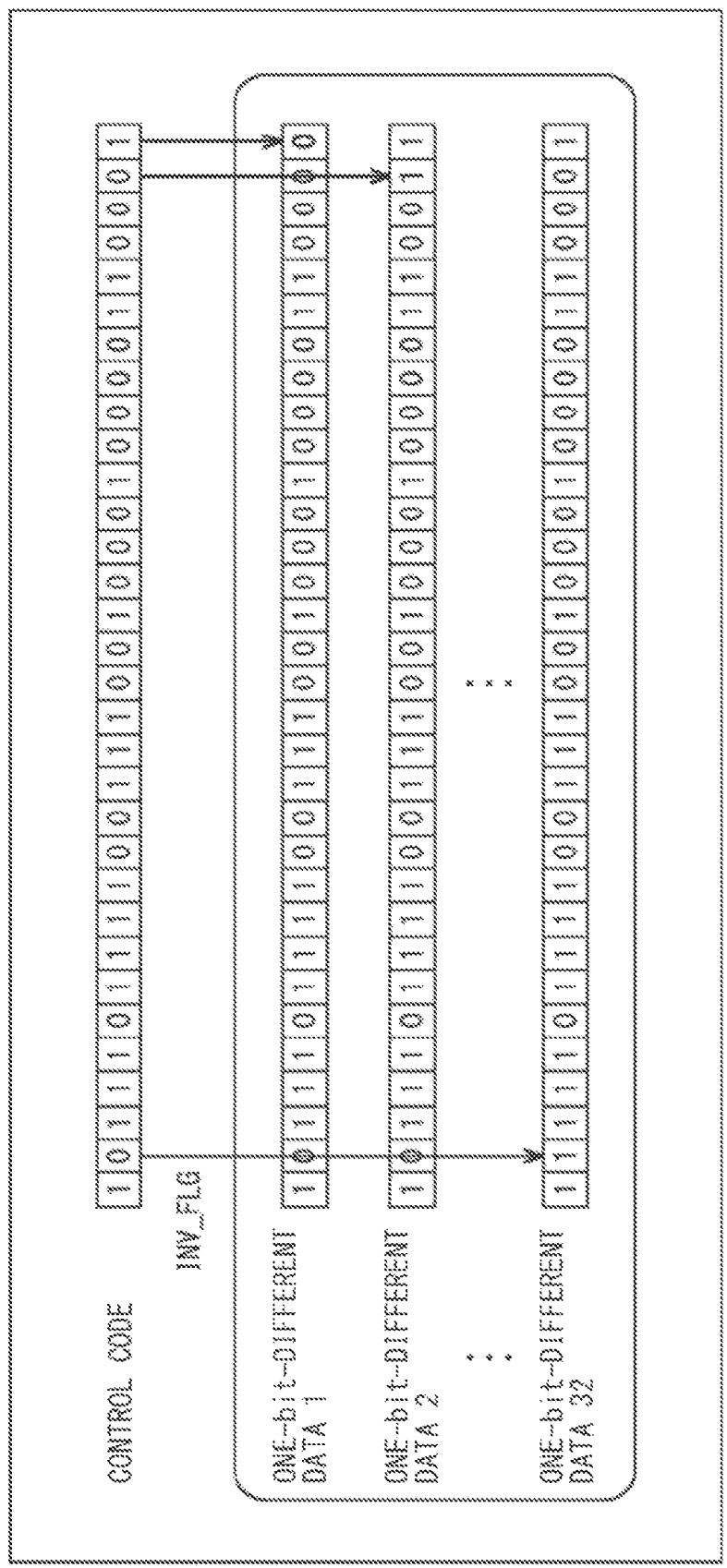
FIG. 53 is an explanatory diagram of a control code upon occurrence of an error.

As illustrated in FIG. 53, it is assumed that a one-bit error occurs in the control code. The code illustrated on upper side of FIG. 53 is Pad Code in the inversion encoding illustrated in FIG. 46, and a code is illustrated in which a flag of one is added to one bit of the head of the Pad Code. In a case of being encoded and transmitted to the decoding side in a state where no error occurs, the code illustrated on the upper side of FIG. 53 is transmitted and received.

FIG. 53 illustrates, on lower side, a case where a one-bit error occurs, for example, in the Pad Code. In the Pad Code represented as one-bit-different data 1, an error occurs in the last data, and the data, which should be data of one in a normal code, results in being data of zero. When such one-bit-different data 1 is processed on the side of the decoder 12, the one-bit-different data 1 results in being processed as inverted information transfer data because of the flag being one.

Likewise, in the Pad Code represented as one-bit-different data 2, an error occurs in the second data from the last, and the data, which should be data of zero in a normal code, results in being data of one. When such one-bit-different data 2 is processed on the side of the decoder 12, the one-bit-different data 2 results in being processed as inverted information transfer data because of the flag being one.

Further, in the Pad Code represented as one-bit-different data 32, an error occurs in the thirty-second data from the last, and the data, which should be data of zero in a normal code, results in being data of one. When such one-bit-different data 32 is processed on the side of the decoder 12, the one-bit-different data 32 results in being processed as inverted information transfer data because of the flag being one.

In this manner, in a case where a one-bit error occurs in the control code, the one-bit error may possibly be decoded as the information transfer data. Therefore, decoding is performed in consideration of also a case where the one-bit error occurs. Specifically, the decoder 12 handles pieces of one-bit-different data 1 to 32 as control codes. In this manner, the pieces of one-bit-different data 1 to 32 are each described as an expanded control code appropriately.

There are 32 patterns for the pieces of one-bit-different data 1 to 32, it follows that the decoder 12 processes, as the control code, the 32 patterns as well. Therefore, it follows that the decoder 12 handles, as the control code, 33 patterns including a control code in which no errors has occurred. In addition, although description has been given by exemplifying the Pad Code as the control code, the control code includes the Idle Code, the Start Code, the End Code, the Sync Code, the Deskew Code, and the Standby Code, in addition to the Pad Code, as described with reference to FIG. 46. For each of these control codes, there are 33 patterns of data strings to be handled as the control code.

In order to allow the side of the decoder 12 to also handle the pieces of one-bit-different data 1 to 32 as the control code, encoding side performs a control not to invert information transfer data corresponding to any of the pieces of one-bit-different data 1 to 32 after the inversion. That is, the encoder side performs processing in which the range of the inversion-inhibited data string is expanded not only to the data string with the control code being inverted, but also to the expanded control code.

In a case where, in the information transfer data, the flag of one is added after the inversion and an inverted data string has the same pattern as that of any of the pieces of one-bit-different data 1 to 32, it follows that the inverted data string is handled as the control code on the side of the decoder 12. In order to prevent such a situation, information transfer data in which the inverted data string results in having the same pattern as that of any of the pieces of one-bit-different data 1 to 32, among pieces of information transfer data, is inhibited from being inverted, with zero being added as the flag.

Figure 54:
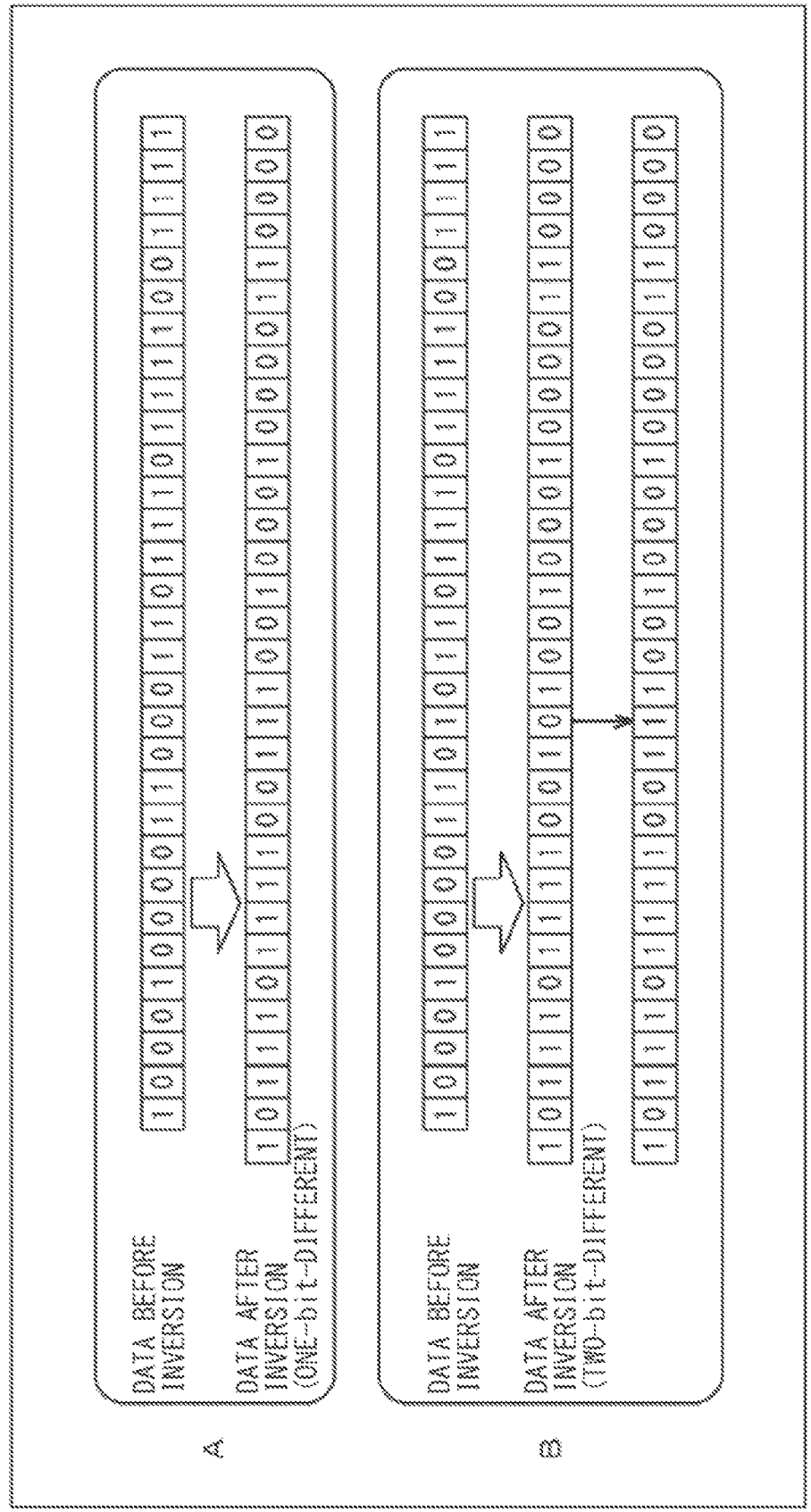
FIG. 54 is an explanatory diagram of an inversion-inhibited data string.

Reference is made to A of FIG. 54. A of FIG. 54 illustrates, on upper side, data before inversion (information transfer data). The information transfer data illustrated on the upper side of A of FIG. 54 is 10001000011000110111011111001111 as data. This information transfer data is not a control code.

When the information transfer data as illustrated on the upper side of A of FIG. 54 is inverted, data illustrated on lower side of A of FIG. 54 is obtained. The inverted information transfer data is 01110111100111001000100000110000. This inverted information transfer data has the same data string as that of the one-bit-different data 1 of the pieces of one-bit-different data 1 to 32 illustrated in FIG. 53.

In addition, the data illustrated on the lower side of A of FIG. 54 is inverted data, and thus one is added as the flag. Therefore, when such inversion encoding is performed, the data is handled as a control code on the side of the decoder 12 because of the flag being one and because of being the same data string as the one-bit-different data 1. However, the data illustrated on the lower side of A of FIG. 54 is data in which the information transfer data is inverted, and is not a control code. Therefore, handling the data as a control code on the side of the decoder 12 results in erroneous decoding.

For this reason, the encoder 11 processes the information transfer data illustrated on the upper side of A of FIG. 54 as non-inverted data (inversion-inhibited data string). That is, in a case where the information transfer data illustrated on the upper side of A of FIG. 54 is inputted, the encoder 11 handles the information transfer data as the inversion-inhibited data string to execute processing of adding the flag of zero.

Performing the encoding in this manner allows the information transfer data illustrated on the upper side of A of FIG. 54 not to be inverted and the flag of zero to be added, and thus decoding is performed on the assumption that the data is non-inverted information transfer data on the side of the decoder 12.

That is, the encoder 11 handles the information transfer data to be a data string one bit different from the control code when being inverted is handled as the inversion-inhibited data string to perform encoding to add zero as the flag. As described with reference to FIG. 54, there are 32 patterns for the data string one bit different from the control code, and thus the data strings of these 32 patterns are handled as the inversion-inhibited data string on the side of the encoder 11.

In addition, as described above, there are a plurality of control codes, and thus one-bit-different data of 32 patterns for each of the plurality of control codes and the information transfer data to be the same data string when being inverted are also handled as the non-inverted data.

In addition, as illustrated in B of FIG. 54, such information transfer data as to coincide with the control code when a two-bit error occurs may also be handled as the inversion-inhibited data string.

Information transfer data of 10001000011010110111011111001111 illustrated on the upper side of B in FIG. 54 is converted into a data string of 01110111100101001000100000110000 illustrated on middle side when being inverted. Further, in a case where a one-bit error occurs in this inverted data string, a data string of 01110111100111001000100000110000 illustrated on the lower side is obtained.

The data string of 01110111100111001000100000110000 in which a one-bit error occurs in the inverted data string is the same data string as the inverted data string illustrated on the lower side of A of FIG. 54. The inverted data string illustrated on the lower side of A of FIG. 54 is the same data string as the one-bit-different data 1 illustrated in FIG. 53.

The occurrence of the one-bit error in the inverted data string allows the information transfer data before the inversion illustrated on the upper side of B of FIG. 54 to be the same data string as the one-bit-different data 1 when a one-bit error occurs in the control code. Such information transfer data may also be handled as the inversion-inhibited data. Such information transfer data is described here as two-bit-different data.

In this manner, the encoder 11 handles, as the inversion-inhibited data string, the information transfer data to be the control code when being inverted, the information transfer data to be one-bit-different data when a one-bit error occurs in the control code when being inverted, and further the information transfer data to be the two-bit-different data when a two-bit error occurs in the control code upon being inverted.

In this manner, also in a case of handling the expanded control code being included as the inversion-inhibited data string, the processing of the encoder 11 is able to be performed on the basis of the flowchart illustrated in FIG. 51. That is, determination is made, in step S206, as to whether or not a data string to be processed is the inversion-inhibited data string. However, the data string set as the inversion-inhibited data string is extended not only to the information transfer data to be the control code when being inverted, but also to the above-described information transfer data (expanded control data), which respect is different; another processing is able to be performed similarly.

In addition, the processing of the decoder 12 is able to be performed on the basis of the flowchart illustrated in FIG. 52. That is, determination is made, in step S232, as to whether or not to be the control code. However, a control code to determine that it is the control code has a range extended not only to the control code, but also to one-bit-different data and two-bit different data, which respect is different; another processing is able to be performed similarly.

Respective configurations of the encoder 11 and the decoder 12 may also be basically similar to the configurations of the encoder 11 illustrated in FIG. 3 and the decoder 12 illustrated in FIG. 4. However, a range of the inversion-inhibited data string is extended on the side of the encoder 11, and thus a function of executing the processing needs to be added. In addition, a range of a data string to be determined as the control code is extended also on the side of the decoder 12, and thus a function of executing the processing needs to be added.

Figure 55:
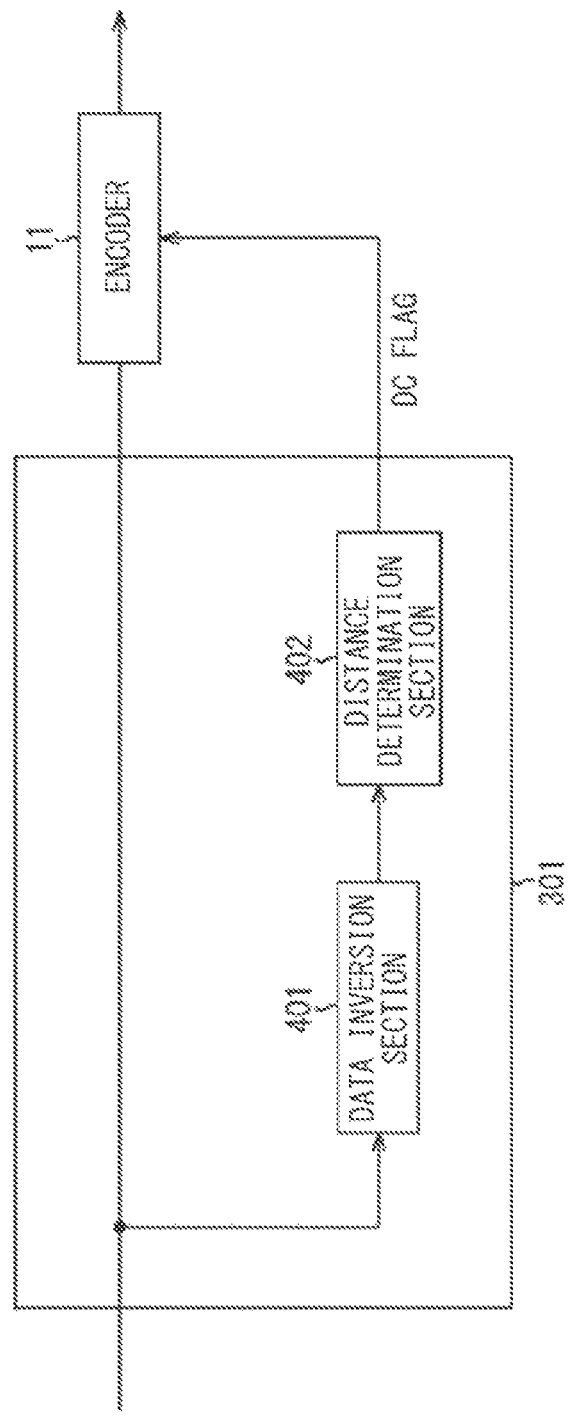
FIG. 55 illustrates a configuration example related to the encoder.

FIG. 55 is a configuration diagram related to the encoder 11 when the range to be handled as the inversion-inhibited data string is expanded. The encoder 11 is configured to be supplied with an inversion inhibition flag from a distance determination section 402. In addition, the distance determination section 402 is configured to receive data supply from a data inversion section 401.

The data inversion section 401 and the distance determination section 402 may be configured to be included in the pre-encoder 301. As described with reference to FIG. 43, the pre-encoder 301 distinguishes between the control code and the information transfer data, and supplies the encoder 11 with a DC flag indicating whether it is the control code or the information transmission data.

The description is continued by exemplifying a case of adopting a configuration of adding the data inversion section 401 and the distance determination section 402 to the pre-encoder 301 that performs such processing; however, they may be provided separately from the encoder 11 similarly to the pre-encoder 301, or may be configured to be included in the encoder 11. The pre-encoder 301 outputs a DC flag; the DC flag is a flag indicating whether it is the control code or the information transfer data. One reason for the output of such a DC flag is that inversion is inhibited in the case of the control code. Therefore, the DC flag may be used as the inversion inhibition flag, and may be used as a flag indicating whether the data is inversion-inhibited data or data that may be inverted.

The data inversion section 401 included in the pre-encoder 301 inverts inputted data. Because it is sufficient for the information transfer data to be subjected to the processing as data to be inverted, it may be possible not to execute the processing in the data inversion section 401 when the control data is inputted. The inverted data is supplied to the distance determination section 402. The distance determination section 402 compares the control code and the inverted information transfer data with each other.

The distance determination section 402 determines whether the inverted data string corresponds to a control code, a one-bit-different data string, or a two-bit different data string. This determination is made by determining by how many bits the inverted data string and the control code differ from each other. In other words, the distance between the inverted data string and the control code is determined. For example, determining a Hamming distance allows for determination of the number of different bits between the inverted data string and the control code.

In a case where the inverted data string and the control code coincide with each other, i.e., in a case where the Hamming distance=0 holds true, the data string is determined to be inversion-inhibited one. In addition, in a case where the inverted data string and the control code differ from each other by one bit, i.e., in a case where the Hamming distance=1 holds true, the data string is determined to be inversion-inhibited one. In addition, in a case where the inverted data string and the control code differ from each other by two bits, i.e., in a case where the Hamming distance=2 holds true, the data string is determined to be inversion-inhibited one.

In a case where the inverted data string and the control code differ from each other by three bits or more, i.e., in a case where the Hamming distance is three or more, the distance determination section 402 determines that the data is the information transfer data.

In a case where determination is made in the distance determination section 402 that the data string is inversion-inhibited one, the DC flag indicating the inversion-inhibited data string is supplied to the encoder 11. The DC flag is one of a flag indicating the control code, a flag indicating the information transfer data, and a flag indicating the inversion-inhibited data while being the information transfer data.

In this manner, determination may be made as to whether or not the inverted data coincides with the expanded control code to perform encoding using a result of the determination.

In addition, here, the range of the expanded control code is limited to the control code, the one-bit different data, and the two-bit different data; however, it may also be possible to include three-bit different data or four-bit different data. It may be possible to appropriately set whether to guarantee the data as the number of bits in which an error occurs, in consideration of the performance or the like required from the system.

Figure 56:
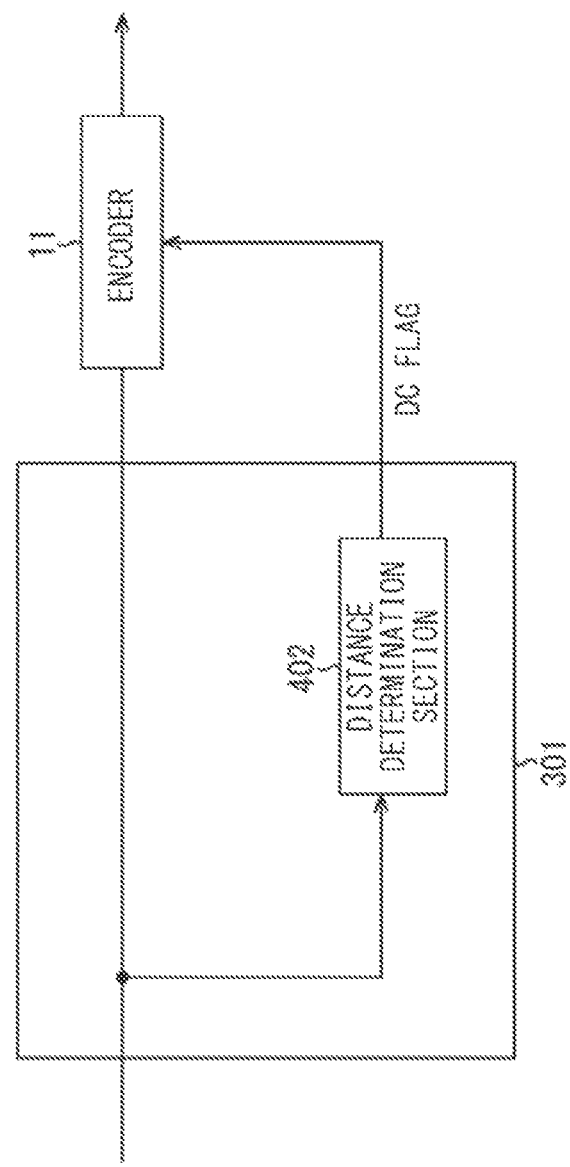
FIG. 56 illustrates another configuration example related to the encoder.

A configuration may also be adopted in which data and an inverted control code are compared with each other without inversion of the data. FIG. 56 illustrates another configuration diagram related to the encoder 11 when the range to be handled as the inversion-inhibited data string is expanded. The encoder 11 is configured to be supplied with the DC flag from a distance determination section 411 included in the pre-encoder 301.

The distance determination section 411 determines a distance between inputted data and an inverted control code. In a case where the inputted data string and the inverted control code coincide with each other (in a case of Hamming distance=0), the distance determination section 411 determines the data string to be inversion-inhibited one to output a DC flag indicating that inversion is inhibited.

In addition, in a case where the inputted data string and the inverted control code differ from each other by one bit (in a case of Hamming distance=1), the distance determination section 411 determines the data string to be inversion-inhibited one to output the DC flag indicating that the inversion is inhibited. In addition, in a case where the inputted data string and the inverted control code differ from each other by two bits (in a case of Hamming distance=2), the distance determination section 411 determines the data string to be inversion-inhibited one to output the DC flag indicating that the inversion is inhibited.

In a case where the inputted data string and the inverted control code differ from each other by three bits or more (in a case of Hamming distance being three or more), the distance determination section 411 determines that the data is the information transfer data to output a DC flag indicating that the data may be inverted.

In this manner, determination may be made as to whether or not the inputted data coincides with an inverted data string of the expanded control code to perform encoding using a result of the determination.

In this manner, in the encoder 11, the information transfer data coinciding with the expanded control code is handled as the inversion-inhibited data string, and is set to be non-inverted, with zero being set as the flag.

Figure 57:
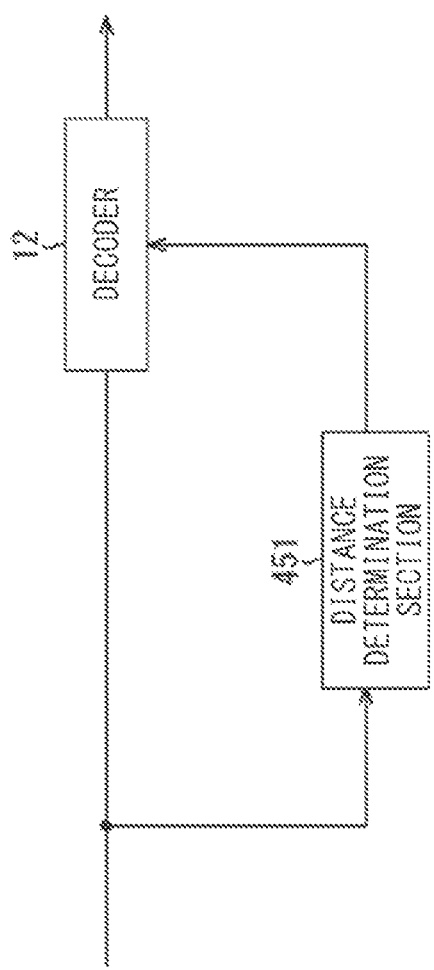
FIG. 57 illustrates a configuration example related to the decoder.

Description is given of a configuration related to the decoder 12 in a case where such an expanded control code is also handled. FIG. 57 illustrates a configuration example related to the decoder 12 in a case where the expanded control code is handled.

The decoder 12 is configured to perform decoding using a result of determination from a distance determination section 451. The distance determination section 451 receives an input of the same data string as a data string inputted to the decoder 12, and determines a distance between the inputted data string and the control code. Similarly to the distance determination section 402 (411) on the side of the encoder 11, the distance determination section 451 basically determines the distance between the inputted data string and the control code.

In a case where the flag of a data string to be inputted is one, the data string is the control code or the inverted information transfer data. In order to also determine the expanded control code to be the control code, it is necessary to determine whether the data string with the flag of one is the control code, the expanded control code, or the inverted information transfer data.

Therefore, the distance determination section 451 determines the distance between the inputted data string and the control code. In a case where the inputted data string and the control code coincide with each other (in a case of Hamming distance=0), the distance determination section 451 determines the data string to be the control code.

In addition, in a case where the inputted data string and the control code differ from each other by one bit (in a case of Hamming distance=1), the distance determination section 451 determines the data string to be the control code. In addition, in a case where the inputted data string and the control code differ from each other by two bits (in a case of Hamming distance=2), the distance determination section 451 determines the data string to be the control code.

In a case where the inputted data string and the control code differ from each other by three bits or more (in a case of Hamming distance being three or more), the distance determination section 451 determines the data string to be the information transfer data.

In this manner, determination may be made as to whether or not the inputted data coincides with the expanded control code to perform decoding using a result of the determination, i.e., information on whether or not the data is the control code or the information transfer data.

In this manner, handling the expanded control code also as a control code enables handling as the control code even in a case where an error occurs in the control code.

<Encoding and Decoding Using Scramble Together>

Handling the expanded control code also as a control code for the encoding and the decoding makes it possible to enhance tolerance at the time when an error occurs. On the other hand, in a case where the expanded control code is able to be handled also as the control code, information transfer data of which the inversion is inhibited may possibly be increased on the side of the encoder 11.

The increase in the information transfer data of which the inversion is inhibited may possibly cause an increase in the running disparity RD. For example, in a case where pieces of inversion-inhibited information transfer data are successive, the running disparity RD may possibly be increased. In addition, in a case of processing a vertical stripe image (an image referred to as a so-called killer pattern or the like) in which gradation rises and falls as an image, inversion-inhibited data strings may possibly be successive, and the running disparity RD may possibly be increased.

As described above, according to the encoding or the decoding to which the present technology is applied, it is possible to control (suppress) the running disparity RD and the run length RL. However, in a case of performing the encoding or decoding that handle even the expanded control code, the running disparity RD may be possibly be increased. Therefore, description is continued of the encoding or decoding that makes it possible to control (suppress) the running disparity RD and the run length RL and to improve the error tolerance by handling even the expanded control code.

Figure 58:
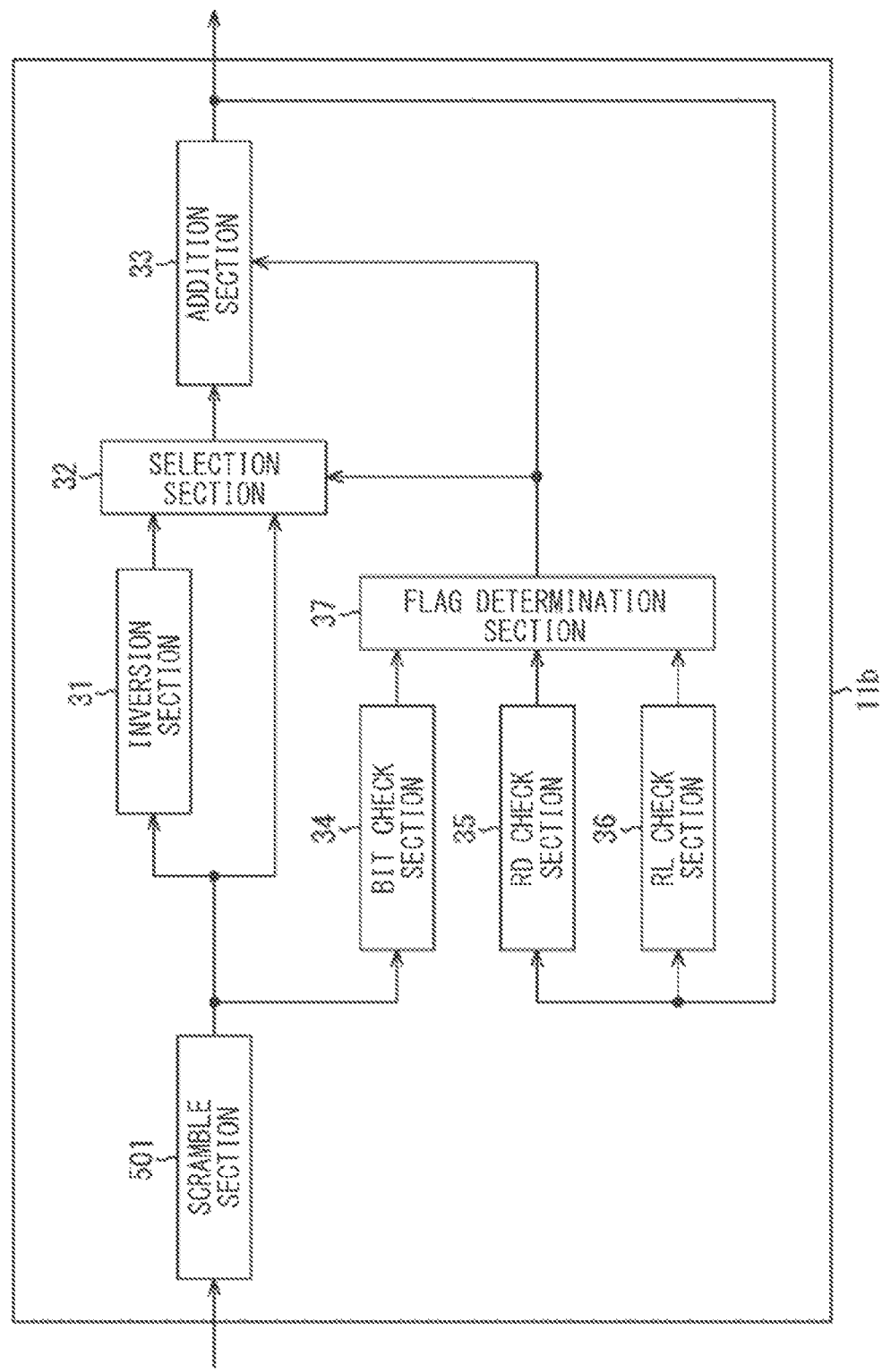
FIG. 58 illustrates another configuration example of the encoder.

FIG. 58 illustrates another configuration example of the encoder 11. An encoder 11b illustrated in FIG. 58 differs from the encoder 11 illustrated in FIG. 3 in that the encoder 11b has a configuration of a scramble section 501 being added, but they are the same in other respects. Descriptions are omitted for the same components as those of the encoder 11 illustrated in FIG. 3.

The scramble section 501 scrambles information transfer data inputted to the encoder 11b. Similarly to the encoder 11 illustrated in FIG. 3, the encoder 11b performs encoding based on inversion encoding. Before performing the inversion encoding, data is scrambled. However, the control code is not to be subjected to the scramble, and is processed without scramble.

The encoder 11b may be configured to be supplied with the data and the DC flag from the pre-encoder 301 (FIG. 43), or may be configured without the pre-encoder 301. The encoder 11b is applicable to cases of performing the encoding that handles even the expanded control code and of performing the inversion encoding that is able to control the running disparity RD and the run length RL. In addition, the encoder 11b is also applicable to a case of performing encoding not handling the expanded control code; even in such a case, the encoder 11*b* is applicable to an occasion of performing encoding that is able to control the running disparity RD and the run length RL.

The scramble is performed by randomizing patterns of zero and one by frequent shifting not to allow zero and one to be successive with high probability. In addition, this scramble enables a return back to the original data string on the receiving side. The scramble section 501 performs scramble by a generator polynomial, for example. As the scramble by the generator polynomial, scramble using a pseudo random bit sequence (PRBS: pseude-random bit sequence) is applicable.

An example of the generator polynomial is represented by the following expression (7).

$$\text{Payload Scramble} = X^{15} + X^{14} + 1 \qquad (7)$$

The scramble section 501 also scrambles the inversion-inhibited data to suppress succession of zero or one. Therefore, even in a case where a situation occurs in which pieces of inversion-inhibited data are successive, it is possible to suppress an increase in the running disparity RD.

In addition, processing of the inversion encoding is performed on the information transfer data scrambled by the scramble section 501, thus making it possible to further perform encoding in which the running disparity RD and the run length RL are controlled.

Figure 59:
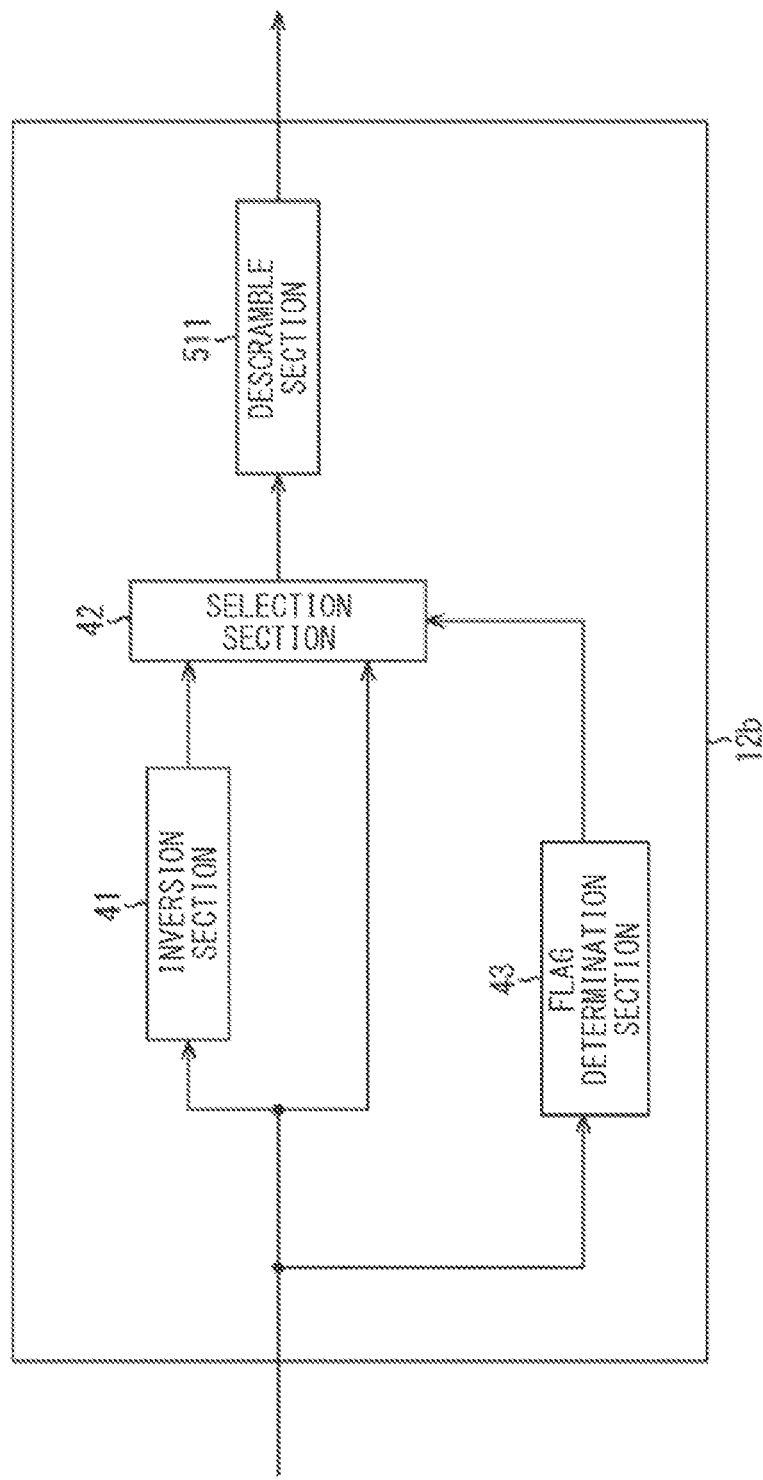
FIG. 59 illustrates another configuration example of the decoder.

FIG. 59 illustrates a configuration example of a decoder 12*b* corresponding to the encoder 11*b* illustrated in FIG. 58. The decoder 12*b* illustrated in FIG. 59 differs from the decoder 12 illustrated in FIG. 4 in that the decoder 12*b* has a configuration of a descramble section 511 being added, and they are the same in other respects. Descriptions are omitted for the same components as those of the decoder 12 illustrated in FIG. 4.

The descramble section 511 is supplied with a decoded scrambled data string inside the decoder 12*b* to execute descramble processing. The scramble is performed on the encoding side in processing before the inversion encoding is performed. On the decoding side, processing of inversion decoding is executed on data having been subjected to the inversion encoding to acquire a data string before the inversion encoding is performed, and then processing of descramble is executed.

<Processing of Encoder and Decoder>

Figure 60:
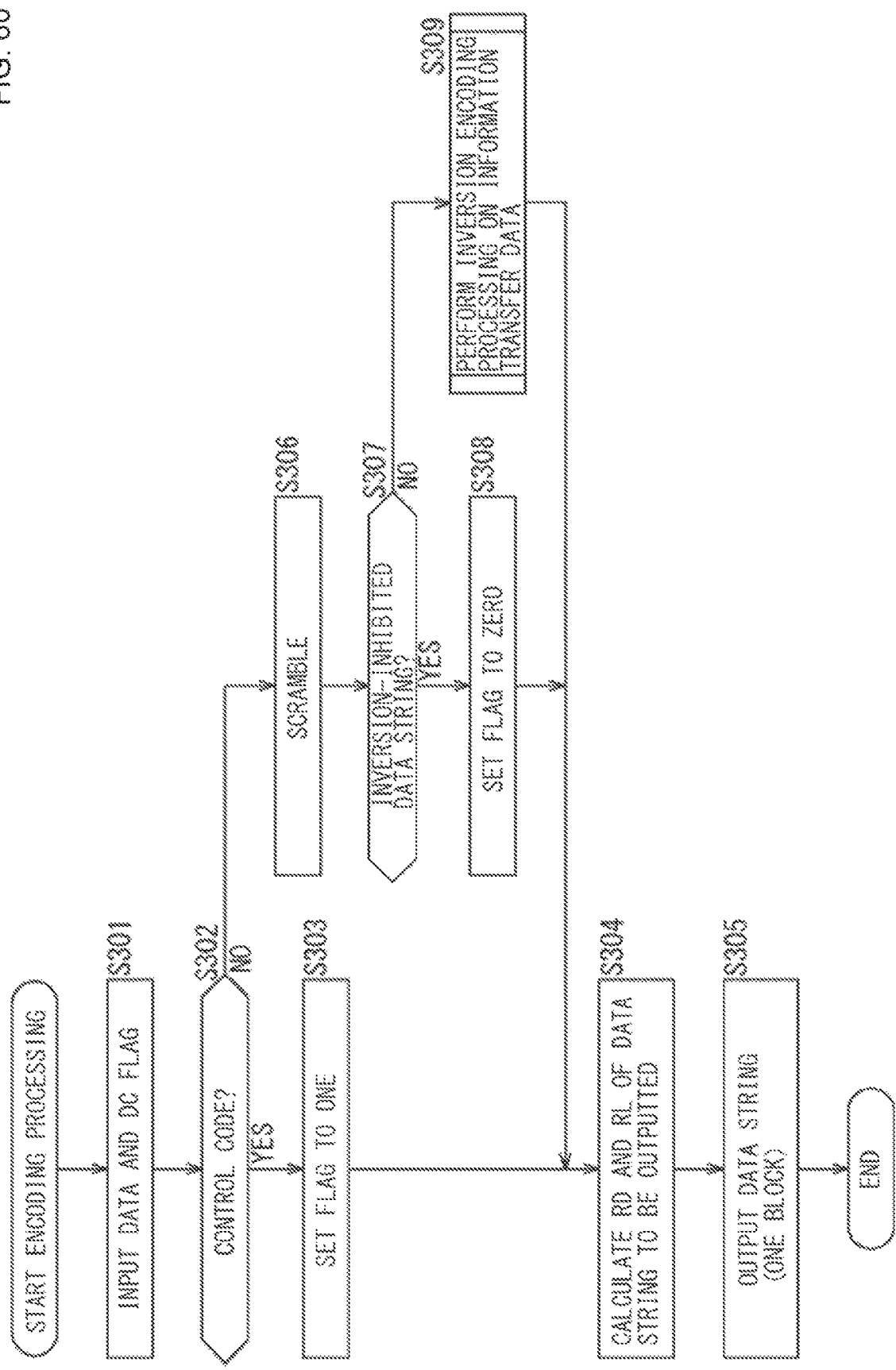
FIG. 60 is a flowchart that describes another processing of the encoder.

Description is given of processing of the encoder 11*b* illustrated in FIG. 58 with reference to a flowchart of FIG. 60.

The processing of the flowchart illustrated in FIG. 60 differs from the processing of the flowchart illustrated in FIG. 51 in that processing of the scramble section 501 to perform scramble is added, and they are similar in other pieces of processing; thus, description is omitted for the similar processing.

Steps S301 to S305 are pieces of processing similar to those of steps S201 to S205 (FIG. 51); when a control code is inputted, a data string in which the flag is set to one is outputted without performing the inversion encoding processing. In addition, the processing of scramble in the scramble section 501 is not executed, either, for the control code.

Meanwhile, in a case where determination is made, in step S302, that the data string to be processed is not the control code, i.e., in a case where determination is made that the data string to be processed is the information transfer data, the processing proceeds to step S306. In step S306, the scramble section 501 scrambles the information transfer data to be processed.

Pieces of processing of steps S307 to S309 are executed on the scrambled information transfer data. The pieces of processing of steps S307 to S309 are similar to those of steps S206 to S208 (FIG. 51), and are related to the inversion encoding.

In this manner, the information transfer data is scrambled, and then encoded by executing processing of the inversion encoding.

Next, description is given of processing of the decoder 12*b* illustrated in FIG. 59 with reference to a flowchart of FIG. 61.

The processing of the flowchart illustrated in FIG. 61 differs from the processing of the flowchart illustrated in FIG. 52 in that processing of the descramble section 511 to perform descramble is added, and they are similar in other pieces of processing; thus, description is omitted for the similar processing.

Steps S331 to S339 are pieces of processing similar to steps S231 to S239 (FIG. 52), and processing of the inversion decoding is executed on information transfer data. In a case of the control code, the inversion encoding and the scramble are not executed; thus, in a case of being determined to be the control code, the data string is processed as the control code.

Meanwhile, the processing of the inversion decoding is executed on data which is not the control code, i.e., the information transfer data to thereby acquire information transfer data in a scrambled state.

In step S340, the descramble section 511 executes descramble processing on the scrambled the information transfer data to thereby generate a descrambled data string.

In this manner, the inversion decoding is performed on the information transfer data having been subjected to the inversion encoding, and the descramble processing is executed on the scrambled information transfer data to thereby perform decoding.

Performing the encoding or the decoding in this manner makes it possible to control (suppress) the running disparity RD or the run length RL more.

It is to be noted that, in a case where the scramble is performed, a control code to reset the scramble may be newly defined to be transmitted and received between the encoder 11 and the decoder 12. In addition, the control code to reset the scramble may set a resetting timing at the arbitrary number of lines (LINE).

According to the encoding and the decoding to which the present technology is applied, it is possible to control (suppress) the running disparity RD and the run length RL without deteriorating transmission efficiency using a simple circuit configuration. In addition, enabling the detection of an errors in a flag makes it possible, for the receiving side, to perform processing with improved reliability of the received data.

In addition, it is possible to limit the running disparity RD and the run length RL for a data string having a particular data string such as the control code. Therefore, even in a case where control codes are successive, it is possible to suppress deterioration in the running disparity RD or the run length RL. In addition, suppressing the deterioration in the running disparity RD or the run length RL of the control code makes it possible to improve accuracy in the processing using the control code such as a clock on the receiving side.

<Configuration Example of Computer>

The series of processing described above may be executed by hardware or may be executed by software. In a case of executing the series of processing by software, a program included in the software is installed in a computer incorporated into dedicated hardware or in a general-purpose personal computer, from a program recording medium.

FIG. 62 is a block diagram illustrating a configuration example of hardware of a computer that executes, by a program, the series of processing described above.

A CPU (Central Processing Unit) 1001, a ROM (Read Only Memory) 1002, and a RAM (Random Access Memory) 1003 are coupled one another by a bus 1004.

An input/output interface 1005 is further coupled to the bus 1004. An input unit 1006 including a keyboard, a mouse, and the like, and an output unit 1007 including a display, a speaker, and the like are coupled to the input/output interface 1005. In addition, a storage unit 1008 including a hard disk and a non-volatile memory, a communication unit 1009 including a network interface, and a drive 1010 that drives a removable medium 1011 are coupled to the input/output interface 1005.

In the computer configured as described above, for example, the CPU 1001 loads a program stored in the storage unit 1008 into the RAM 1003 via the input/output interface 1005 and the bus 1004 and executes the program to thereby perform the series of processing described above.

For example, the program to be executed by the CPU 1001 is recorded in the removable medium 1011, or provided via a wired or wireless transmission medium such as a local area network, the Internet, or digital broadcasting, and installed in the storage unit 1008.

It is to be noted that the program to be executed by the computer may be a program in which processing is performed in time series in the order described in the present specification, or may be a program in which pieces of processing are performed in parallel or at a necessary timing such as the time when a call is made.

The effects described herein are merely illustrative and are not limitative, and may have other effects.

The embodiment of the present technology is not limited to the above-described embodiment, and may be modified in a wide variety of ways without departing from the gist of the present technology.

For example, the present technology may have a configuration of cloud computing in which one function is shared and processed jointly by a plurality of apparatuses via a network.

In addition, each step described in the above-described flowcharts may be shared and executed by a plurality of devices, in addition to being performed by one apparatus.

Further, in a case where a plurality of pieces of processing are included in one step, the plurality of pieces of processing included in the one step may be shared and executed by a plurality of devices, in addition to being executed by one apparatus.

<Practical Application to Endoscopic Surgery System>

The technology according to an embodiment of the present disclosure (present technology) is applicable to various products. For example, the technology according to an embodiment of the present disclosure may be applied to an endoscopic surgery system.

FIG. 63 is a view depicting an example of a schematic configuration of an endoscopic surgery system to which the technology according to an embodiment of the present disclosure (present technology) can be applied.

In FIG. 63, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a camera control unit (CCU: Camera Control Unit) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 64 is a block diagram depicting an example of a functional configuration of the camera head 11102 and the CCU 11201 depicted in FIG. 63.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of the image pickup elements included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of multi-plate type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the present specification, the system refers to an entire apparatus including a plurality of devices.

It is to be noted that the effects described herein are merely illustrative and are not limitative, and may have other effects.

It is to be noted that the embodiment of the present technology is not limited to the above-described embodiment, and may be modified in a wide variety of ways without departing from the gist of the present technology.

REFERENCE NUMERALS LIST 11 encoder
12 decoder
31 inversion section
32 selection section
33 addition section
34 bit check section
35 RD check section
36 RL check section
37 flag determination section
41 inversion section
42 selection section
43 flag determination section
61 error detection section
71 state control part
72 header generation part
73 data insertion part
74 footer generation part
81 block
82 parity bit
100 transmission system
111 image sensor
121 imaging unit
122 transmission unit
131 reception unit
132 image processing unit
151 system control section
152 frame data input section
153 register
161 TX protocol management section
162 Byte conversion section
163 payload ECC insertion section
164 packet generation section
165 lane distribution section
171 state control part
172 header generation part
173 data insertion part
174 footer generation part
181 TX state control section
182 clock generation section
183 signal processing section
191 control code insertion part
192 8B10B symbol encoder
193 synchronization part
194 transmission part
201 RX state control section
202 signal processing section
211 reception part
212 clock generation part
213 synchronization part
214 symbol synchronization part
215 10B8B symbol decoder
216 skew correction part
217 control code removal part
221 RX protocol management section
222 lane integration section
223 packet separation section
224 payload error correction section
225 Pixel conversion section
231 state control part
232 header error correction part
233 data removal part
234 footer error detection part
241 frame data output section
242 register
243 system control section
244 symbol synchronization part
301 pre-encoder
401 data inversion section
402 distance determination section
451 distance determination section
501 scramble section
511 descramble section

The invention claimed is:

1. An encoding device comprising:
a memory storing program code; and
a processor configured to execute the program code to perform operations comprising:
dividing input data into data strings of N bits or M bits, the data strings including a first data string;
calculating a first a running disparity for the data strings;
determining whether the first data string is a control code or transfer data;
setting a flag for the first data string to a first value or a second value depending upon the running disparity when it is determined that the first data string is transfer data;
setting the flag to the second value when it is determined that the first data string is the control code;
inverting the first data string when it is determined that the first data string is transfer data and the flag is set to the second value; and
outputting the first data string.

2. The encoding device according to claim 1, wherein N and M are different odd numbers.

3. The encoding device according to claim 1, wherein the control code is a converted control code based upon an original control code of a predetermined number of bits.

4. The encoding device according to claim 3, wherein the predetermined number of bits is greater than N and less than M.

5. The encoding device according to claim 3, wherein the predetermined number of bits is 32, is 31, and is 33.

6. The encoding device according to claim 3, wherein the operations further comprise:
generating the converted control code by referring to a table in which the control code and converted control code are associated with each other.

7. The encoding device according to claim 3, wherein the first data string is a first half portion of the control code and a second data string is a second half portion of the control code.

8. The encoding device according to claim 7, wherein a two-bit data is inserted between the first data string and the second data string, the first data string is not inverted, and the second data string is inverted.

9. The encoding device according to claim 7, wherein data of a bit prior to the first data string of the first half portion is zero.

10. The encoding device according to claim 7, wherein the first data string is divided into N bits and the second data string is divided into M bits,
a last bit of the first data string is set, as a head bit of a control code of the second data string and inserted prior to the second string, and
an inverted value of a value of the head bit is set as a last bit of the control code of the second data string.

11. The encoding device according to claim 1, wherein the first data string is divided into N bits and the second data string is divided into M bits, and
wherein, when the first data string and the second data string are each set as one block and two blocks are set as one processing unit, the flag of a last block of a plurality of processing units is set to a result of calculation of exclusive OR of the flag added to a block other than the last block of the plurality of processing units.

12. The encoding device according to claim 11, wherein the last block is processed as a data string not to be inverted.

13. The encoding device according to claim 1, wherein, when the first data string of the N bits and a second data string of the M bits are each set as one block and two blocks are set as one processing unit, a result of Hamming encoding processing on the flag included in a plurality of processing units is added to a rear of a last block of the plurality of processing units.

14. An encoding method comprising:
dividing input data into data strings of N bits or M bits, the data strings including a first data string;
calculating a running disparity for the data strings;
determining whether the first data string is a control code or transfer data;
setting a flag for the first data string to a first value or a second value depending upon the running disparity when it is determined that the first data string is transfer data;
setting the flag to the second value when it is determined that the first data string is the control code;
inverting the first data string when it is determined that the first data string is transfer data and the flag is set to the second value; and
outputting the first data string.

15. A non-transitory computer readable medium storing program code, the program code being executable by a processor to perform operations comprising:
dividing input data into data strings of N bits or M bits, the data strings including a first data string;
calculating a running disparity for the data strings;
determining whether the first data string is a control code or transfer data;
setting a no for the first data string to a first value or a second value depending upon the running disparity when it is determined that the first data string is transfer data;
setting the flag to the second value when it is determined that the first data string is the control code;
inverting the first data string when it is determined that the first data string is transfer data and the flag is set to the second value; and
outputting the first data string.

16. The non-transitory computer readable medium according to claim 15, wherein N and M are different odd numbers.

17. The non-transitory computer readable medium according to claim 15, wherein the control code is a converted control code based upon an original control code of a predetermined number of bits.

18. The non-transitory computer readable medium according to claim 17, wherein the predetermined number of bits is greater than N and less than M.

19. The non-transitory computer readable medium according to claim 18, wherein the predetermined number of bits is 32, N is 31, and M is 33.

20. The non-transitory computer readable medium according to claim 17, wherein the operations further comprise:
generating the converted control code by referring to a table in which the control code and converted control code are associated with each other.

* * * * *